United States Patent
Akiyama

(10) Patent No.: US 12,408,458 B2
(45) Date of Patent: Sep. 2, 2025

(54) PHOTOELECTRIC CONVERSION ELEMENT AND LIGHT RECEIVING DEVICE

(71) Applicant: SONY SEMICONDUCTOR SOLUTIONS CORPORATION, Kanagawa (JP)

(72) Inventor: Hisashi Akiyama, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 1157 days.

(21) Appl. No.: 17/250,329

(22) PCT Filed: Jun. 14, 2019

(86) PCT No.: PCT/JP2019/023612
§ 371 (c)(1),
(2) Date: Jan. 5, 2021

(87) PCT Pub. No.: WO2020/017203
PCT Pub. Date: Jan. 23, 2020

(65) Prior Publication Data
US 2021/0351217 A1    Nov. 11, 2021

(30) Foreign Application Priority Data
Jul. 17, 2018 (JP) .................. 2018-133913

(51) Int. Cl.
*H10F 39/00* (2025.01)
*G02B 5/30* (2006.01)
*H10F 39/18* (2025.01)

(52) U.S. Cl.
CPC ....... *H10F 39/8063* (2025.01); *G02B 5/3058* (2013.01); *H10F 39/8053* (2025.01)

(58) Field of Classification Search
CPC .......... H01L 27/14689; H01L 27/146–14893; H01L 31/0232; G02B 3/00; G02B 3/0068;
(Continued)

(56) References Cited

U.S. PATENT DOCUMENTS

2009/0059404 A1* 3/2009 Wang ............... H10K 30/57
                                                    359/850
2015/0141753 A1* 5/2015 Kanamori ......... G02B 23/2461
                                                    600/109
(Continued)

FOREIGN PATENT DOCUMENTS

JP    2004-258297 A    9/2004
JP    2008-177191 A    7/2008
(Continued)

OTHER PUBLICATIONS

Gentzsch, Erik, "Polarization Handedness Convention", ThorLabs, 2017.*

(Continued)

*Primary Examiner* — David Vu
(74) *Attorney, Agent, or Firm* — CHIP LAW GROUP

(57) ABSTRACT

Provided is an light receiving device that includes plural photoelectric conversion element units each including plural photoelectric conversion elements. Each of the photoelectric conversion elements constituting the respective photoelectric conversion element units includes a quarter wavelength layer, a wire grid polarizer, and a photoelectric conversion section disposed in this order from a light entrance side.

15 Claims, 43 Drawing Sheets

(58) Field of Classification Search
CPC ...... G02B 6/00; G02B 5/3058; G02B 5/3083; H04N 25/70; H10F 39/8063; H10F 39/8053; H10F 39/182; H10F 39/199; H10F 39/806; H10F 77/40
See application file for complete search history.

(56) References Cited

U.S. PATENT DOCUMENTS

| | | |
|---|---|---|
| 2015/0253192 A1 | 9/2015 | Sano |
| 2017/0099449 A1* | 4/2017 | Kang ................. H04N 23/67 |
| 2020/0228723 A1* | 7/2020 | Aoki ................. H04N 23/673 |

FOREIGN PATENT DOCUMENTS

| | | | |
|---|---|---|---|
| JP | 2009162847 A | * | 7/2009 |
| JP | 2015-169599 A | | 9/2015 |
| WO | 2013/031100 A1 | | 3/2013 |

OTHER PUBLICATIONS

"Circular Polarization", Harvard Natural Sciences Lecture Demonstrations, 2015.*

International Search Report and Written Opinion of PCT Application No. PCT/JP2019/023612, issued on Sep. 27, 2019, 10 pages of ISRWO.

* cited by examiner

FIG.22

| $10B_1$ | $10B_2$ | $10B_1'$ | $10B_2'$ |
|---|---|---|---|
| $10B_4$ | $10B_3$ | $10B_4'$ | $10B_3'$ |
| $10B_1$ | $10B_2$ | $10B_1'$ | $10B_2'$ |
| $10B_4$ | $10B_3$ | $10B_4'$ | $10B_3'$ |
| $10B_1$ | $10B_2$ | $10B_1'$ | $10B_2'$ |
| $10B_4$ | $10B_3$ | $10B_4'$ | $10B_3'$ |

FIG.23

| $71_1$ | $71_2$ | $71_1$ | $71_2$ |
| --- | --- | --- | --- |
| $71_4$ | $71_3$ | $71_4$ | $71_3$ |
| $71_1$ | $71_2$ | $71_1$ | $71_2$ |
| $71_4$ | $71_3$ | $71_4$ | $71_3$ |
| $71_1$ | $71_2$ | $71_1$ | $71_2$ |
| $71_4$ | $71_3$ | $71_4$ | $71_3$ |

| $10C_{A-1}$ | $10C_{B-1}$ | $10C_{A-2}$ | $10C_{B-2}$ |
|---|---|---|---|
| $10C_{A-4}$ | $10C_{B-4}$ | $10C_{A-3}$ | $10C_{B-3}$ |
| $10C_{A-1}$ | $10C_{B-1}$ | $10C_{A-2}$ | $10C_{B-2}$ |
| $10C_{A-4}$ | $10C_{B-4}$ | $10C_{A-3}$ | $10C_{B-3}$ |
| $10C_{A-1}$ | $10C_{B-1}$ | $10C_{A-2}$ | $10C_{B-2}$ |
| $10C_{A-4}$ | $10C_{B-4}$ | $10C_{A-3}$ | $10C_{B-3}$ |

| $10C_{A-1}$ | $10C_{B-1}$ | $10D_1$ | $10D_2$ | $10C_{A-2}$ | $10C_{B-2}$ |
|---|---|---|---|---|---|
| $10C_{A-4}$ | $10C_{B-4}$ | $10D_4$ | $10D_3$ | $10C_{A-3}$ | $10C_{B-3}$ |
| $10C_{A-1}$ | $10C_{B-1}$ | $10D_1$ | $10D_2$ | $10C_{A-2}$ | $10C_{B-2}$ |
| $10C_{A-4}$ | $10C_{B-4}$ | $10D_4$ | $10D_3$ | $10C_{A-3}$ | $10C_{B-3}$ |
| $10C_{A-1}$ | $10C_{B-1}$ | $10D_1$ | $10D_2$ | $10C_{A-2}$ | $10C_{B-2}$ |
| $10C_{A-4}$ | $10C_{B-4}$ | $10D_4$ | $10D_3$ | $10C_{A-3}$ | $10C_{B-3}$ |

FIG.38

PHOTOELECTRIC CONVERSION ELEMENT AND LIGHT RECEIVING DEVICE

CROSS REFERENCE TO RELATED APPLICATIONS

This application is a U.S. National Phase of International Patent Application No. PCT/JP2019/023612 filed on Jun. 14, 2019, which claims priority benefit of Japanese Patent Application No. JP 2018-133913 filed in the Japan Patent Office on Jul. 17, 2018. Each of the above-referenced applications is hereby incorporated herein by reference in its entirety.

TECHNICAL FIELD

The present disclosure relates to a photoelectric conversion element and a light receiving device, and more particularly to a photoelectric conversion element and a light receiving device that include a wire grid polarizer.

BACKGROUND ART

An imaging element including a wire grid polarizer (WGP) is known as disclosed in PCT Patent Publication No. WO 2013/031100A1, for example. This imaging element includes an optical low pass filter and plural polarizers located on the light entrance side of the optical low pass filter. In addition, the optical low pass filter includes a first $\lambda/4$ plate, a first birefringence low pass filter layer, a second $\lambda/4$ plate, and a second birefringence low pass filter layer.

CITATION LIST

Patent Literature

[PTL 1]
  PCT Patent Publication No. WO2013/031100A1

SUMMARY

Technical Problem

Meanwhile, for example, a small-sized sensor for determining a left-handed circularly polarized state or a right-handed circularly polarized state as a polarized state has strongly been demanded in various fields such as a physical science field, an engineering field, an optical field, and a medical science field. However, the technology disclosed in the International Publication identified above is insufficient to meet such demand.

Accordingly, an object of the present disclosure is to provide a photoelectric conversion element capable of examining a polarized state and a light receiving device including this photoelectric conversion element.

Solution to Problem

For achieving the above object, a light receiving device of the present disclosure includes plural photoelectric conversion element units each including plural photoelectric conversion elements. Each of the photoelectric conversion elements constituting the respective photoelectric conversion element units includes a quarter wavelength layer, a wire grid polarizer, and a photoelectric conversion section disposed in this order from the light entrance side.

For achieving the above object, the photoelectric conversion element of the present disclosure includes a quarter wavelength layer, a wire grid polarizer, and a photoelectric conversion section disposed in this order from the light entrance side.

BRIEF DESCRIPTION OF DRAWINGS

FIG. 22 is a conceptual plan diagram of photoelectric conversion element units constituting a modification of the light receiving device of Embodiment 2.

FIG. 23 is a conceptual plan diagram of filter layers constituting photoelectric conversion elements of the modification of the light receiving device of Embodiment 2.

FIG. 26 is a conceptual plan diagram of photoelectric conversion sections constituting the photoelectric conversion elements and the photoelectric conversion elements of the modification of the light receiving device of Embodiment 2.

FIG. 29 is a conceptual plan diagram of photoelectric conversion element units constituting a light receiving device of Embodiment 4.

FIG. 33 is a conceptual plan diagram of photoelectric conversion sections constituting the photoelectric conversion elements and the photoelectric conversion elements of the light receiving device of Embodiment 4.

FIG. 34 is a conceptual plan diagram of photoelectric conversion element units constituting a light receiving device of Embodiment 5.

FIG. 38 is a conceptual plan diagram of photoelectric conversion sections constituting the photoelectric conversion elements and the photoelectric conversion elements of the light receiving device of Embodiment 5.

DESCRIPTION OF EMBODIMENTS

Figure 1:
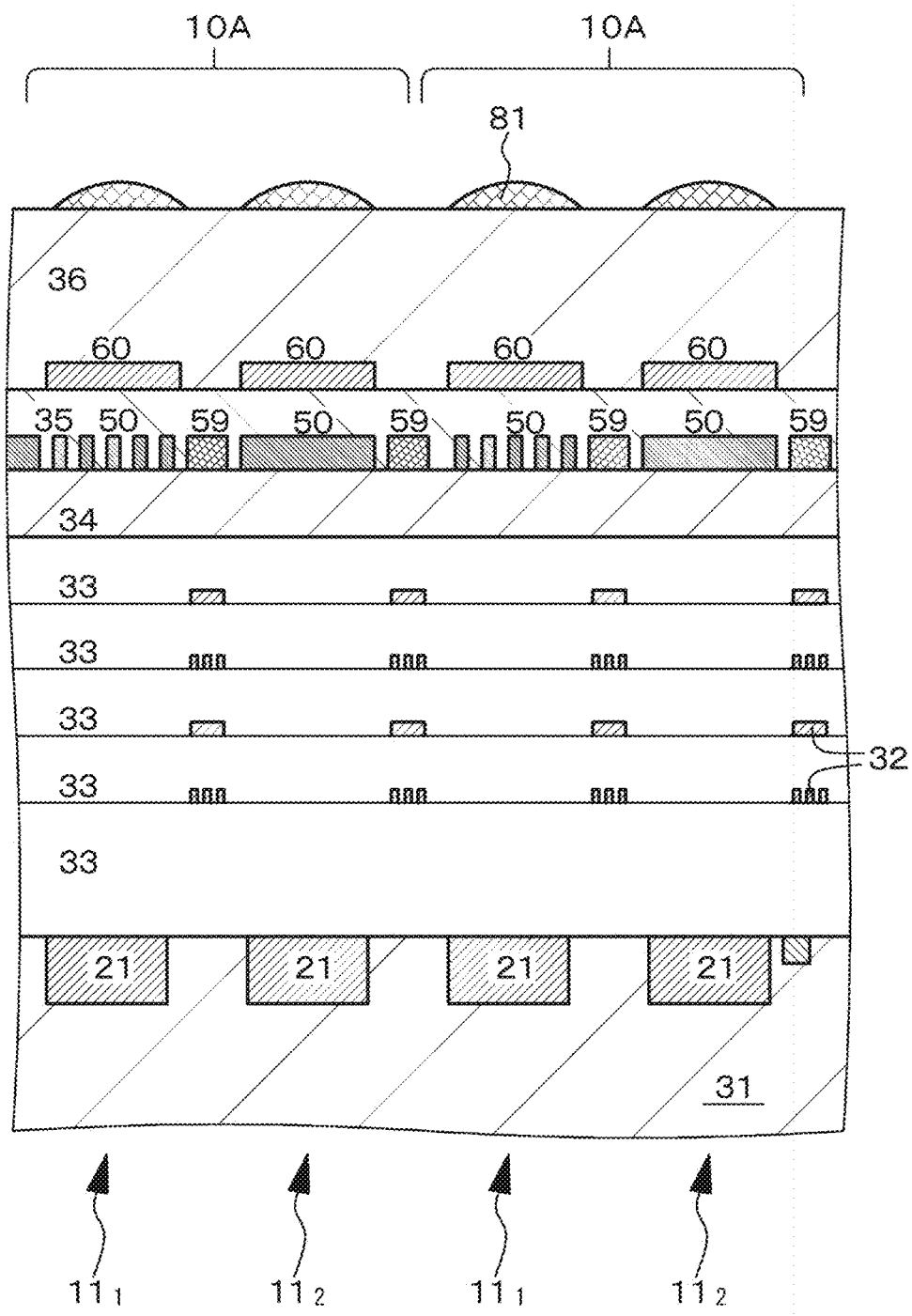
FIG. 1 is a schematic partial cross-sectional diagram of a light receiving device of Embodiment 1 taken along arrows A-A of FIG. 2A.

The present disclosure will hereinafter be described on the basis of embodiments with reference to the drawings. However, the present disclosure is not limited to the embodiments, and respective numerical values and materials included in the embodiments are presented by way of example. Note that the description will be given in the following order.

1. Description regarding photoelectric conversion element and light receiving device of present disclosure in general
2. Embodiment 1 (photoelectric conversion element and light receiving device of present disclosure, light receiving device having Configuration 1 of present disclosure)
3. Embodiment 2 (modification of Embodiment 1, light receiving device having Configuration 2 of present disclosure)
4. Embodiment 3 (modification of Embodiment 2)
5. Embodiment 4 (modification of Embodiment 2 and Embodiment 3, light receiving device having Configuration 3 of present disclosure)
6. Embodiment 5 (modification of Embodiment 4)
7. Others <Description Regarding Photoelectric Conversion Element and Light Receiving Device of Present Disclosure in General>

In a form of a photoelectric conversion element constituting a light receiving device of the present disclosure or a photoelectric conversion element of the present disclosure, an on-chip microlens may be disposed on the light entrance side of a quarter wavelength layer in each of the photoelectric conversion elements.

The light receiving device of the present disclosure including the preferred form described above may have the following configuration.

A photoelectric conversion element unit includes two photoelectric conversion elements.

A polarization direction designated for transmission by a wire grid polarizer constituting a first photoelectric conversion element is α degrees.

A polarization direction designated for transmission by a wire grid polarizer constituting a second photoelectric conversion element is (α+45) degrees. The light receiving device of the present disclosure in this form will be referred to as a "light receiving device having Configuration 1 of the present disclosure." In addition, for example, this light receiving device having Configuration 1 of the present disclosure is applicable to a light receiving device not provided for purposes of color separation and spectral diffraction (e.g., sensor). A photoelectric conversion element which itself has sensitivity to a specific wavelength does not require a filter layer.

The photoelectric conversion element unit may include a conventional photoelectric conversion element which does not have a quarter wavelength layer and a wire grid polarizer. This is also applicable to respective forms and configurations of the light receiving device of the present disclosure described below.

Alternatively, the light receiving device of the present disclosure including the preferred form described above may have the following configuration.

The photoelectric conversion element unit includes 2×2 arranged four photoelectric conversion elements.

A polarization direction designated for transmission by a wire grid polarizer constituting a first photoelectric conversion element is $\alpha$ degrees.

A polarization direction designated for transmission by a wire grid polarizer constituting a second photoelectric conversion element is $(\alpha+45)$ degrees.

A polarization direction designated for transmission by a wire grid polarizer constituting a third photoelectric conversion element is $(\alpha+90)$ degrees.

A polarization direction designated for transmission by a wire grid polarizer constituting a fourth photoelectric conversion element is $(\alpha+135)$ degrees. The light receiving device of the present disclosure in this form will be referred to as a "light receiving device having Configuration 2 of the present disclosure."

The light receiving device having Configuration 2 of the present disclosure may have the following configuration. The light receiving device includes plural photoelectric conversion element groups arranged two-dimensionally.

One of the photoelectric conversion element groups includes 2×2 arranged four photoelectric conversion element units.

A first photoelectric conversion element unit includes a first filter layer that transmits light in a first wavelength range.

A second photoelectric conversion element unit includes a second filter layer that transmits light in a second wavelength range.

A third photoelectric conversion element unit includes a third filter layer that transmits light in a third wavelength range.

A fourth photoelectric conversion element unit includes a fourth filter layer that transmits light in a fourth wavelength range. The light receiving device of the present disclosure in this form will be referred to as a "light receiving device having Configuration 2-A of the present disclosure."

Specifically, for example, one of the photoelectric conversion element groups includes four photoelectric conversion element units disposed in Bayer arrangement. The light in the first wavelength range may be red light, the light in each of the second wavelength range and the third wavelength range may be green light, and the light in the fourth wavelength range may be blue light. Alternatively, the light in the first wavelength range may be red light, the light in the second wavelength range may be green light, the light in the third wavelength range may be blue light, and the light in the fourth wavelength range may be infrared light. In this case, the fourth photoelectric conversion element unit may include a fourth filter layer which does not transmit light in the first wavelength range, the second wavelength range, and the third wavelength range. This configuration is also applicable to the description presented below.

Moreover, the light receiving device having Configuration 2-A of the present disclosure may have the following configuration.

A first quarter wavelength layer constituting the first photoelectric conversion element unit gives a phase difference to the light in the first wavelength range.

A second quarter wavelength layer constituting the second photoelectric conversion element unit gives a phase difference to the light in the second wavelength range.

A third quarter wavelength layer constituting the third photoelectric conversion element unit gives a phase difference to the light in the third wavelength range.

A fourth quarter wavelength layer constituting the fourth photoelectric conversion element unit gives a phase difference to the light in the fourth wavelength range.

In addition, according to this configuration, the first quarter wavelength layer, the second quarter wavelength layer, the third quarter wavelength layer, and the fourth quarter wavelength layer may be disposed in different layers. Note that the light receiving device of the present disclosure in this form will be referred to as a "light receiving device having Configuration 2-A-1 of the present disclosure." Moreover, the light receiving device having Configuration 2-A-1 of the present disclosure may have the following configuration.

Each of the quarter wavelength layer includes first dielectric layers made of a material having a refractive index $n_1$ and second dielectric layers made of a material having a refractive index $n_2$ (provided that $n_1 > n_2$), the first and second dielectric layers being alternately disposed side by side.

Thicknesses of the first dielectric layer and the second dielectric layer ($t_{11}$, $t_{12}$) constituting the first quarter wavelength layer, thicknesses of the first dielectric layer and the second dielectric layer ($t_{21}$, $t_{22}$) constituting the second quarter wavelength layer, thicknesses of the first dielectric layer and the second dielectric layer ($t_{31}$, $t_{32}$) constituting the third quarter wavelength layer, and thicknesses of the first dielectric layer and the second dielectric layer ($t_{41}$, $t_{42}$) constituting the fourth quarter wavelength layer are set such that the thicknesses of the respective first dielectric layers are equalized and that the thicknesses of the respective second dielectric layers are equalized. In other words, $t_{11} = t_{21} = t_{31} = t_{41}$ and $t_{12} = t_{22} = t_{32} = t_{42}$ are set.

The first quarter wavelength layer, the second quarter wavelength layer, the third quarter wavelength layer, and the fourth quarter wavelength layer may have different layer thicknesses.

Alternatively, according to this configuration, the first quarter wavelength layer, the second quarter wavelength layer, the third quarter wavelength layer, and the fourth quarter wavelength layer may be disposed in an identical layer. Note that the light receiving device of the present disclosure in this form will be referred to as a "light receiving device having Configuration 2-A-2 of the present disclosure." Moreover, the light receiving device having Configuration 2-A-2 of the present disclosure may have the following configuration.

Each of the quarter wavelength layer includes first dielectric layers made of a material having a refractive index $n_1$ and second dielectric layers made of a material having a refractive index $n_2$ (provided that $n_1 > n_2$), the first and second dielectric layers being alternately disposed side by side.

Thicknesses of the first dielectric layer and the second dielectric layer ($t_{11}$, $t_{12}$) constituting the first quarter wavelength layer, thicknesses of the first dielectric layer and the second dielectric layer ($t_{21}$, $t_{22}$) constituting the second quarter wavelength layer, thicknesses of the first dielectric layer and the second dielectric layer ($t_{31}$, $t_{32}$) constituting the third quarter wavelength layer, and thicknesses of the first dielectric layer and the second dielectric layer ($t_{41}$, $t_{42}$) constituting the fourth quarter wavelength layer are set such that the thicknesses of the respective first dielectric layers are different and that the thicknesses of the respective second dielectric layers are different. In other words, values of $t_{11}$, $t_{21}$, $t_{31}$, and $t_{41}$ are not equalized, nor are values of $t_{12}$, $t_{22}$, $t_{32}$, and $t_{42}$ equalized.

The first quarter wavelength layer, the second quarter wavelength layer, the third quarter wavelength layer, and the fourth quarter wavelength layer may have the same layer thickness.

The light receiving device of the present disclosure including a form where an on-chip microlens is disposed on the light entrance side of the quarter wavelength layer may have the following configuration.

The photoelectric conversion element units include a photoelectric conversion element unit A and a photoelectric conversion element unit B.

A quarter wavelength layer and a wire grid polarizer are disposed in this order on the light entrance side of each of photoelectric conversion elements constituting the photoelectric conversion element unit A.

A wire grid polarizer is disposed on the light entrance side of each of photoelectric conversion elements constituting the photoelectric conversion element unit B, while the quarter wavelength layer is not disposed. Note that the light receiving device of the present disclosure in this form will be referred to as a "light receiving device having Configuration 3 of the present disclosure." Moreover, in this case, the photoelectric conversion element unit A and the photoelectric conversion element unit B are disposed adjacent to each other.

The light receiving device having Configuration 3 of the present disclosure including the preferred configuration described above may have the following configuration.

The photoelectric conversion element unit A includes 2×2 arranged four photoelectric conversion elements.

The photoelectric conversion element unit B includes 2×2 arranged four photoelectric conversion elements.

A polarization direction designated for transmission by each of wire grid polarizers constituting first photoelectric conversion elements included in the photoelectric conversion element units A and the photoelectric conversion element units B is α degrees.

A polarization direction designated for transmission by each of wire grid polarizers constituting second photoelectric conversion elements included in the photoelectric conversion element units A and the photoelectric conversion element units B is (α+45) degrees.

A polarization direction designated for transmission by each of wire grid polarizers constituting third photoelectric conversion elements included in the photoelectric conversion element units A and the photoelectric conversion element units B is (α+90) degrees.

A polarization direction designated for transmission by each of wire grid polarizers constituting fourth photoelectric conversion elements of the photoelectric conversion element units A and the photoelectric conversion element units B is (α+135) degrees.

Moreover, the light receiving device having Configuration 3 of the present disclosure including the respective preferred configurations described above may have the following configuration.

Plural photoelectric conversion element groups arranged two-dimensionally are included.

Each of the photoelectric conversion element groups includes the 2×2 arranged four photoelectric conversion element units A and the 2×2 arranged four photoelectric conversion element units B.

Each of first photoelectric conversion element units constituting the photoelectric conversion element units A and the photoelectric conversion element units B includes a first filter layer that transmits light in a first wavelength range.

Each of second photoelectric conversion element units constituting the photoelectric conversion element units A and the photoelectric conversion element units B includes a second filter layer that transmits light in a second wavelength range.

Each of third photoelectric conversion element units constituting the photoelectric conversion element units A and the photoelectric conversion element units B includes a third filter layer that transmits light in a third wavelength range.

Each of fourth photoelectric conversion element units constituting the photoelectric conversion element units A and the photoelectric conversion element units B includes a fourth filter layer that transmits light in a fourth wavelength range. In this case, the following configuration may be adopted.

Each of the quarter wavelength layers included in the first photoelectric conversion element units constituting the photoelectric conversion element units A gives a phase difference to the light in the first wavelength range.

Each of the quarter wavelength layers included in the second photoelectric conversion element units constituting the photoelectric conversion element units A gives a phase difference to the light in the second wavelength range.

Each of the quarter wavelength layers included in the third photoelectric conversion element units constituting the photoelectric conversion element units A gives a phase difference to the light in the third wavelength range.

Each of the quarter wavelength layers included in the fourth photoelectric conversion element units constituting the photoelectric conversion element units A gives a phase difference to the light in the fourth wavelength range.

Moreover, in a form of the light receiving device of the present disclosure including the respective preferred forms and configurations described above, each of the quarter wavelength layers may include first dielectric layers made of a material having a refractive index $n_1$ and second dielectric layers made of a material having a refractive index $n_2$, the first and second dielectric layers being alternately disposed side by side.

Further, according to the light receiving device of the present disclosure including the respective preferred forms and configurations described above, each of the photoelectric conversion element units is capable of detecting a circularly polarized state of incident light. In this case, the photoelectric conversion element unit is further capable of detecting a right-handed circularly polarized state or a left-handed circularly polarized state as the polarized state of the incident light. In addition, depending on cases, the photoelectric conversion element unit is capable of detecting a left-handed circularly polarized state, a left-handed elliptically polarized state, a linearly polarized state, a right-handed elliptically polarized state, a right-handed circularly polarized state, or an unpolarized state as the polarized state of the incident light.

According to the light receiving device of the present disclosure including the respective preferred forms and configurations described above (hereinafter, these will collectively and simply be referred to as a "light receiving device and the like of the present disclosure" in some cases), the plural photoelectric conversion elements are arranged in a two-dimensional matrix. For convenience of explanation, one arrangement direction of the photoelectric conversion elements will be referred to as an "$x_0$ direction," while the other arrangement direction of the photoelectric conversion elements will be referred to as a "$y_0$ direction." The $x_0$ direction and the $y_0$ direction preferably cross each other at right angles. The $x_0$ direction is what is generally called a row direction or what is generally called a column direction, while the $y_0$ direction is a column direction or a row direction.

In a form of the light receiving device and the like of the present disclosure, the wire grid polarizer may include at least plural laminated structure bodies each including a light reflection layer and a light absorption layer (the light absorption layer being disposed on the light entrance side) that have a band shape and being disposed side by side with a space left between each other (i.e., a form having a line and space structure). Alternatively, the wire grid polarizer in a form may include plural laminated structure bodies each including a light reflection layer, an insulation film, and a light absorption layer that have a band shape (the light absorption layer being disposed on the light entrance side) and being disposed side by side with a space left between each other. Note that adoptable in this case is a configuration where the light reflection layer and the light absorption layer of each of the laminated structure bodies are separated via the insulation film (i.e., a configuration including the insulation film formed on an entire top surface of the light reflection layer and the light absorption layer formed on an entire top surface of the insulation film), or a configuration where a part of the insulation film is cut off to allow contact between the light reflection layer and the light absorption layer at the cut-off portion of the insulation film. In addition, in these cases, the light reflection layer may be made of a first conductive material, while the light absorption layer may be made of a second conductive material. According to such configuration, the entire regions of the light absorption layer and the light reflection layer are allowed to be electrically connected to a region having appropriate potential in the light receiving device. Accordingly, avoidable are such problems as damage to the wire grid polarizer and the photoelectric conversion section caused as a result of a kind of discharge from the wire grid polarizer charged during formation of the wire grid polarizer. Alternatively, the wire grid polarizer may be configured such that the light absorption layer and the light reflection layer are laminated from the light entrance side without the insulation film being provided.

For example, the wire grid polarizer thus configured may be manufactured by the following respective steps:

(A) providing a light reflection layer forming layer above the photoelectric conversion section after forming the photoelectric conversion section, for example, the light reflection layer forming layer being made of a first conductive material and electrically connected to a substrate or the photoelectric conversion section; subsequently, (B) providing an insulation film forming layer on the light reflection layer forming layer, and providing a light absorption layer forming layer on the insulation film forming layer, the light absorption layer forming layer being made of a second conductive material, at least a part of the light absorption layer forming layer being in contact with the light reflection layer forming layer; and then (C) patterning the light absorption layer forming layer, the insulation film forming layer, and the light reflection layer forming layer to obtain a wire grid polarizer which includes plural line portions disposed side by side with a space left between each other, each of the line portions including a light reflection layer, an insulation film, and a light absorption layer that have a band shape. Note that the following form may be adopted.

In step (B), the light absorption layer forming layer made of the second conductive material is provided in a state where the light reflection layer forming layer has predetermined potential via the substrate or the photoelectric conversion section.

In step (C), the light absorption layer forming layer, the insulation film forming layer, and the light reflection layer forming layer are patterned in the state where the light reflection layer forming layer has the predetermined potential via the substrate or the photoelectric conversion section.

Moreover, a base film may be formed below the light reflection layer. In this manner, roughness of the light reflection layer forming layer and the light reflection layer can be improved. Examples of a material constituting the base film (barrier metal layer) include a laminated structure of Ti, TiN, or Ti/TiN.

In a configuration of the wire grid polarizer of the light receiving device and the like of the present disclosure, an extension direction of the band-shaped laminated structure body may coincide with a polarization direction for extinction, while a repeating direction of the band-shaped laminated structure body may coincide with a polarization direction for transmission. Specifically, the light reflection layer functions as a polarizer; the light reflection layer is configured to attenuate polarized waves (either TE or S waves or TM or P waves) having an electric field component in a direction parallel to the extension direction of the laminated structure body and to transmit polarized waves (the other of TE or S waves and TM or P waves) having an electric field component in a direction perpendicular to the extension direction of the laminated structure body (the repeating direction of the band-shaped laminated structure body) in the light having entered the wire grid polarizer. Accordingly, the extension direction of the laminated structure body corresponds to a light absorption axis of the wire grid polarizer, while the direction perpendicular to the extension direction of the laminated structure body corresponds to a light transmission axis of the wire grid polarizer. For convenience of explanation, the extension direction of the laminated structure body having a band shape (i.e., constituting the line portion of the line and space structure) will be referred to as a "first direction," while the repeating direction of the band-shaped laminated structure body (line portion) (the direction perpendicular to the extension direction of the band-shaped laminated structure body) will be referred to as a "second direction" in some cases.

A form where the second direction is parallel to the $x_0$ direction or the $y_0$ direction may be adopted. An angle formed by a described above and the second direction may essentially be any angle, such as 0 or 90 degrees. However, the angle is not limited to these examples.

Figure 43:
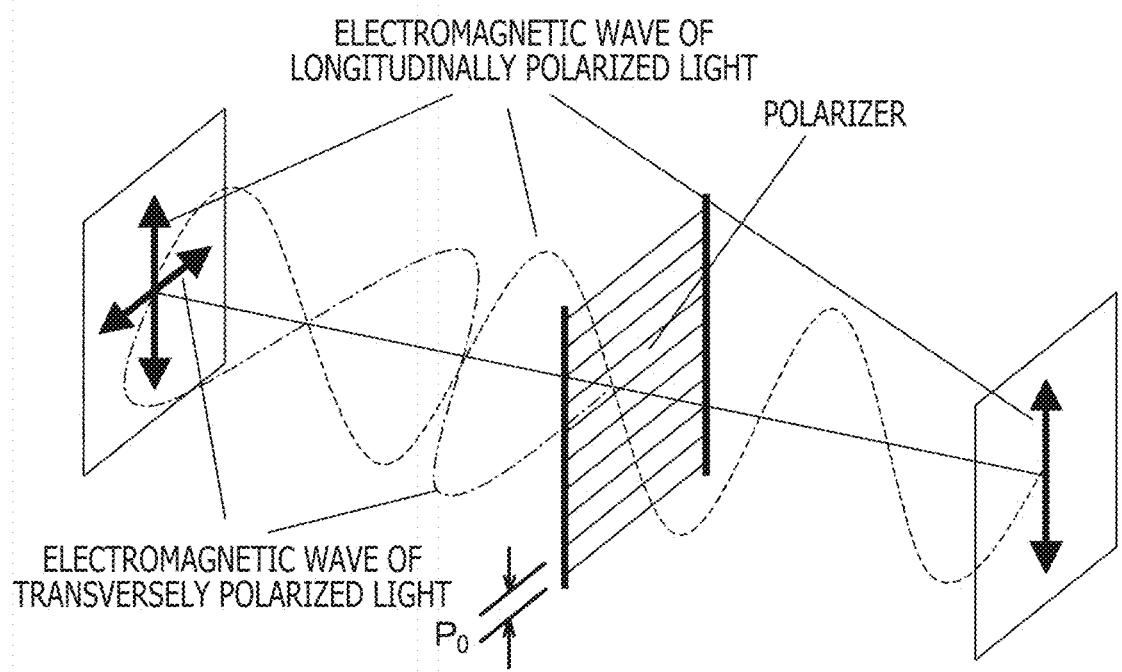
FIG. 43 is a conceptual diagram for explaining light or the like passing through a wire grid polarizer.

As depicted in a conceptual diagram of FIG. 43, in a case where a formation pitch $P_0$ of the wire grid polarizer is significantly smaller than a wavelength $\lambda_0$ of an entering electromagnetic wave, the electromagnetic wave oscillating in a plane parallel to the extension direction of the wire grid polarizer (first direction) is selectively reflected and absorbed by the wire grid polarizer. It is assumed here that the distance between the line portions (distance or length of the space portion in the second direction) is the formation pitch $P_0$ of the wire grid polarizer. In this case, as depicted in FIG. 43, the electromagnetic wave (light) reaching the wire grid polarizer contains a longitudinally polarized light component and a transversely polarized light component. The electromagnetic wave having passed through the wire grid polarizer becomes linearly polarized light where the longitudinally polarized light component is dominant. Here, focusing on a visible light wavelength band, in a case where the formation pitch $P_0$ of the wire grid polarizer is significantly smaller than an effective wavelength $\lambda_{eff}$ of the electromagnetic wave entering the wire grid polarizer, a polarized component biased to a plane parallel to the first direction is reflected or absorbed by a front surface of the wire grid polarizer. On the other hand, when an electromagnetic wave having a polarized component biased to a plane parallel to the second direction enters the wire grid polarizer, an electric field propagating across the front surface of the wire grid polarizer is transmitted (emitted) from a rear surface of the wire grid polarizer as an electric field having the same wavelength as that of the incident wavelength and in the same polarization direction. Here, assuming that an average refractive index obtained on the basis of a material present in the space portion is $n_{ave}$, the effective wavelength $\lambda_{eff}$ is expressed as $(\lambda_0/n_{ave})$. The average refractive index $n_{ave}$ is a value calculated by adding a product of a refractive index and a volume of a material present in the space portion and dividing the added value by a volume of the space portion. In a case where the value of the wavelength $\lambda_0$ is fixed, the value of the effective wavelength $\lambda_{eff}$ increases as the value of $n_{ave}$ decreases. Accordingly, the value of the formation pitch $P_0$ is allowed to increase. In addition, a transmittance and an extinction ratio of the wire grid polarizer both decrease as the value of $n_{ave}$ increases.

According to the light receiving device and the like of the present disclosure, light enters from the light absorption layer. In addition, the wire grid polarizer attenuates a polarized wave (either TE or S wave or TM or P wave) having an electric field component parallel to the first direction and transmits a polarized wave (the other of TE or S wave and TM or P wave) having an electric field component parallel to the second direction, by utilizing four actions of selective light absorption of polarized waves caused by transmission, reflection, interference, and optical anisotropy of light. Specifically, one of the polarized waves (e.g., TE wave) is attenuated by the selective light absorption action of the polarized waves caused by optical anisotropy of the light absorption layer. The band-shaped light reflection layer functions as a polarizer. The one polarized wave (e.g., TE wave) that has been transmitted through the light absorption layer and the insulation film is reflected by the light reflection layer. In this case, the insulation film is configured such that a phase of the one polarized wave that has been transmitted through the light absorption layer and has been reflected on the light reflection layer (e.g., TE wave) deviates by a half wavelength. In this manner, the one polarized wave reflected on the light reflection layer (e.g., TE wave) is cancelled and attenuated by interference with the one polarized wave reflected on the light absorption layer (e.g., TE wave). In the manner described above, the one polarized wave (e.g., TE wave) can be selectively attenuated. However, contrast improves even without optimization of the thickness of the insulation film as described above. Accordingly, for practical use, it is sufficient if the thickness of the insulation film is determined on the basis of a balance between desired polarization characteristics and actual manufacturing steps.

As described above, the quarter wavelength layer has such a structure where the first dielectric layer and the second dielectric layer are disposed side by side. Assuming that a normal line (light entrance direction) of the entire photoelectric conversion element is designated as a Z direction, the first dielectric layer and the second dielectric layer are contained in a Y-Z plane. In addition, the first dielectric layer and the second dielectric layer are alternately disposed side by side in an X direction. Each thickness of the first dielectric layer and the second dielectric layer is a thickness in the X direction. A layer thickness of the quarter wavelength layer is a thickness in the Z direction. An angle formed by the X direction and the second direction may essentially be any angle, such as 0 or 90 degrees. However, the angle is not limited to these examples.

Assuming that the thickness of the first dielectric layer and the thickness of the second dielectric layer of the quarter wavelength layer are $t_1$ and $t_2$, respectively, the quarter wavelength layer has different effective refractive indexes $n_{TE}$ and $n_{TM}$ in the direction (X direction) where the first dielectric layer and the second dielectric layer are disposed side by side and in the direction (Y direction) perpendicular to this direction (X direction), respectively, in a case of a structure where a value $(t_1+t_2)$ is smaller than a wavelength of light. In this case, the quarter wavelength layer behaves like a birefringent material. A difference in light propagation speed is produced between respective polarization directions in association with a difference between the respective effective refractive indexes $n_{TE}$ and $n_{TM}$. As a result, light passing through the quarter wavelength layer obtains a phase difference. In other words, light passing through the quarter wavelength layer is given a phase difference. As a result, a function as a wavelength plate is achieved. Assuming that "f" is a filling factor, f, $n_{TE}$, and $n_{TM}$ are expressed as follows.

$$f=t_1/(t_1+t_2)$$

$$n_{TE}=\{f \times n_1^2+(1-f) \times n_2^2\}^{1/2}$$

$$n_{TM}=\{f/n_1^2+(1-f)/n_2^2\}^{1/2}$$

Assuming that a layer thickness of the quarter wavelength layer (corresponding to a height and a thickness in the Z direction) is H and that a wavelength of light passing through the quarter wavelength layer is A, i.e., assuming that a wavelength of light passing through the quarter wavelength layer and obtaining a phase difference is $\lambda$ (also $\lambda_1$, $\lambda_{2-3}$, $\lambda_4$ described below), a phase difference $\delta$ is expressed as follows.

$$(\lambda/4)=\delta=(n_{TE}-n_{TM}) \times H$$

Accordingly, in a case where H is fixed, a desired value of $\lambda$ can be obtained by changing the value of f, i.e., the values of $t_1$ and $t_2$. In addition, in a case where the values of $t_1$ and $t_2$ are fixed, a desired value of $\lambda$ for the quarter wavelength layer can be obtained by changing the value of H.

It is assumed that a layer thickness of the first quarter wavelength layer is $H_1$, that a layer thickness of the second quarter wavelength layer is $H_2$, that a layer thickness of the third quarter wavelength layer is $H_3$, and that a layer thickness of the fourth quarter wavelength layer is $H_4$. In addition, it is assumed that thicknesses of the first and second dielectric layers of the first quarter wavelength layer are $t_{11}$ and $t_{12}$, that thicknesses of the first and second dielectric layers of the second quarter wavelength layer are $t_{21}$ and $t_{22}$, that thicknesses of the first and second dielectric layers of the third quarter wavelength layer are $t_{31}$ and $t_{32}$, and that thicknesses of the first and second dielectric layers of the fourth quarter wavelength layer are $t_{41}$ and $t_{42}$.

According to the light receiving device having Configuration 2-A-1 of the present disclosure, the first quarter wavelength layer, the second quarter wavelength layer, the third quarter wavelength layer, and the fourth quarter wavelength layer are disposed in different layers. In this case, the values $(t_{11}, t_{12})$, $(t_{21}, t_{22})$, $(t_{31}, t_{32})$, and $(t_{41}, t_{42})$ are equalized. Accordingly, it is sufficient if the values $H_1$, $H_2$, $H_3$, and $H_4$ are varied. Depending on cases, $H_1=H_2=H_3=H_4$ may be set. In this case, it is sufficient if the values $(t_{11}, t_{12})$, $(t_{21}, t_{22})$, $(t_{31}, t_{32})$, and $(t_{41}, t_{42})$ are varied. According to the light receiving device having Configuration 2-A-2 of the present disclosure, the first quarter wavelength layer, the second quarter wavelength layer, the third quarter wavelength layer, and the fourth quarter wavelength layer are disposed in the same layer. In this case, $H_1=H_2=H_3=H_4$ is set. Accordingly, it is sufficient if the values $(t_{11}, t_{12})$, $(t_{21}, t_{22})$, $(t_{31}, t_{32})$, and $(t_{41}, t_{42})$ are varied.

The material constituting the first dielectric layer may be SiN, for example, and the material constituting the second dielectric layer may be $SiO_2$, for example.

In the following description, the laminated structure body constituting the wire grid polarizer provided above the photoelectric conversion section will be referred to as a "first laminated structure body" for convenience of explanation, and the laminated structure body surrounding the first laminated structure body will be referred to as a "second laminated structure body" for convenience of explanation in some cases. The second laminated structure body connects a wire grid polarizer (first laminated structure body) constituting a certain photoelectric conversion element and a wire grid polarizer (first laminated structure body) constituting a photoelectric conversion element adjacent to the certain photoelectric conversion element. The second laminated structure body may be constituted by a laminated structure body having the same configuration as that of the laminated structure body constituting the wire grid polarizer (i.e., the second laminated structure body including at least a light reflection layer and a light absorption layer, or a light reflection layer, an insulation film, and a light absorption layer, for example, and having what is generally called a solid film not including a line and space structure). The second laminated structure body may have a line and space structure like the wire grid polarizer if the second laminated structure body does not function as a wire grid polarizer. In other words, the second laminated structure body may be structured to have the wire grid formation pitch $P_0$ sufficiently longer than an effective wavelength of entering electromagnetic waves. It is sufficient if a frame portion which will be described below also includes the second laminated structure body. Depending on cases, the frame portion may include the first laminated structure body. The frame portion is preferably connected with the line portion of the wire grid polarizer. The frame portion is allowed to function as a light shielding portion.

The light reflection layer (light reflection layer forming layer) may be made of a metal material, an alloy material, or a semiconductor material, and the light absorption layer may be made of a metal material, an alloy material, or a semiconductor material. Specifically, examples of an inorganic material constituting the light reflection layer (light reflection layer forming layer) include metal materials such as aluminum (Al), silver (Ag), gold (Au), copper (Cu), platinum (Pt), molybdenum (Mo), chrome (Cr), titanium (Ti), nickel (Ni), tungsten (W), iron (Fe), silicon (Si), germanium (Ge), and tellurium (Te) and alloy materials and semiconductor materials containing these metals.

The light absorption layer (or light absorption layer forming layer) may be made of a metal material, an alloy material, or a semiconductor material having an extinction coefficient k other than zero, i.e., performing a light absorbing action. Specifically, examples of these materials include metal materials such as aluminum (Al), silver (Ag), gold (Au), copper (Cu), molybdenum (Mo), chrome (Cr), titanium (Ti), nickel (Ni), tungsten (W), iron (Fe), silicon (Si), germanium (Ge), tellurium (Te), and tin (Sn) and alloy materials and semiconductor materials containing these metals. Moreover, silicide-based materials such as $FeSi_2$ (particularly $\beta$-$FeSi_2$), $MgSi_2$, $NiSi_2$, $BaSi_2$, $CrSi_2$, and $CoSi_2$ may be used. Particularly, high contrast (high extinction ratio) can be obtained in a visible light range by adopting aluminum or an alloy of aluminum or a semiconductor material containing $\beta$-$FeSi_2$, germanium, or tellurium as the material constituting the light absorption layer (light absorption layer forming layer). Note that silver (Ag), copper (Cu), gold (Au) or the like is preferably used as the material constituting the light absorption layer (light absorption layer forming layer) for giving polarization characteristics in a wavelength band other than visible light, such as an infrared range. These metals are preferably used in view of a point that resonance wavelengths of the metals are located near the infrared range.

The light reflection layer forming layer and the light absorption layer forming layer may be formed using a known method, such as various types of chemical vapor deposition (CVD), coating, various types of physical vapor deposition (PVD) including sputtering and vacuum deposition, sol-gel, plating, MOCVD, and MBE. In addition, examples of patterning for the light reflection layer forming layer and the light absorption layer forming layer include a combination of a lithography technique and an etching technique (e.g., anisotropy dry etching technique using carbon tetrafluoride gas, sulfur hexafluoride gas, trifluoromethane gas, xenon difluoride gas, or the like and a physical etching technique), what is generally called a lift-off technique, and what is generally called a self-align double patterning technique using a sidewall as a mask. Examples of the lithography technique include a photolithography technique (lithography technique using a light source including a g line and an i line of a high-pressure mercury lamp, KrF excimer laser, ArF excimer laser, EUV, or the like, and a liquid immersion lithography technique, an electronic beam lithography technique, and X-ray lithography of these lithography techniques). Alternatively, the light reflection layer and the light absorption layer may be formed on the basis of a fine processing technique using an extremely short period pulse laser such as a femtosecond laser, or a nanoimprinting.

Examples of materials constituting an insulation film (or insulation film forming layer), an interlayer insulation layer, a base insulation layer, and a flattening film include an insulation material that is transparent to incident light and that has no light absorbing characteristics, specifically, silicon oxide ($SiO_2$), NSG (non-doped silicate glass), BPSG (boron phosphorous silicate glass), $SiO_x$-based materials (materials constituting silicon-based oxide film) such as PSG, BSG, PbSG, AsSG, SbSG, and SOG (spin-on glass), SiN, silicon oxynitride (SiON), SiOC, SiOF, SiCN, low dielectric constant insulation materials (e.g., fluorocarbon, cycloperfluorocarbon polymer, benzocyclobutene, cyclic fluororesin, polytetrafluoroethylene, amorphous tetrafluoroethylene, polyaryl ether, aryl fluoride ether, polyimide fluoride, organic SOG, parylene, fullerene fluoride, and amorphous carbon), polyimide-based resin, fluorine-based resin, Silk (a registered trademark of The Dow Chemical Co., a coating type low dielectric constant interlayer insulation film material), Flare (a registered trademark of Honeywell Electronic Materials Co., polyaryl ether (PAE)-based material). These materials may be used as a single material or may be combined. Alternatively, the examples include polymethyl methacrylate (PMMA); polyvinyl phenol (PVP), polyvinyl alcohol (PVA); polyimide; polycarbonate (PC); polyethylene terephthalate (PET); polystyrene; silanols (silane coupling agents) such as N-(aminoethyl) 3-aminopropyl trimethoxysilane (AEAPTMS), 3-mercaptopropyl trimethoxysilane (MPTMS), and octadecyltrichlosilane (OTS); novolac phenolic resin; fluorine resin; and organic insulation materials (organic polymers) such as straight chain hydrocarbons that have a functional group located at one end of octadecanethiol, dodecyl isocyanate, or the like and are connectable with a control electrode. Combinations of these materials may be adopted. The insulation film forming layer may be formed using a known method, such as various types of CVD, coating, various types of PVD including sputtering and vacuum deposition, various types of printing such as screen printing, and sol-gel. The insulation film is provided for purposes of functioning as a base layer of the light absorption layer while controlling phases of polarized light reflected on the light absorption layer and polarized light transmitted through the light absorption layer and reflected on the light reflection layer, improving an extinction ratio and a transmission rate by utilizing an interference effect, and reducing a reflectance. Accordingly, the insulation film preferably has such a thickness that a phase deviation by a half wavelength is produced by one reciprocation. However, the light absorption layer which has a light absorbing effect absorbs reflected light. Accordingly, the extinction ratio can improve even when the insulation film does not have the optimized thickness described above. Thus, for practical use, it is sufficient if the thickness of the insulation film is determined on the basis of a balance between desired polarization characteristics and actual manufacturing steps. For example, the thickness may range from $1\times10^{-9}$ to $1\times10^{-7}$ m, more preferably from $1\times10^{-8}$ to $8\times10^{-8}$ m. In addition, the refractive index of the insulation film is larger than 1.0, and preferably, but not limited to, 2.5 or smaller.

In a form of the light receiving device and the like of the present disclosure, the space portion of the wire grid polarizer may be a void (i.e., the space portion may be filled with at least air). In such a manner, the value of the average refractive index $n_{ave}$ can be reduced by providing a void in the space portion of the wire grid polarizer. As a result, improvement of a transmittance of the wire grid polarizer and improvement of an extinction ratio are achievable. Moreover, a value of the formation pitch $P_0$ is allowed to increase. Accordingly, improvement of a production yield of the wire grid polarizer is achievable. Further, a form where a protection film is formed above the wire grid polarizer may be adopted. In this manner, a photoelectric conversion element and a light receiving device having high reliability are providable. In addition, the protection film thus provided can improve reliability such as improved moisture resistance of the wire grid polarizer. It is sufficient if the protection film has a thickness in a range not affecting polarization characteristics. The reflectance for incident light also changes according to an optical thickness (refractive index×film thickness of protection film) of the protection film. Accordingly, it is sufficient if the material and the thickness of the protection film are determined in consideration of these factors. For example, the thickness may be 15 nm or smaller. Alternatively, the thickness may be equal to or smaller than ¼ of a distance between the laminated structure bodies. The material constituting the protection film is preferably a material having a refractive index of two or lower and an extinction coefficient close to zero. Examples of the material include insulation materials such as $SiO_2$, SiON, SiN, SiC, SiOC, and SiCN containing TEOS-$SiO_2$ and metal oxide such as aluminum oxide ($AlO_x$), hafnium oxide ($HfO_x$), zirconium oxide ($ZrO_x$), and tantalum oxide ($TaO_x$). Alternatively, examples include perfluorodecyltrichlorosilane and octadecyltrichlorosilane. The protection film may be formed by a known process such as various types of CVD, coating, various types of PVD including sputtering and vacuum deposition, and sol-gel. It is more preferable, however, to adopt what is generally called atomic layer deposition (ALD) or HDP-CVD (high-density plasma chemical vapor deposition). A thin protection film can be formed conformally on the wire grid polarizer by adopting ALD or HDP-CDV. The protection film may be formed on the entire surface of the wire grid polarizer. However, adoptable is such a form where the protection film is formed only on a side surface of the wire grid polarizer and not above a base insulation layer located between the wire grid polarizers. In addition, moisture and an organic material contained in the air can be cut off by forming the protection film in such a manner as to cover a side surface where the metal material and the like constituting the wire grid polarizer are exposed as described above. Accordingly, problems such as corrosion and abnormal precipitation of the metal material and the like constituting the wire grid polarizer can be reduced reliably. Moreover, improvement of long-term reliability of the photoelectric conversion element is achievable. Accordingly, a photoelectric conversion element including a highly reliable wire grid polarizer as an on-chip element is providable.

Further, the following form may be adopted. In a case where the protection film is formed on the wire grid polarizer, a second protection film is further formed between the wire grid polarizer and the protection film.

Assuming that a refractive index of a material constituting the protection film is $n_1'$ and that a refractive index of a material constituting the second protection film is $n_2'$, $n_1'>n_2'$ holds. The value of the average refractive index $n_{ave}$ can be reduced reliably by satisfying $n_1'>n_2'$. Here, it is preferable that the protection film is made of SiN and that the second protection film is made of $SiO_2$ or SiON.

Moreover, adoptable is a form where a third protection film is formed on at least a side surface of the line portion of the wire grid polarizer facing the space portion. Specifically, the space portion is filled with air, and the third protection film is present in the space portion. The material constituting the third protection film here is preferably a material having a refractive index of two or lower and an extinction coefficient close to zero. Examples of the material include insulation materials such as $SiO_2$, SiON, SiN, SiC, SiOC, and SiCN containing TEOS-$SiO_2$ and metal oxide such as aluminum oxide ($AlO_x$), hafnium oxide ($HfO_x$), zirconium oxide ($ZrO_x$), and tantalum oxide ($TaO_x$). Alternatively, examples include perfluorodecyltrichlorosilane and octadecyltrichlorosilane. The third protection film may be formed using a known process such as various types of CVD, coating, various types of PVD including sputtering and vacuum deposition, and sol-gel. It is more preferable, however, to adopt what is generally called atomic layer deposition (ALD) or HDP-CVD (high-density plasma chemical vapor deposition). A thin third protection film can be formed conformally on the wire grid polarizer by adopting ALD. However, from a viewpoint of forming a further thinner third protection film on the side surface of the line portion, it is further preferable to adopt HDP-CVD. Alternatively, the refractive index of the entire third protection film can be reduced by filling the space portion with the material constituting the third protection film and also forming a clearance, a hole, a void, or the like in the third protection film.

When a metal material or an alloy material constituting the wire grid polarizer (hereinafter referred to as a "metal material or the like" in some cases) comes into contact with the outside air, corrosion resistance of the metal material or the like deteriorates by adhesion of moisture or an organic material from the outside air. In this case, long-term reliability of the photoelectric conversion section may deteriorate. Particularly, when moisture adheres to the line portion (laminated structure body) constituted by the metal material or the like, the insulation material, and the metal material or the like, $CO_2$ and $O_2$ dissolved in the moisture acts as electrolyte. In this case, a local battery may be generated between two types of metal. In addition, when such a phenomenon occurs, a reduction reaction such as hydrogen generation develops on a cathode (positive electrode) side. Meanwhile, an oxidation reaction develops on an anode (negative electrode) side. Accordingly, abnormal precipitation of the metal material or the like or a shape change of the wire grid polarizer is caused. As a result, performance of the wire grid polarizer and the photoelectric conversion section originally expected may deteriorate. For example, in a case where aluminum (Al) is adopted to constitute the light reflection layer, abnormal precipitation of aluminum as expressed in the following reaction equation may be caused. However, such problem can be reliably prevented by forming the protection film and also forming the third protection film.

$$Al \rightarrow Al^{3+} + 3e^-$$

$$Al^{3+} + 3OH^- \rightarrow Al(OH)_3$$

According to the light receiving device and the like of the present disclosure, a length of the light reflection layer in the first direction may be equal to a length of a photoelectric conversion region in the first direction, the photoelectric conversion region being a region where the photoelectric conversion element practically performs photoelectric conversion, may be equal to a length of the photoelectric conversion element, or may be a length of an integral multiple of the length of the photoelectric conversion element in the first direction. However, the length of the light reflection layer is not limited to these examples.

According to the light receiving device and the like of the present disclosure, an on-chip microlens (OCL) may include a main on-chip microlens provided above the wire grid polarizer, or a sub on-chip microlens provided above the wire grid polarizer (inner lens, OPA) and a main on-chip microlens provided above the sub on-chip microlens (OPA).

In addition, according to such configuration, wavelength selection means (specifically, a known filter layer, for example) may be disposed between the wire grid polarizer and the on-chip microlens. The wire grid polarizer can be independently optimized in a wavelength band of transmitted light in each of the wire grid polarizers by adopting such configuration. Accordingly, further reduction of the reflectance is achievable throughout the visible light range. A flattening film may be formed between the wire grid polarizer and the wavelength selection means. A base insulation layer that is made of an inorganic material such as a silicon oxide film and that functions as a base of a process during wire grid polarizer manufacturing steps may be formed below the wire grid polarizer. In a case where the main on-chip microlens is provided above the sub on-chip microlens (OPA), wavelength selection means (a known filter layer) may be disposed between the sub on-chip microlens and the main on-chip microlens.

Examples of the filter layer include not only a filter layer which transmits light in the first wavelength range such as red light, light in the second wavelength range or the third wavelength range such as green light, and light in the fourth wavelength range such as blue light, but also a filter layer which transmits a particular wavelength such as cyan, magenta, and yellow and a filter layer which does not transmit light in the first wavelength range, the second wavelength range, and the third wavelength range. In addition, in a case of a purpose other than the purposes of color separation and spectral diffraction, or in a case of a photoelectric conversion element which itself has sensitivity to a particular wavelength, the filter layer may be unnecessary. In a case where a photoelectric conversion element including the filter layer and a photoelectric conversion element not including the filter layer are mixed, a transparent resin layer may be formed in place of the filter layer on the photoelectric conversion element not including the filter layer, to obtain sufficient flatness with the photoelectric conversion element including the filter layer. The filter layer (color filter layer) may be constituted by not only an organic material-based color filter layer including an organic compound such as a pigment and a dye, but also a color filter layer having a photonic crystal, a wavelength selection element to which plasmon is applied (a color filter having a conducting grid structure which includes a grid-shaped hole structure in a conductive thin film, see Japanese Patent Laid-open No. 2008-177191, for example), or a thin film constituted by an inorganic material such as amorphous silicon.

Plural layers of, for example, various kinds of wiring (wiring layers) made of aluminum (Al), copper (Cu), or the like is formed below the wire grid polarizer to drive the photoelectric conversion element. In addition, the wire grid polarizer is connected to a semiconductor substrate via the various kinds of wiring (wiring layers) and contact hole portions. In this manner, predetermined potential can be applied to the wire grid polarizer. Specifically, the wire grid polarizer is grounded, for example. Examples of the semiconductor substrate include a compound semiconductor substrate such as a silicon semiconductor substrate and an InGaAs substrate.

In a case of an imaging element including the photoelectric conversion element, configurations and structures of a floating diffusion layer, an amplification transistor, a reset transistor, and a selection transistor constituting a control section for controlling driving of the imaging element may be similar to configurations and structures of a floating diffusion layer, an amplification transistor, a reset transistor, and a selection transistor of a conventional control section. Similarly, a driving circuit may have a known configuration and a known structure.

A waveguide structure or a light condensing tube may be provided between the photoelectric conversion elements in the photoelectric conversion element group. In this manner, reduction of optical crosstalk is achievable. The waveguide structure here includes a thin film which is formed in a region (e.g., columnar region) included in an interlayer insulation layer in such a manner as to cover the photoelectric conversion section and located between the photoelectric conversion sections and which has a refractive index larger than a refractive index of a material constituting the interlayer insulation layer. Light entering from above the photoelectric conversion section is reflected on this thin film by total reflection and reaches the photoelectric conversion section. Specifically, an orthogonal projection image of the photoelectric conversion section with respect to the substrate is located inside an orthogonal projection image of the thin film constituting the waveguide structure with respect to the substrate. The orthogonal projection image of the photoelectric conversion section with respect to the substrate is surrounded by the orthogonal projection image of the thin film constituting the waveguide structure with respect to the substrate. In addition, the light condensing tube structure includes a light-shielding thin film made of a metal material or an alloy material and formed in a region (e.g., columnar region) included in the interlayer insulation layer in such a manner as to cover the photoelectric conversion section and located between the photoelectric conversion sections. Light entering from above the photoelectric conversion section is reflected on this thin film and reaches the photoelectric conversion section. Specifically, an orthogonal projection image of the photoelectric conversion section with respect to the substrate is located inside an orthogonal projection image of the thin film constituting the light condensing tube structure with respect to the substrate. The orthogonal projection image of the photoelectric conversion section with respect to the substrate is surrounded by the orthogonal projection image of the thin film constituting the light condensing tube structure with respect to the substrate.

According to the light receiving device and the like of the present disclosure, one photoelectric conversion element unit (one pixel) may include plural photoelectric conversion elements (sub pixels). In addition, for example, each of the sub pixels includes one photoelectric conversion element. A relation between the pixel and the sub pixel will be described below. Configurations and structures of the photoelectric conversion element or the photoelectric conversion section themselves may be similar to known configurations and structures.

All of the photoelectric conversion elements constituting the light receiving device of the present disclosure may each include the wire grid polarizer, or only some of the photoelectric conversion elements may each include the wire grid polarizer. The photoelectric conversion element unit including the plural photoelectric conversion elements may have Bayer array. The one photoelectric conversion element unit (one pixel) may include four photoelectric conversion elements (four sub pixels). However, the arrangement of the photoelectric conversion element unit is not limited to Bayer array. Other examples include an interline array, a G-stripe RB checkered array, a G-stripe RB complete checkered array, a checkered complementary color array, a stripe array, a diagonal stripe array, a primary color chrominance array, a field chrominance sequential array, a frame chrominance sequential array, a MOS type array, an improved MOS type array, a frame interleave array, and a field interleave array. As described above, in a case of a purpose other than purposes such as color separation and spectral diffraction, or in a case of a photoelectric conversion element which itself has sensitivity to a particular wavelength, the filter layer may be unnecessary. The photoelectric conversion element may include a combination of a red light photoelectric conversion element having sensitivity to red light, a green light photoelectric conversion element having sensitivity to green light, and a blue light photoelectric conversion element having sensitivity to blue light or a combination of these and also an infrared photoelectric conversion element having sensitivity to infrared light. In addition, the light receiving device and the like of the present disclosure may be a solid-state imaging device obtaining a monochromatic image or a solid-state imaging device obtaining a combination of a monochromatic image and an image based on infrared light.

In a case of application of the light receiving device and the like of the present disclosure to a solid-state imaging device, examples of the photoelectric conversion element include a CCD element, a CMOS image sensor, a CIS (Contact Image Sensor), and CMD (Charge Modulation Device) type signal amplification image sensor. The photoelectric conversion element is a front-illuminated type photoelectric conversion element or a back-illuminated type photoelectric conversion element. For example, the solid-state imaging device may constitute a digital still camera, a video camera, a camcorder, a monitoring camera, a camera mounted on a vehicle, a smartphone camera, a game user interface camera, and a biometric authentication camera. In addition, a solid-state imaging device capable of simultaneously acquiring polarized light information in addition to performing ordinary imaging may be constituted. Also allowed is application to a solid-state imaging device imaging a three-dimensional image. In a case where the light receiving device and the like of the present disclosure is incorporated in a solid-state imaging device, the solid-state imaging device is capable of constituting a single panel type color solid-state imaging device.

Embodiment 1

Figure 2A:
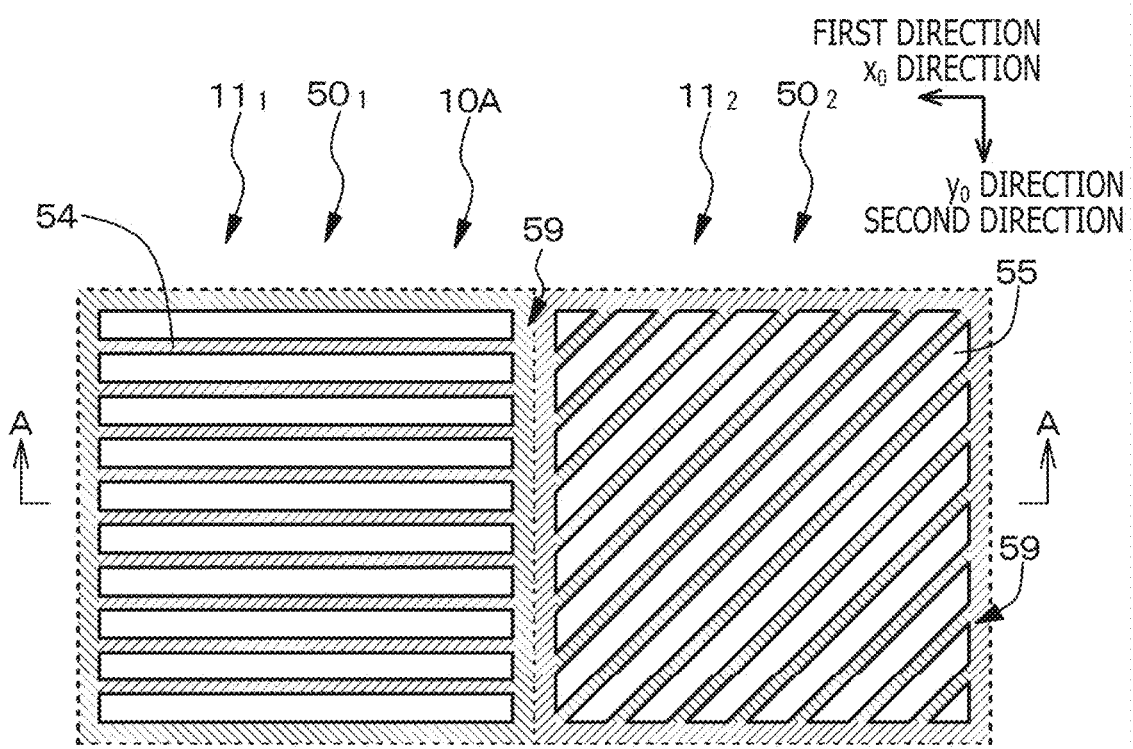
FIGS. 2A and 2B are schematic plan diagrams of wire grid polarizers and quarter wavelength layers, respectively, included in photoelectric conversion elements constituting a photoelectric conversion element unit of the light receiving device of Embodiment 1.
Figure 2B:
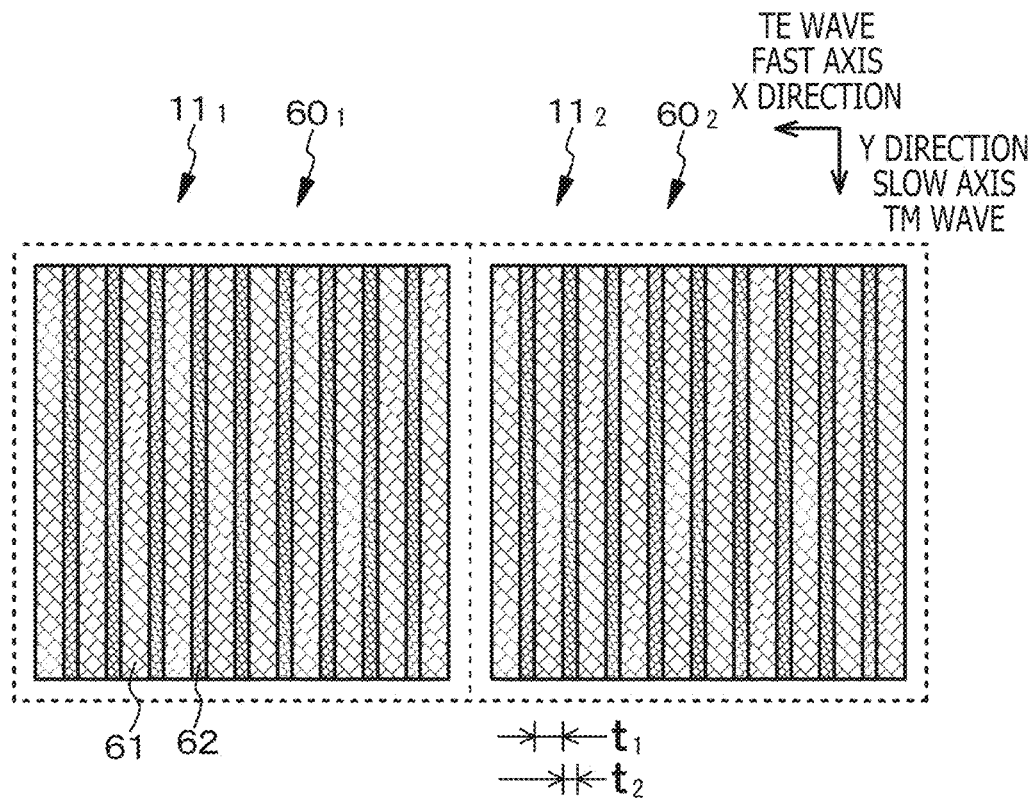
Figure 3:
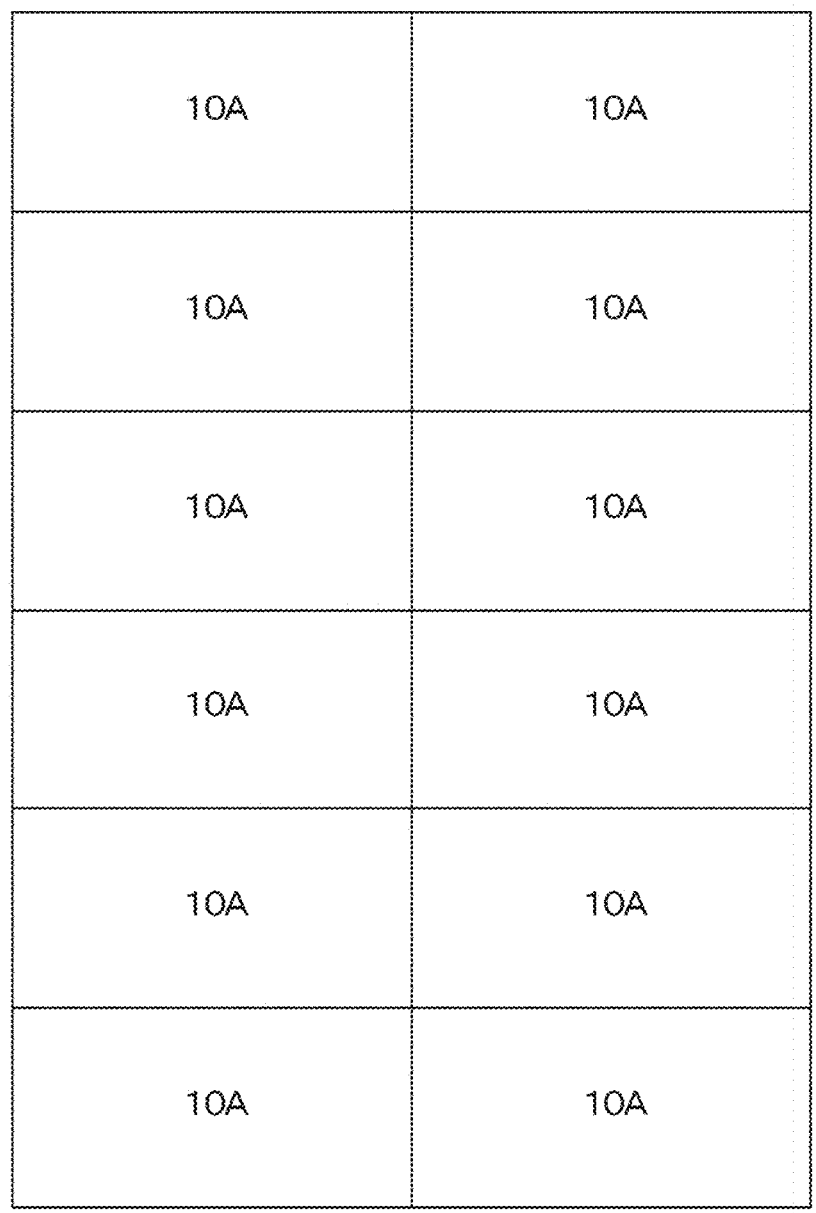
FIG. 3 is a conceptual plan diagram of the photoelectric conversion element units constituting the light receiving device of Embodiment 1.
Figure 4:
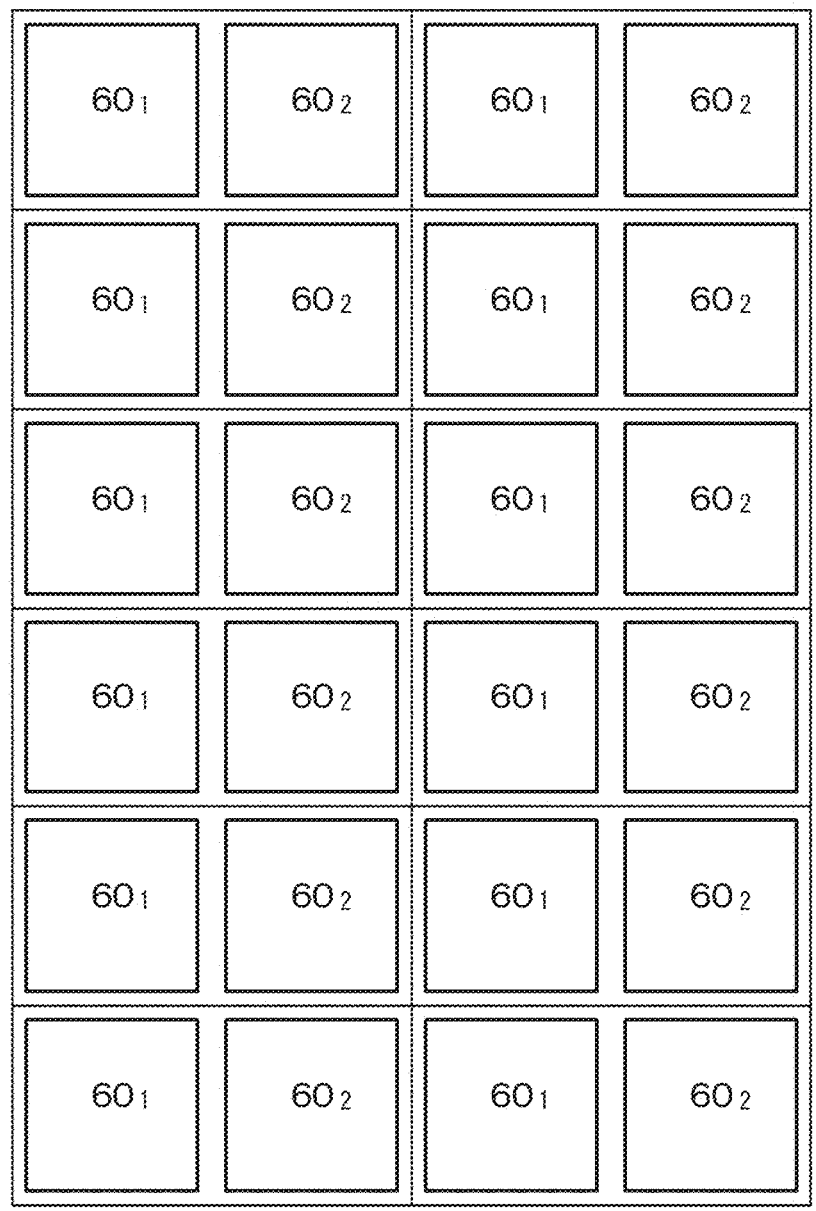
FIG. 4 is a conceptual plan diagram of the fourth quarter wavelength layers constituting the photoelectric conversion elements of the light receiving device of Embodiment 1.
Figure 5:
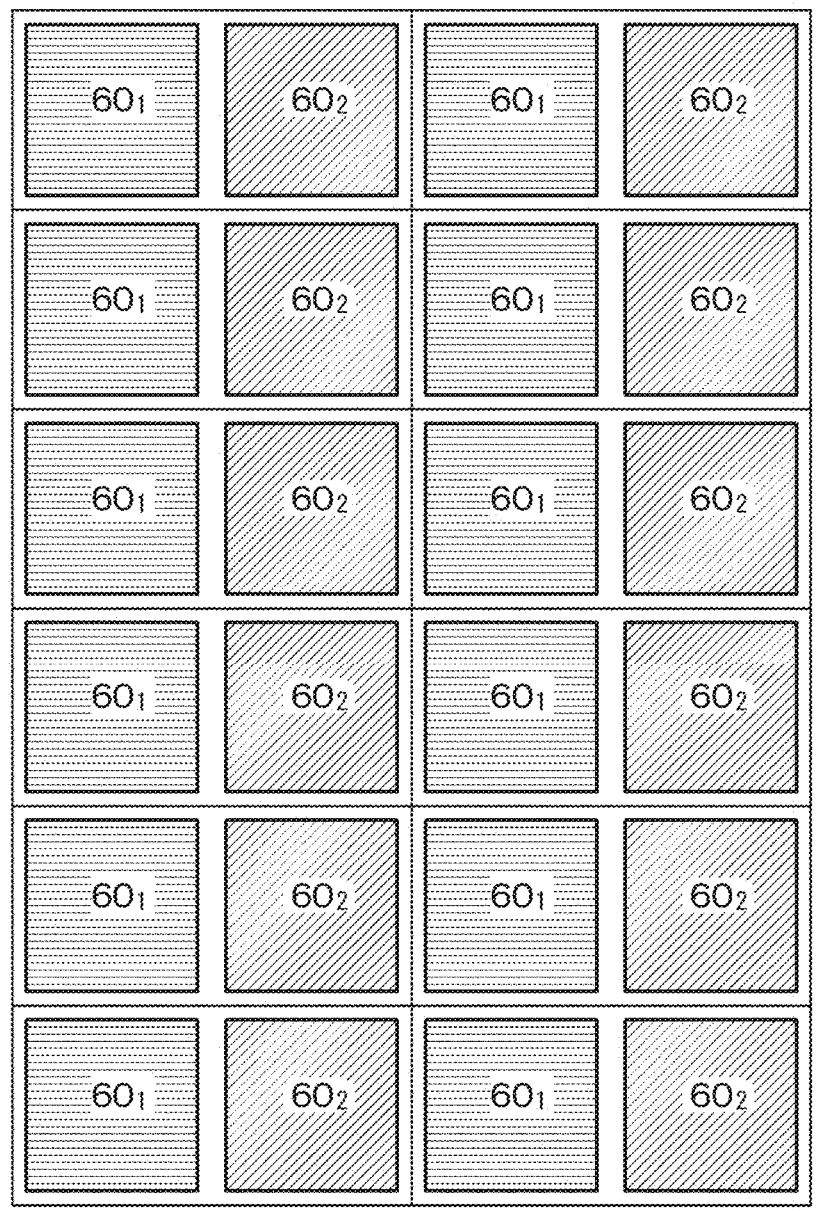
FIG. 5 is a conceptual plan diagram of the wire grid polarizers constituting the photoelectric conversion elements of the light receiving device of Embodiment 1.
Figure 6:
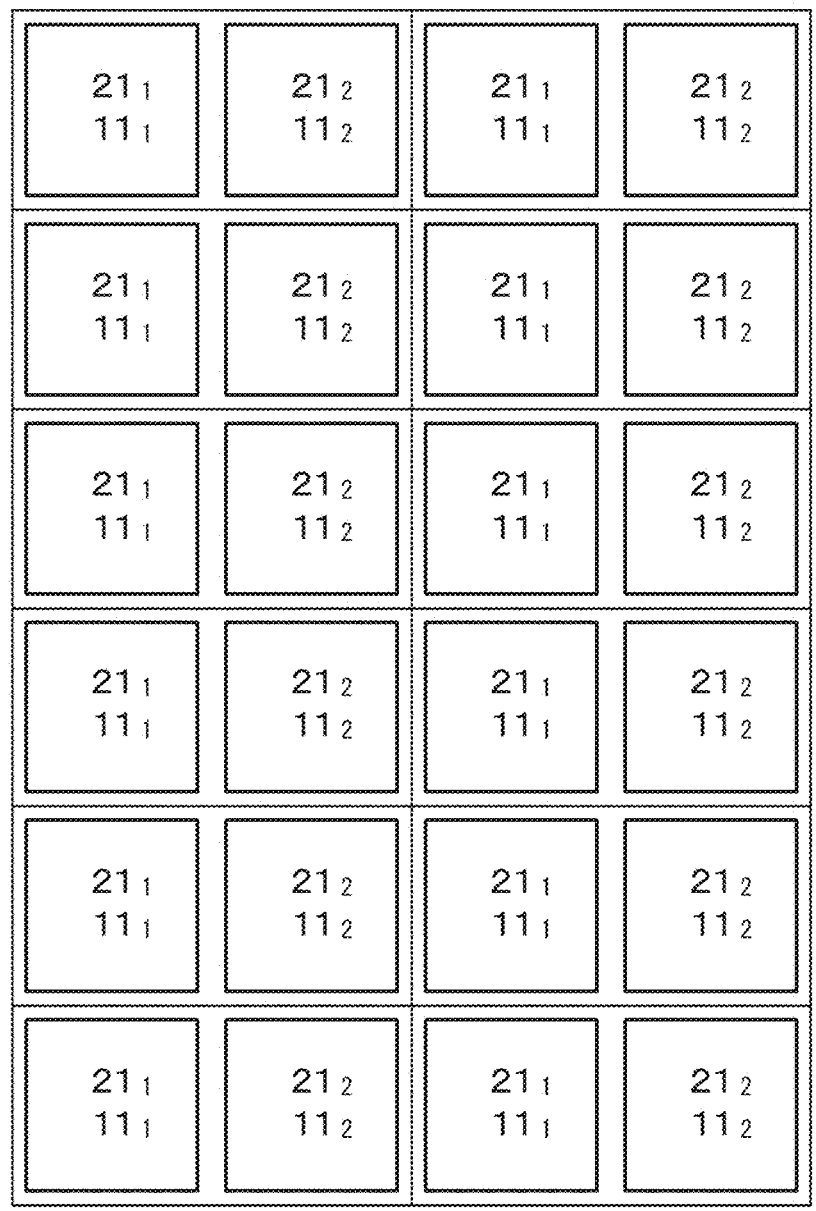
FIG. 6 is a conceptual plan diagram of the photoelectric conversion sections constituting the photoelectric conversion elements and the photoelectric conversion elements of the light receiving device of Embodiment 1.
Figure 7:
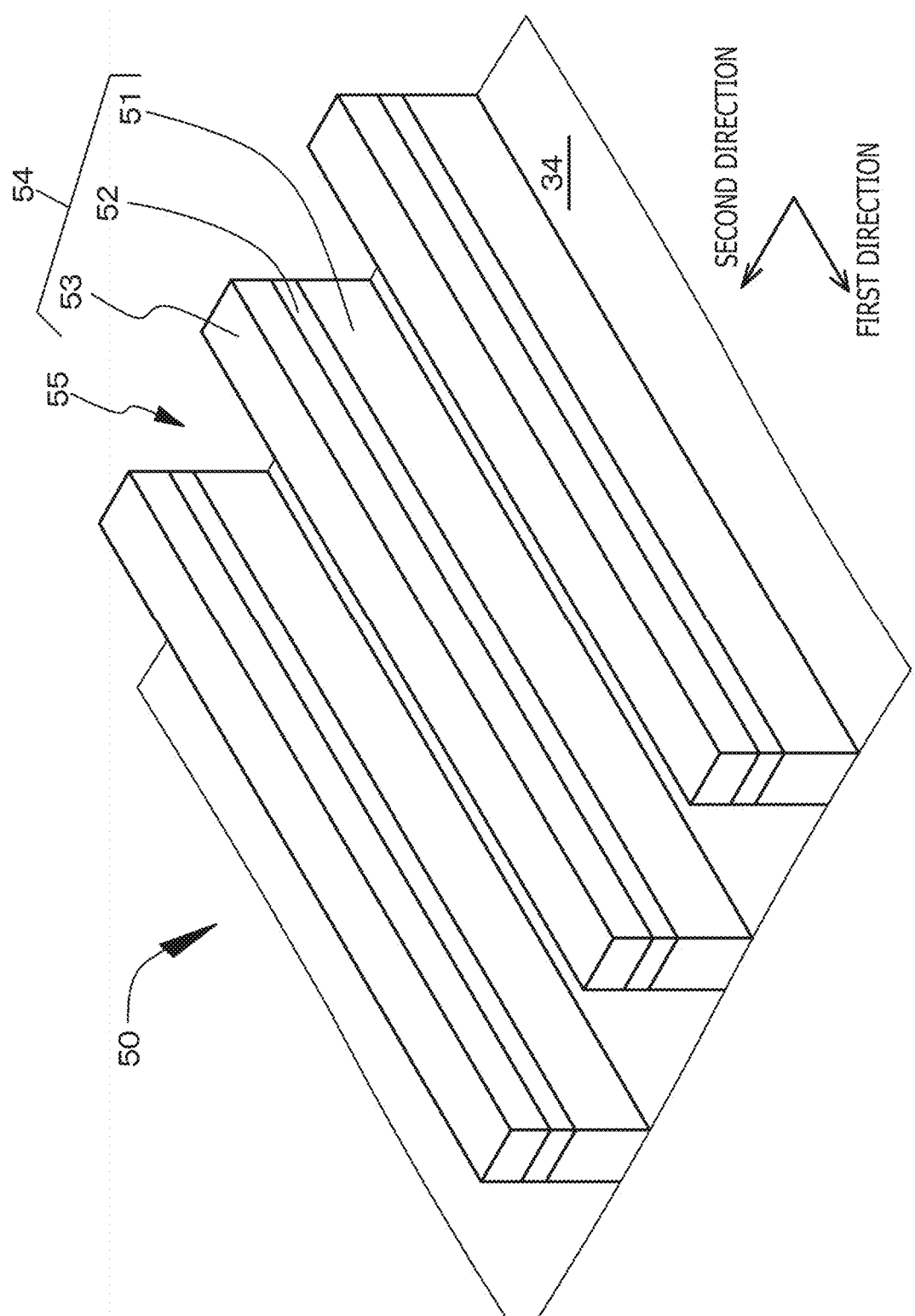
FIG. 7 is a schematic perspective diagram of the wire grid polarizer constituting the photoelectric conversion element of the light receiving device of the present disclosure.
Figure 8:
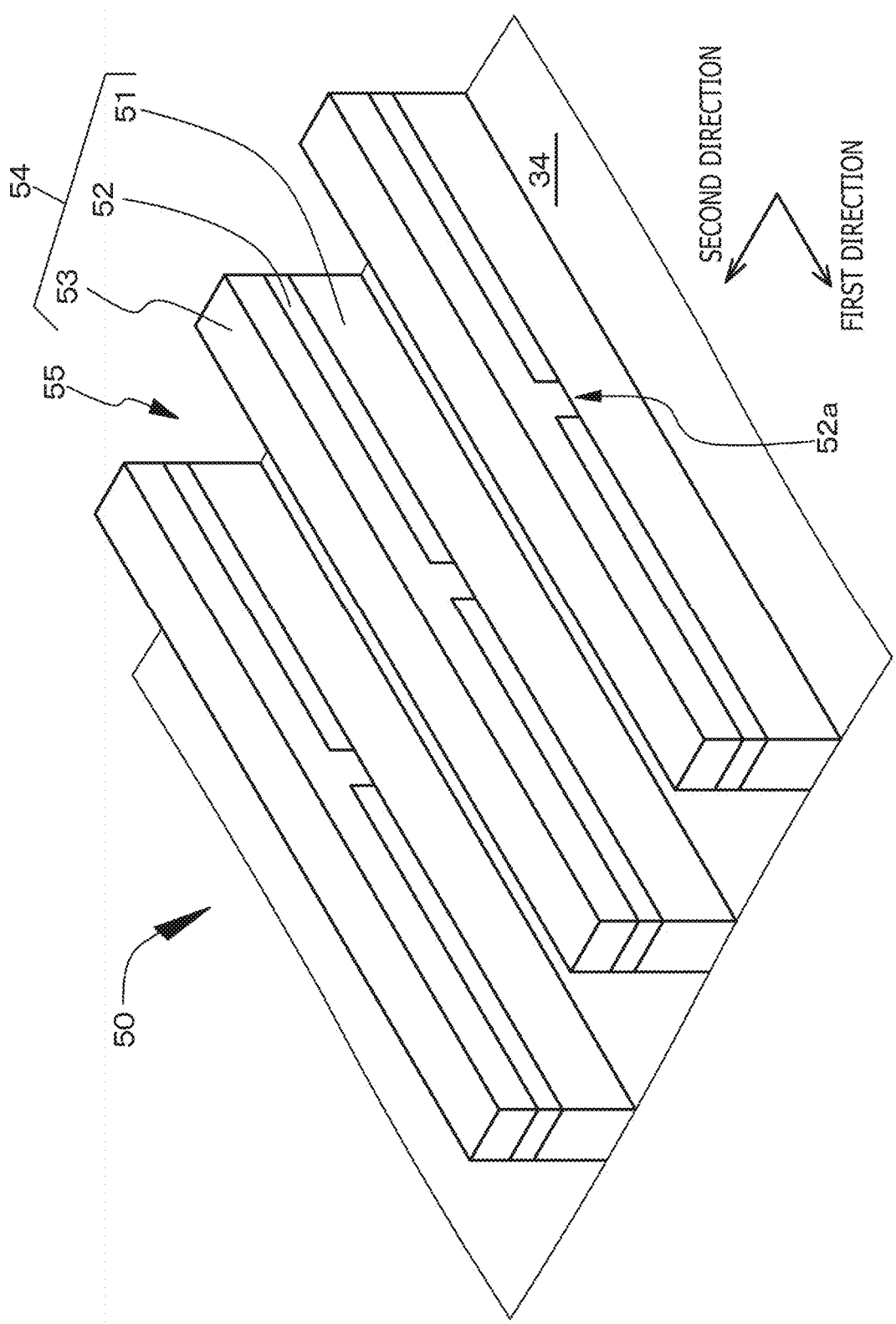
FIG. 8 is a schematic perspective diagram of a modification of the wire grid polarizer.

Embodiment 1 relates to a light receiving device and a photoelectric conversion element of the present disclosure, and specifically to a light receiving device having Configuration 1 of the present disclosure. FIG. 1 is a schematic partial cross-sectional diagram of the light receiving device of Embodiment 1 taken along arrows A-A of FIG. 2A, while FIGS. 2A and 2B are each schematic plan diagrams of wire grid polarizers and quarter wavelength layers included in photoelectric conversion elements constituting a photoelectric conversion element unit of the light receiving device of Embodiment 1. Moreover, FIG. 3 is a conceptual plan diagram of the photoelectric conversion element units of the light receiving device of Embodiment 1, FIG. 4 is a conceptual plan diagram of the fourth quarter wavelength layers, FIG. 5 is a conceptual plan diagram of the wire grid polarizers, and FIG. 6 is a conceptual plan diagram of photoelectric conversion sections and the photoelectric conversion elements. Furthermore, each of FIGS. 7 and 8 is a schematic perspective diagram of the wire grid polarizer, each of FIGS. 9A, 9B, 10A, and 10B is a schematic partial cross-sectional diagram of the wire grid polarizer, and FIG. 11 is a schematic perspective diagram of the quarter wavelength layer. Note that each of FIGS. 3, 4, 5, and 6 depicts 2×6 photoelectric conversion element units.

The light receiving device of Embodiment 1 includes plural photoelectric conversion element units 10A each including plural photoelectric conversion elements 11. Each of the photoelectric conversion elements 11 constituting the photoelectric conversion element units 10A includes a quarter wavelength layer 60, a wire grid polarizer 50, and a photoelectric conversion section 21 disposed in this order from the light entrance side. In addition, the photoelectric conversion element 11 of Embodiment 1 includes the quarter wavelength layer 60, the wire grid polarizer 50, and the photoelectric conversion section 21 disposed in this order from the light entrance side.

Moreover, each of the photoelectric conversion elements 11 includes an on-chip microlens 81 disposed on the light entrance side of the quarter wavelength layer 60.

Further, according to the light receiving device of Embodiment 1, each of the photoelectric conversion element units 10A includes two photoelectric conversion elements 11₁ and 11₂. A polarization direction designated for transmission by a wire grid polarizer 50₁ constituting the first photoelectric conversion element 11₁ is α degrees, while a polarization direction designated for transmission by a wire grid polarizer 50₂ constituting the second photoelectric conversion element 11₂ is (α+45) degrees. For example, the light receiving device of Embodiment 1 configured as described above is applicable to a light receiving device not aimed at color separation and spectral diffraction (e.g., sensor). The photoelectric conversion element itself has sensitivity to a specific wavelength and does not require a filter layer.

An angle formed by α and the second direction may essentially be any angle. According to Embodiment 1 and respective embodiments described below, however, this angle is set to 0 degrees. In addition, the second direction is set to a direction parallel to the $y_0$ direction. However, the angle and the direction are not limited to these examples.

Each of quarter wavelength layers 60₁ and 60₂ is formed by alternately arranging a first dielectric layer 61 made of a material having a refractive index $n_1$ and a thickness $t_1$ and a second dielectric layer 62 made of a material having a refractive index $n_2$ (provided that $n_1 > n_2$) and a thickness $t_2$ side by side. The first dielectric layer 61 is specifically made of SiN ($n_1$=2.0), while the second dielectric layer 62 is specifically made of SiO₂ ($n_2$=1.5) here. This configuration is also applicable to the following embodiments.

Embodiment 1 specifies $t_1$=150 nm, and $t_2$=150 nm.

In this case, $f$=150/(150+150)=0.5, $n_{TE}$=1.77, and $n_{TM}$=0.59 are determined.

When H=125 nm is set, a wavelength λ of light which passes through the quarter wavelength layer 60 and obtains a phase difference becomes λ=600 nm.

In addition, the photoelectric conversion element unit is capable of detecting a circularly polarized state of incident light. In this case, the photoelectric conversion element unit is further capable of detecting a right-handed circularly polarized state or a left-handed circularly polarized state as the polarized state of the incident light. Moreover, the photoelectric conversion element unit is further capable of detecting a left-handed elliptically polarized state, a linearly polarized state, or a right-handed elliptically polarized state as the polarized state of the incident light.

Figure 39:
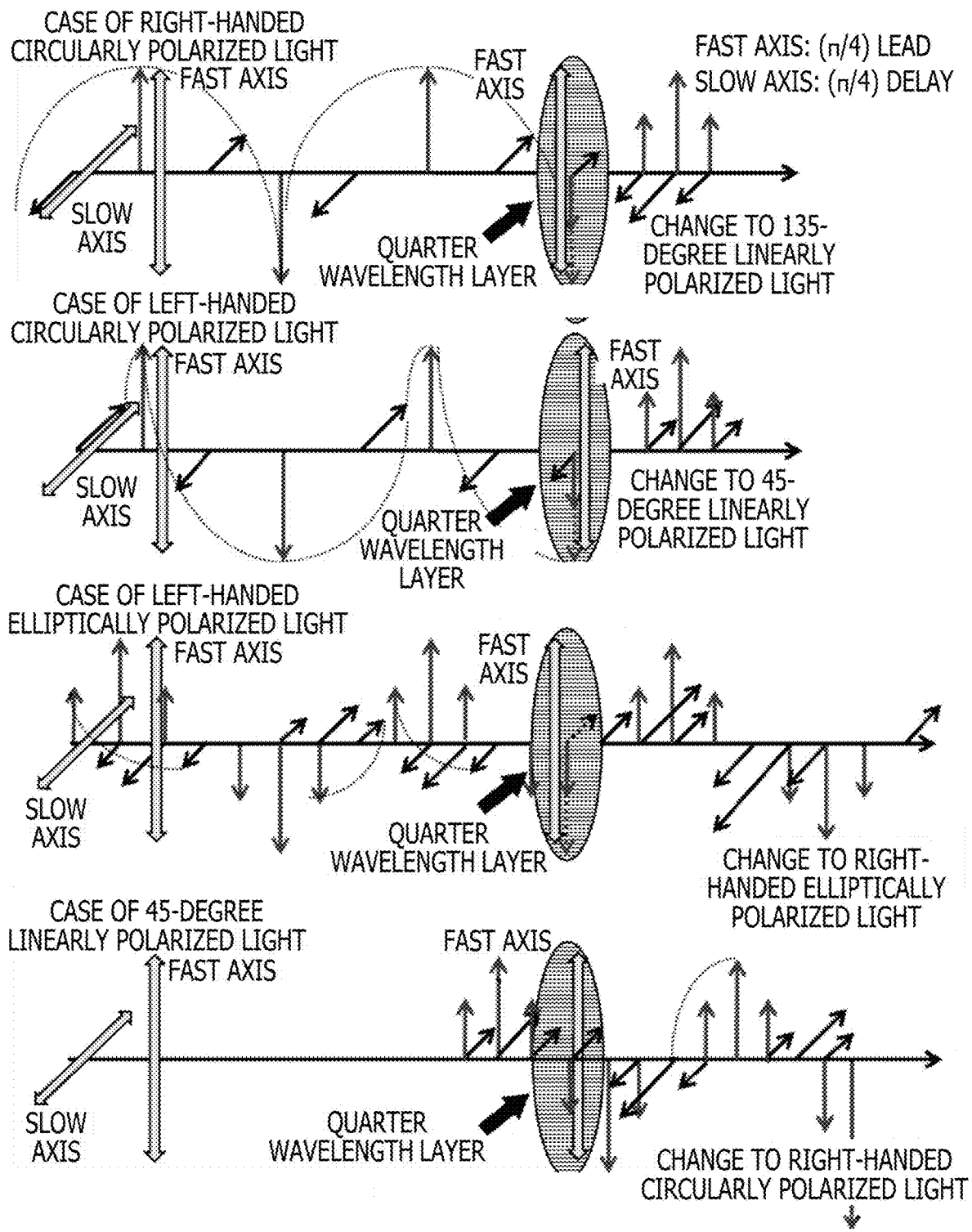
FIG. 39 is a diagram for explaining behaviors of light entering the light receiving device of the present disclosure in various polarized states.

FIG. 39 depicts behaviors of light entering the light receiving device of the present disclosure in various polarized states. A phase of light having entered the quarter wavelength layer in a right-handed circularly polarized state has a phase lead of (π/4) in a fast axis direction and a phase delay of (π/4) in a slow axis direction. As a result, the polarized state changes to a 135-degree linearly polarized state. A polarized state of light having entered the quarter wavelength layer in a left-handed circularly polarized state changes to a 45-degree linearly polarized state. In addition, a polarized state of light having entered the quarter wavelength layer in a left-handed elliptically polarized state changes to a right-handed elliptically polarized state, while a polarized state of light having entered the quarter wavelength layer in a right-handed elliptically polarized state changes to a left-handed elliptically polarized state. A polarized state of light having entered the quarter wavelength layer in a 45-degree linearly polarized state changes to a right-handed circularly polarized state.

Table 1 presented below represents an intensity relation between signals obtained by the first photoelectric conversion element 11₁ (α=0 degrees) and the second photoelectric conversion element 11₂ (α=45 degrees) in cases where a polarized state of light having entered the photoelectric conversion element is a left-handed circularly polarized state, a left-handed elliptically polarized state, a linearly polarized state, a right-handed elliptically polarized state, and a right-handed circularly polarized state. Note that intensity of each signal decreases in an order of "1," "2," "3," "4," and "5" in the table. A ratio of intensity to that of an incident light amount is ideally expressed in the following manner.

Specifically, "1" in the table ranges from 40% inclusive to 50% inclusive, "2" in the table ranges from 30% inclusive to less than 40%, "3" in the table ranges from 20% inclusive to less than 30%, "4" in the table ranges from 10% inclusive to less than 20%, and "5" in the table ranges from 0% inclusive to less than 10%. Note that a light amount loss produced by the wire grid polarizer is set to 50% of the incident light amount.

As presented in Table 1, for example, the left-handed circularly polarized state, the left-handed elliptically polarized state, the right-handed elliptically polarized state, the right-handed circularly polarized state, or any linearly polarized state as the polarized state of the incident light entering the photoelectric conversion element can be determined by examining outputs from the first photoelectric conversion element 11₁ and the second photoelectric conversion element 11₂.

TABLE 1

| | PHOTOELECTRIC CONVERSION ELEMENT UNIT | |
|---|---|---|
| | FIRST PHOTOELECTRIC CONVERSION ELEMENT | SECOND PHOTOELECTRIC CONVERSION ELEMENT |
| | POLARIZATION DIRECTION (α°) | |
| | 0° | 45° |
| POLARIZED STATE OF INCIDENT LIGHT | | |
| LEFT-HANDED CIRCULARLY POLARIZED LIGHT | 3 | 1 |
| LEFT-HANDED ELLIPTICALLY POLARIZED LIGHT | 3 | 2 |
| LINEARLY POLARIZED LIGHT | | |
| 0° | 1 | 5 |
| 90° | 5 | 5 |
| RIGHT-HANDED ELLIPTICALLY POLARIZED LIGHT | 3 | 4 |
| RIGHT-HANDED CIRCULARLY POLARIZED LIGHT | 3 | 5 |

According to the light receiving device of Embodiment 1, the photoelectric conversion section 21 having a known configuration and a known structure is provided within a silicon semiconductor substrate 31 by a known method. The photoelectric conversion section 21 is covered with lower layer and interlayer insulation layers 33. A base insulation layer 34 is formed on the lower layer and interlayer insulation layers 33. The wire grid polarizer 50 is provided on the base insulation layer 34. The wire grid polarizer 50 and the base insulation layer 34 are covered with a flattening film 35. The quarter wavelength layer 60 is formed on the flattening film 35. An upper layer and interlayer insulation layer 36 is formed on the quarter wavelength layer 60 and the flattening film 35. An on-chip microlens 81 is disposed on the upper layer and interlayer insulation layer 36. While the five lower layer and interlayer insulation layers 33 and four wiring layers 32 are presented in the depicted example, the number of the respective layers is not limited to these numbers. The number of the lower layer and interlayer insulation layers 33 and the wiring layers 32 may be any number.

Figure 9A:
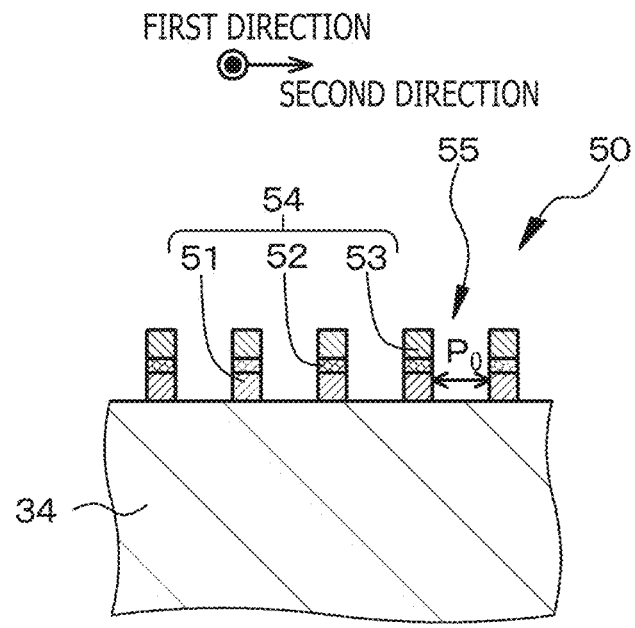
FIGS. 9A and 9B are schematic partial cross-sectional diagrams of the wire grid polarizer.

As depicted in FIG. 9A, the wire grid polarizer 50 has a line and space structure. A line portion 54 of the wire grid polarizer 50 includes a laminated structure body (first laminated structure body) which includes a lamination of a light reflection layer 51 made of a first conductive material (specifically, aluminum (Al)), an insulation film 52 made of SiO$_2$, and a light absorption layer 53 made of a second conductive material (specifically, tungsten (W)) disposed in this order from the side (photoelectric conversion section side in Embodiment 1) opposite to the light entrance side. The insulation film 52 is formed on an entire top surface of the light reflection layer 51, while the light absorption layer 53 is formed on an entire top surface of the insulation film 52. Specifically, the light reflection layer 51 is made of aluminum (Al) having a thickness of 150 nm, the insulation film 52 is made of SiO$_2$ having a thickness of 25 or 50 nm, and the light absorption layer 53 is made of tungsten (W) having a thickness of 25 nm. The light reflection layer 51 functions as a polarizer and is configured to attenuate a polarized wave having an electric field component in a direction parallel to an extension direction of the light reflection layer 51 (first direction) and to transmit a polarized wave having an electric field component in a direction perpendicular to the extension direction of the light reflection layer 51 (second direction) in the light having entered the wire grid polarizer 50. The first direction is a light absorption axis of the wire grid polarizer 50, while the second direction is a light transmission axis of the wire grid polarizer 50. A base film constituted by a laminated structure of Ti, TiN, or Ti/TiN is formed between the base insulation layer 34 and the light reflection layer 51. However, the base film is not depicted in the figure.

The light reflection layer 51, the insulation film 52, and the light absorption layer 53 are common parts for each of the photoelectric conversion elements 11. A frame portion 59 has a laminated structure body (second laminated structure body) constituted by the light reflection layer 51, the insulation film 52, and the light absorption layer 53 except that a space portion 55 is not provided. Specifically, as depicted in a schematic plan diagram of FIG. 2A, the frame portion 59 is provided to surround the wire grid polarizer 50. The frame portion 59 is connected to the line portion 54 of the wire grid polarizer 50. The frame portion 59 has a structure identical to the structure of the line portion 54 of the wire grid polarizer 50 as described above, and also functions as a light shielding portion.

Figure 40A:
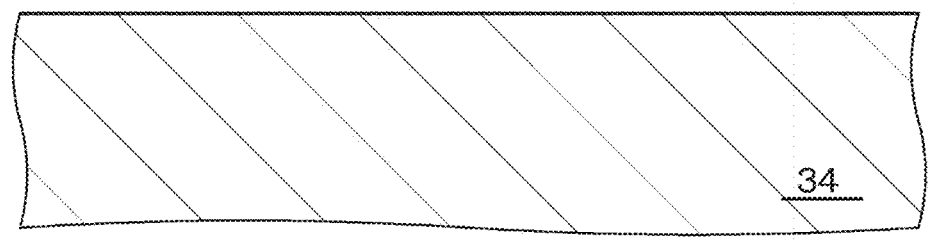
FIGS. 40A, 40B, 40C, and 40D are schematic partial end face diagrams of a base insulation layer and the like for explaining a manufacturing method of the wire grid polarizer constituting the light receiving device of the present disclosure.
Figure 40B:
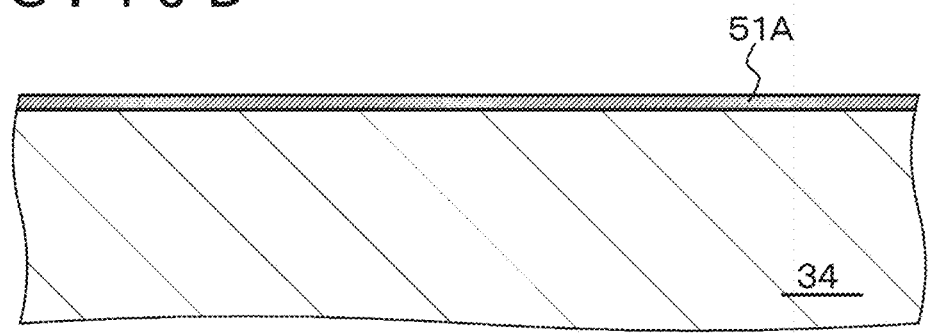
Figure 40C:
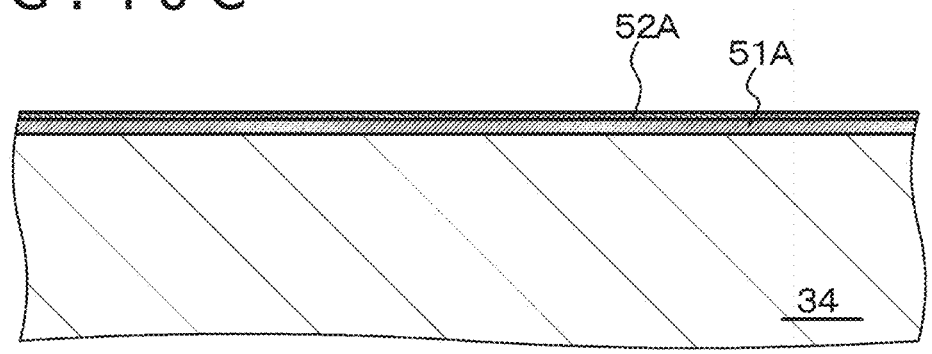
Figure 40D:
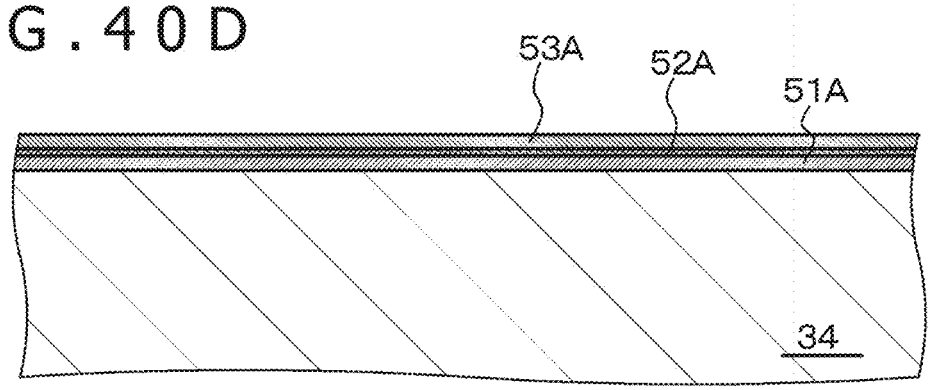

The wire grid polarizer 50 can be manufactured by the following method. Specifically, the base film constituted by a laminated structure of Ti, TiN, or Ti/TiN (not depicted) and a light reflection layer forming layer 51A made of the first conductive material (specifically, aluminum) are formed on the base insulation layer 34 by vacuum deposition (see FIGS. 40A and 40B). Subsequently, an insulation film forming layer 52A is formed on the light reflection layer forming layer 51A, and a light absorption layer forming layer 53A made of the second conductive material is formed on the insulation film forming layer 52A. Specifically, the insulation film forming layer 52A made of $SiO_2$ is formed on the light reflection layer forming layer 51A by CVD (see FIG. 40C). Thereafter, the light absorption layer forming layer 53A made of tungsten (W) is formed on the insulation film forming layer 52A by sputtering. In this manner, a structure depicted in FIG. 40D can be obtained.

Then, the light absorption layer forming layer 53A, the insulation film forming layer 52A, the light reflection layer forming layer 51A, and further the base film are patterned using a lithography technique and a dry etching technique. In this manner, the wire grid polarizer 50 having a line and space structure is obtained. This line and space structure includes plural line portions (laminated structure bodies) 54 including the light reflection layer 51, the insulation film 52, and the light absorption layer 53 that have a band shape and being arranged side by side with a space left between each other. Subsequently, the flattening film 35 covering the wire grid polarizer 50 is formed by CVD. The wire grid polarizer 50 is surrounded by the frame portion 59 including the light reflection layer 51, the insulation film 52, and the light absorption layer 53 (see FIG. 2B).

Figure 9B:
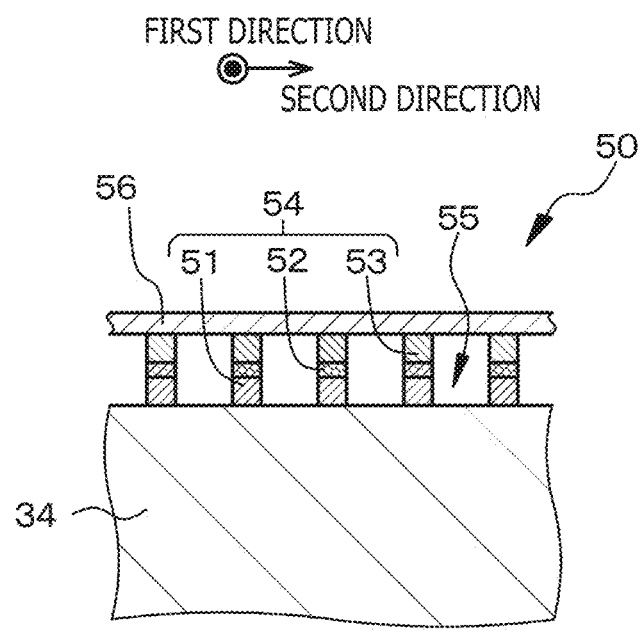

Adoptable as a modification of the wire grid polarizer 50 is a configuration which includes a protection film 56 formed on the wire grid polarizer 50 as depicted in a schematic partial end face diagram of FIG. 9B. The space portion 55 of the wire grid polarizer 50 is provided as a void in this modification. In this case, a part or the whole of the space portion 55 is filled with air. Specifically, according to Embodiment 1, the whole of the space portion 55 is filled with air.

Figure 10A:
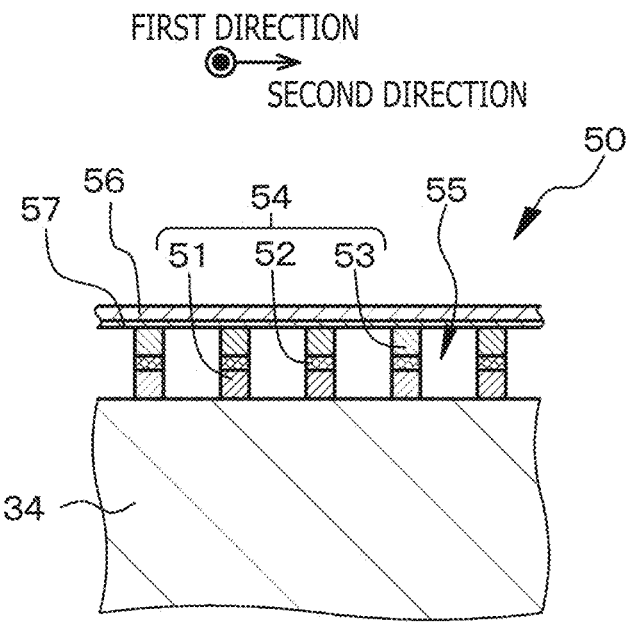
FIGS. 10A and 10B are schematic partial cross-sectional diagrams of the wire grid polarizer.
Figure 11:
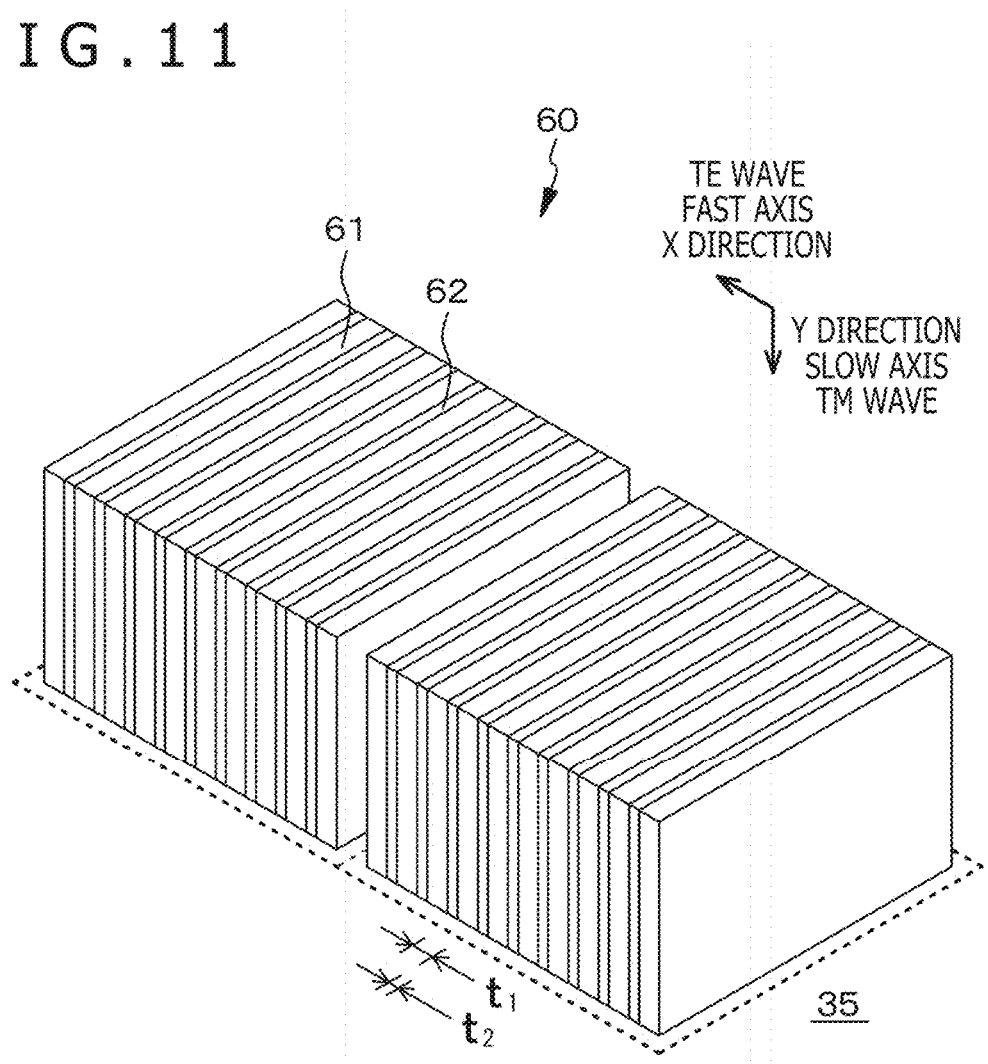
FIG. 11 is a schematic perspective diagram of the quarter wavelength layer constituting the photoelectric conversion element of the light receiving device of the present disclosure.

Further adoptable is a configuration which includes a second protection film 57 formed between the wire grid polarizer 50 and the protection film 56 as depicted in a schematic partial end face diagram of FIG. 10A. Assuming that a refractive index of a material constituting the protection film 56 is $n_1'$ and that a refractive index of a material constituting the second protection film 57 is $n_2'$, $n_1' > n_2'$ holds. For example, the protection film 56 is made of SiN ($n_1' = 2.0$), while the second protection film 57 is made of $SiO_2$ ($n_2' = 1.5$) here. The figure depicts a bottom surface (a surface facing the base insulation layer 34) of the second protection film 57 in a flat state. However, the bottom surface of the second protection film 57 may have a shape protruding toward the space portion 55. Alternatively, the bottom surface of the second protection film 57 may have a shape recessed toward the protection film 56, or a wedge-recessed shape.

The foregoing structure is obtained by producing the wire grid polarizer 50 having the line and space structure and then forming the second protection film 57 that is made of $SiO_2$ and has an average thickness ranging from 0.01 to 10 μm on the entire surface, by use of CVD. An area above the space portions 55 formed between the line portions 54 is closed by the second protection film 57. Subsequently, the protection film 56 that is made of SiN and has an average thickness ranging from 0.1 to 10 μm is formed on the second protection film 57, by use of CVD. A highly reliable photoelectric conversion section can be produced by using the protection film 56 made of SiN. However, SiN has a relatively high relative dielectric constant. Accordingly, reduction of an average refractive index $n_{ave}$ is sought by forming the second protection film 57 made of $SiO_2$.

In such a manner, the value of the average refractive index $n_{ave}$ can be reduced by providing a void in the space portion of the wire grid polarizer (specifically, filling the space portion with air). As a result, transmittance of the wire grid polarizer and an extinction ratio can improve. Moreover, a value of a formation pitch $P_0$ is allowed to increase. Accordingly, a production yield of the wire grid polarizer can improve. Further, a photoelectric conversion section and a light receiving device having high reliability are providable by forming a protection film on the wire grid polarizer. In addition, a stable and also homogenous and uniform wire grid polarizer can be produced by connecting the frame portion and the line portion of the wire grid polarizer and by equalizing the structure of the frame portion with the structure of line portion of the wire grid polarizer. Accordingly, a photoelectric conversion section and a light receiving device having high reliability are providable by solving a problem of separation of the wire grid polarizer at an outer peripheral portion corresponding to four corners of the photoelectric conversion section, a problem of performance deterioration of the wire grid polarizer itself caused by a structural difference between the outer peripheral portion of the wire grid polarizer and a center portion of the wire grid polarizer, and a problem of easy leakage of light having entered the outer peripheral portion of the wire grid polarizer into the adjacent photoelectric conversion section having a different polarization direction.

The wire grid polarizer may have a structure from which an insulation film is omitted, i.e., a configuration having a lamination of a light reflection layer (e.g., a layer made of aluminum) and a light absorption layer (e.g., a layer made of tungsten) in this order from the side opposite to the light entrance side. Alternatively, the wire grid polarizer may be constituted by one conductive light shielding material layer. Examples of the material constituting the conductive light shielding material layer include aluminum (Al), copper (Cu), gold (Au), silver (Ag), platinum (Pt), tungsten (W), and alloys containing these metals having a small complex refractive index in a wavelength range where the photoelectric conversion section has sensitivity.

Figure 10B:
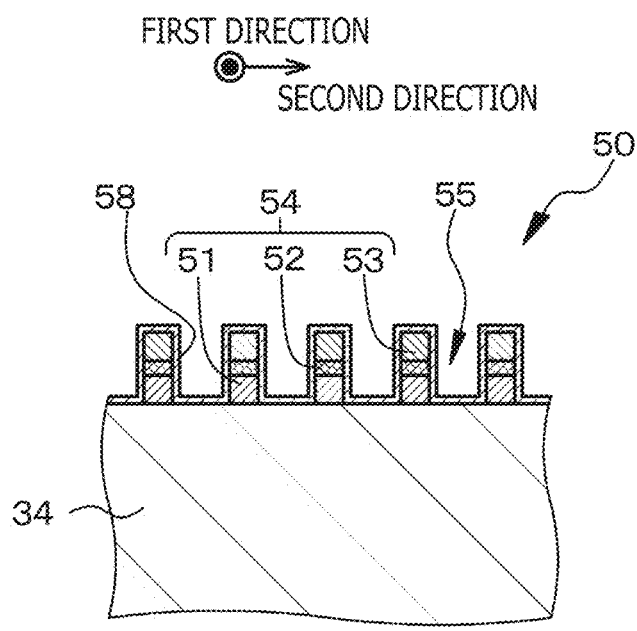

Depending on cases, for example, a third protection film 58 made of $SiO_2$ may be formed on a side surface of the line portion 54 facing the space portion 55 as depicted in a schematic partial end face diagram of the wire grid polarizer of FIG. 10B. Specifically, the space portion 55 is filled with air, and the third protection film 58 is further present in the space portion. The third protection film 58 is formed by HDP-CVD, for example. In this manner, the third protection film 58 having a further smaller thickness can be formed conformally on the side surface of the line portion 54.

Depending on cases, adoptable is a configuration where a part of the insulation film 52 is cut out to produce a cut-out portion 52a at which the light reflection layer 51 and the light absorption layer 53 contact each other as depicted in a schematic perspective diagram of a modification of the wire grid polarizer in FIG. 8.

The quarter wavelength layer 60 can be manufactured by the following method. Specifically, the first dielectric layer 61 is provided on the flattening film 35 by CVD. Then, the first dielectric layer 61 is patterned using a lithography technique and a dry etching technique. In this manner, a line and space structure which includes plural first dielectric layers 61 each having a band shape and being arranged side by side with a space left between each other. Subsequently, the second dielectric layer 62 is formed on the entire surface by use of ALD, and then the second dielectric layer 62 is flattened to obtain the quarter wavelength layer 60.

According to the photoelectric conversion element constituting the light receiving device of Embodiment 1, or the photoelectric conversion element of Embodiment 1, the quarter wavelength layer, the wire grid polarizer, and the photoelectric conversion section are disposed in this order from the light entrance side. In this case, a polarized state of light entering the photoelectric conversion element can change into a different polarized state, and the polarized state thus changed is efficiently detectable by the photoelectric conversion section via the wire grid polarizer. Accordingly, a light receiving device (e.g., small-sized sensor) for determining a circularly polarized state or an unpolarized state, or a left-handed circularly polarized state or a right-handed circularly polarized state as a polarized state, for example, is providable.

Figure 12:
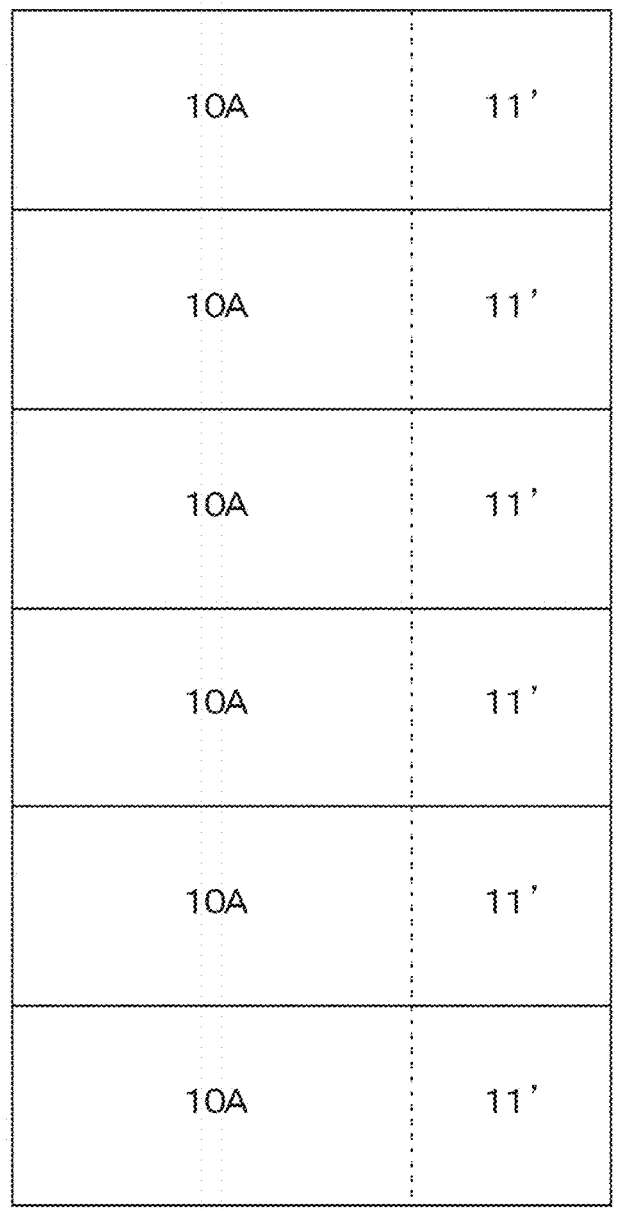
FIG. 12 is a conceptual plan diagram of photoelectric conversion element units constituting a modification of the light receiving device of Embodiment 1.
Figure 13:
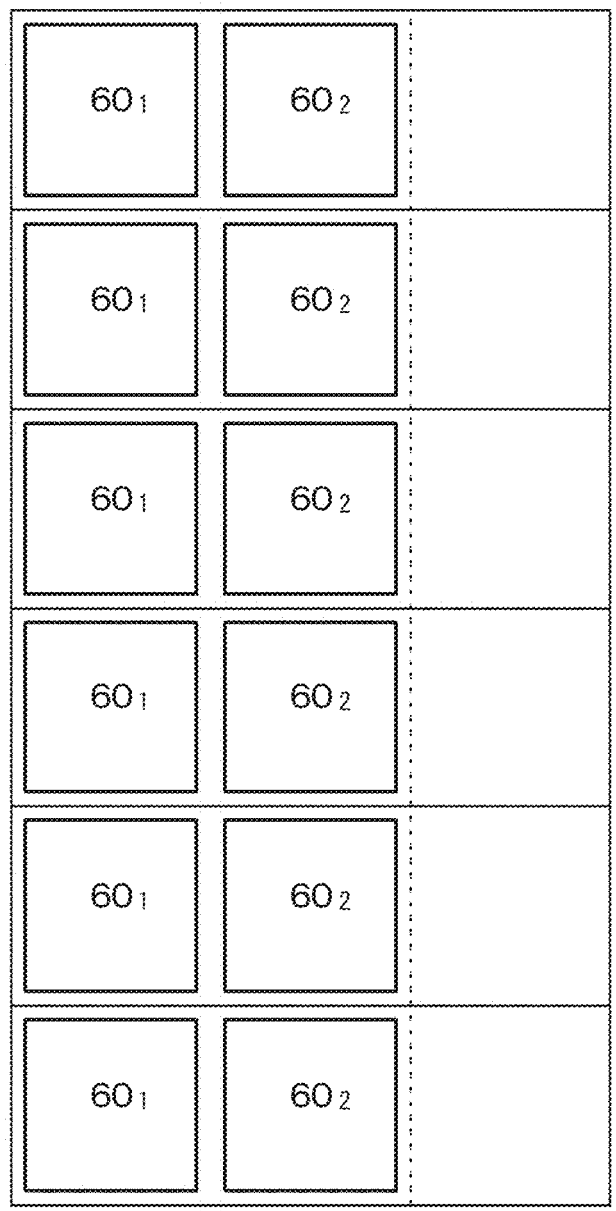
FIG. 13 is a conceptual plan diagram of fourth quarter wavelength layers constituting the photoelectric conversion elements of the modification of the light receiving device of Embodiment 1.
Figure 14:
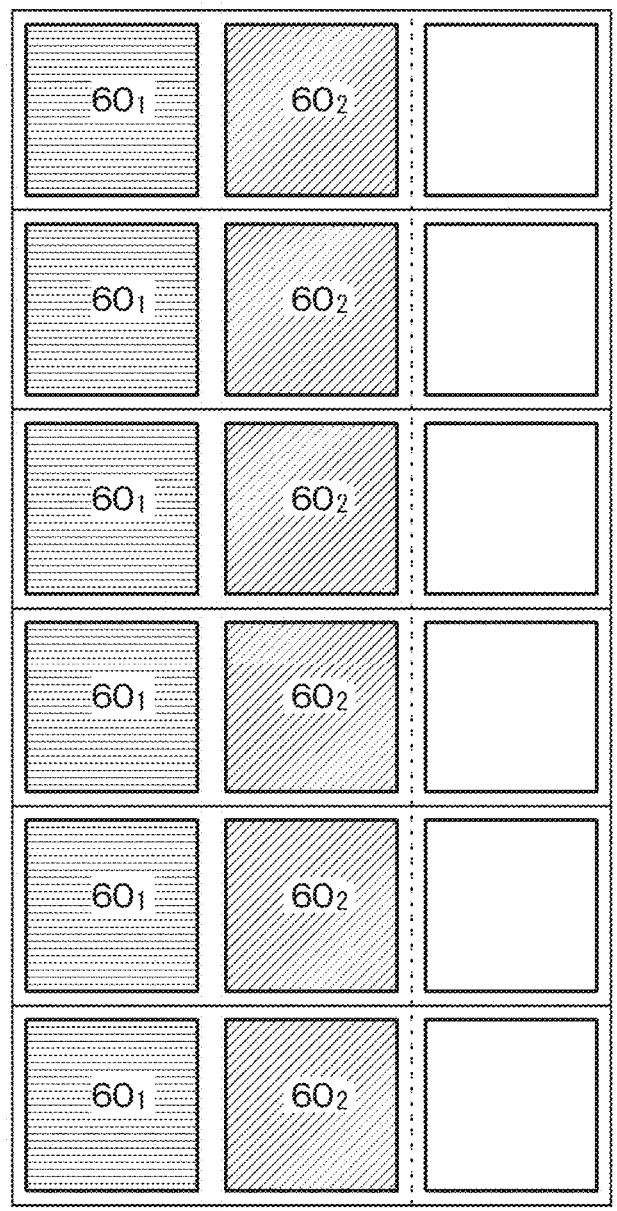
FIG. 14 is a conceptual plan diagram of wire grid polarizers constituting the photoelectric conversion elements of the modification of the light receiving device of Embodiment 1.
Figure 15:
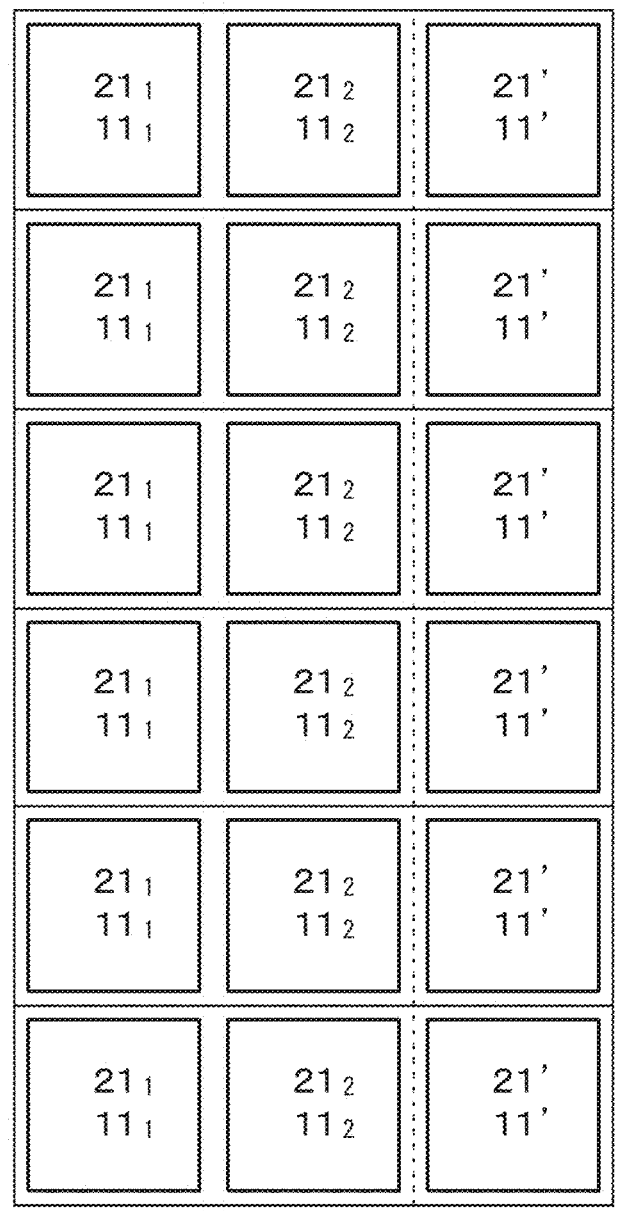
FIG. 15 is a conceptual plan diagram of photoelectric conversion sections constituting the photoelectric conversion elements and the photoelectric conversion elements of the modification of the light receiving device of Embodiment 1.

FIG. 12 is a conceptual plan diagram of photoelectric conversion element units of a modification of a light receiving device of Embodiment 1, FIG. 13 is a conceptual plan diagram of fourth quarter wavelength layers, FIG. 14 is a conceptual plan diagram of wire grid polarizers, and FIG. 15 is a conceptual plan diagram of photoelectric conversion sections and photoelectric conversion elements. Note that each of FIGS. 12, 13, 14, and 15 depicts 1×6 photoelectric conversion element units. According to the modification of the light receiving device of Embodiment 1, a photoelectric conversion element 11' is provided adjacent to each of the photoelectric conversion element units 10A. The photoelectric conversion element 11' includes the on-chip microlens 81 and a photoelectric conversion section 21' in this order from the light entrance side. According to this modification of the light receiving device of Embodiment 1, a conventional photoelectric conversion element is further provided. Accordingly, a light receiving device capable of simultaneously acquiring polarized light information in addition to performing ordinary sensing is providable.

Embodiment 2

Figure 16:
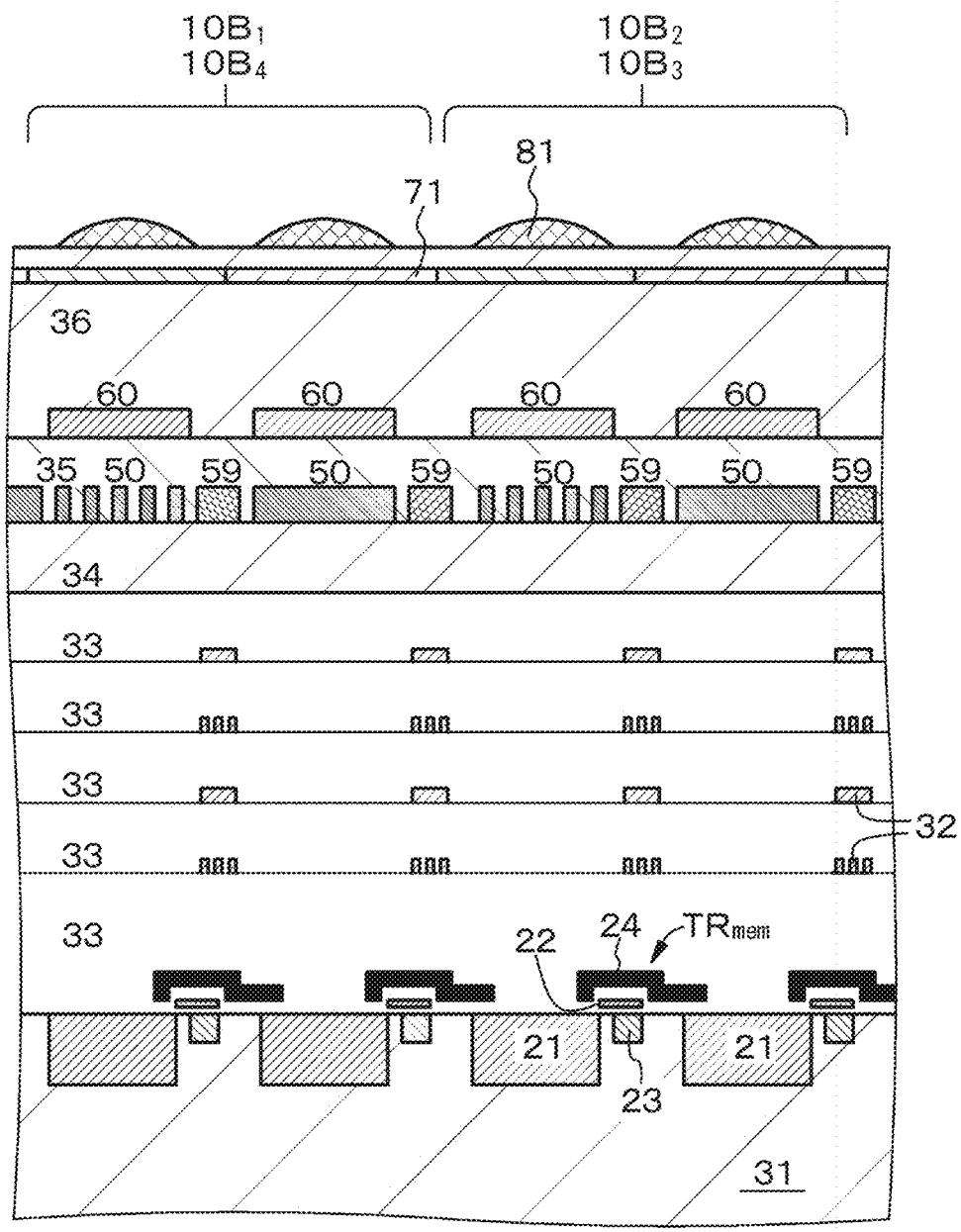
FIG. 16 is a schematic partial cross-sectional diagram of a light receiving device of Embodiment 2 taken along arrows A-A of FIG. 18A.
Figure 17:
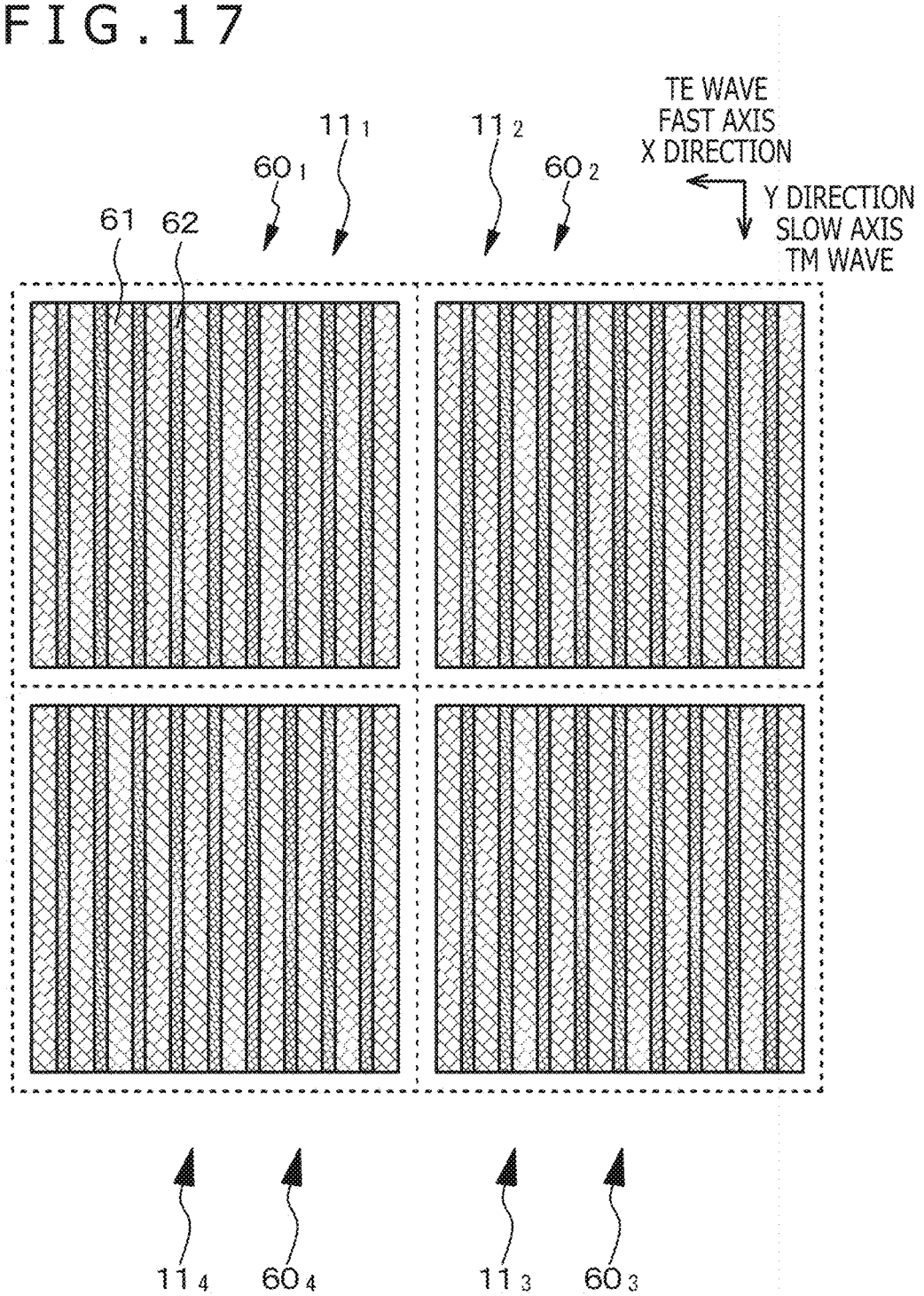
FIG. 17 is a schematic plan diagram of quarter wavelength layers constituting photoelectric conversion elements of the light receiving device of Embodiment 2.
Figure 18:
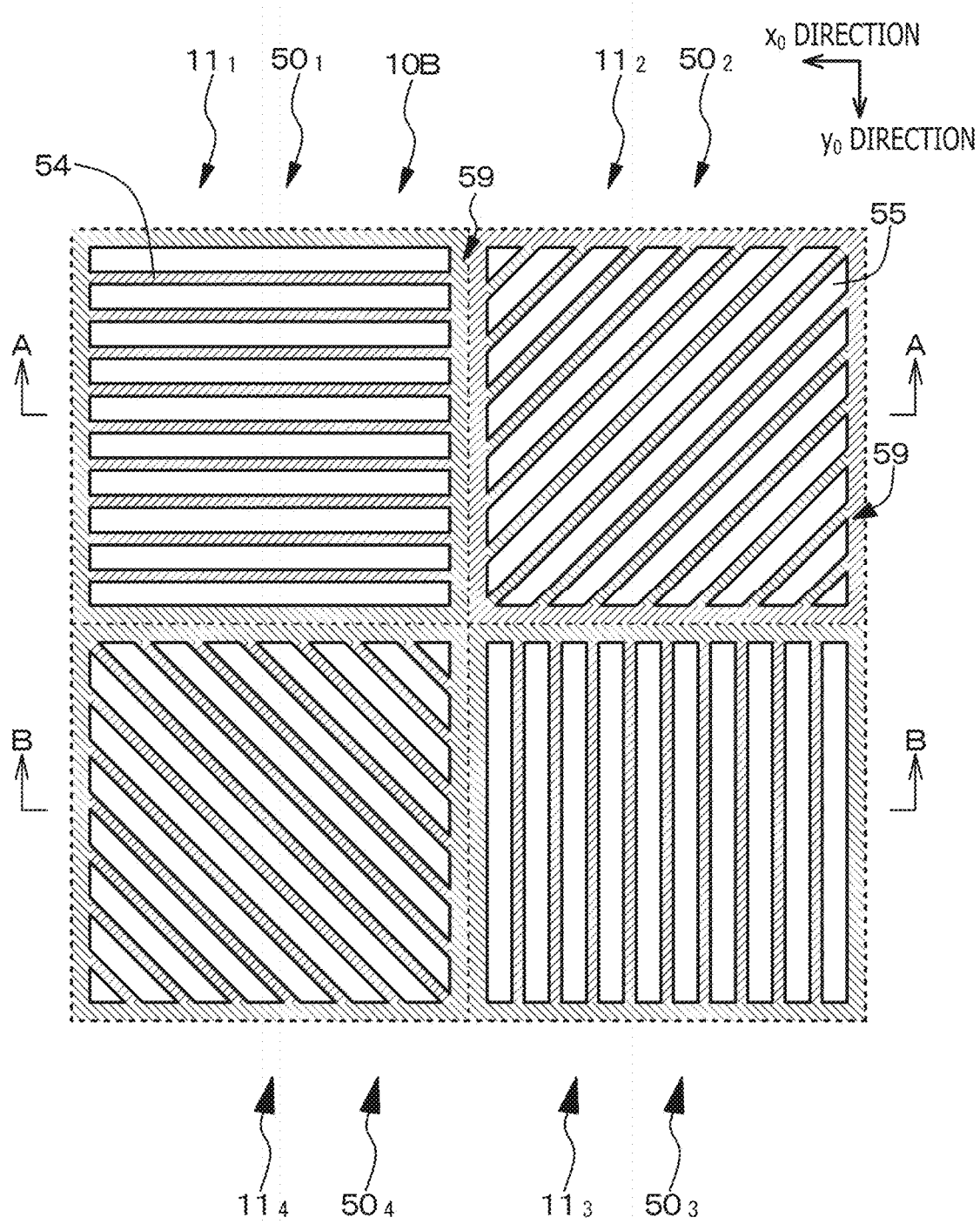
FIG. 18 is a schematic plan diagram of wire grid polarizers constituting the photoelectric conversion elements of the light receiving device of Embodiment 2.
Figure 19A:
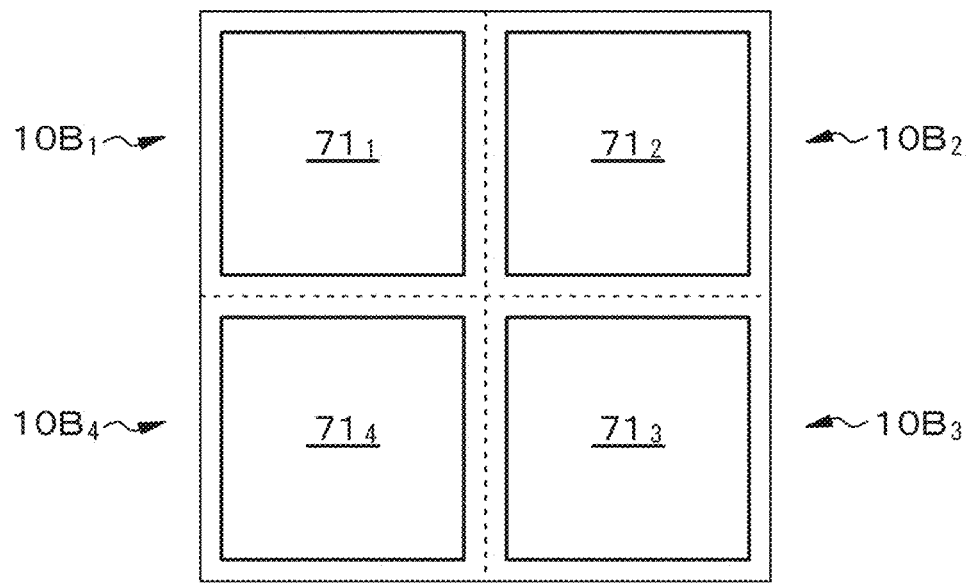
FIGS. 19A and 19B are conceptual plan diagrams of filter layers and the quarter wavelength layers constituting the photoelectric conversion elements of the light receiving device of Embodiment 2.
Figure 19B:
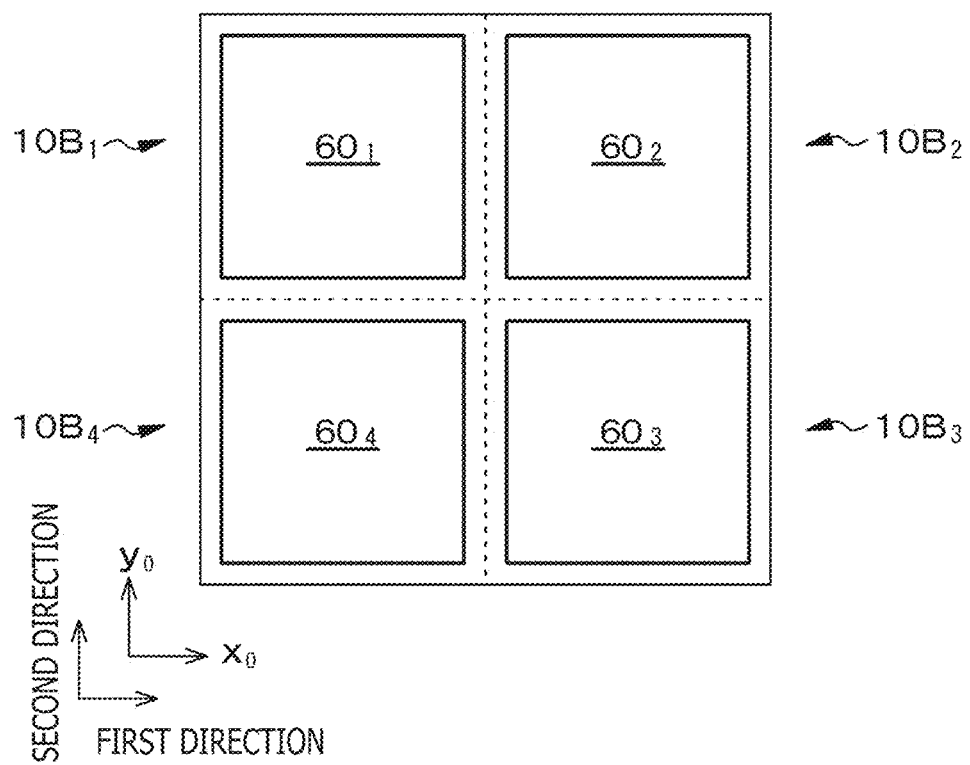
Figure 20A:
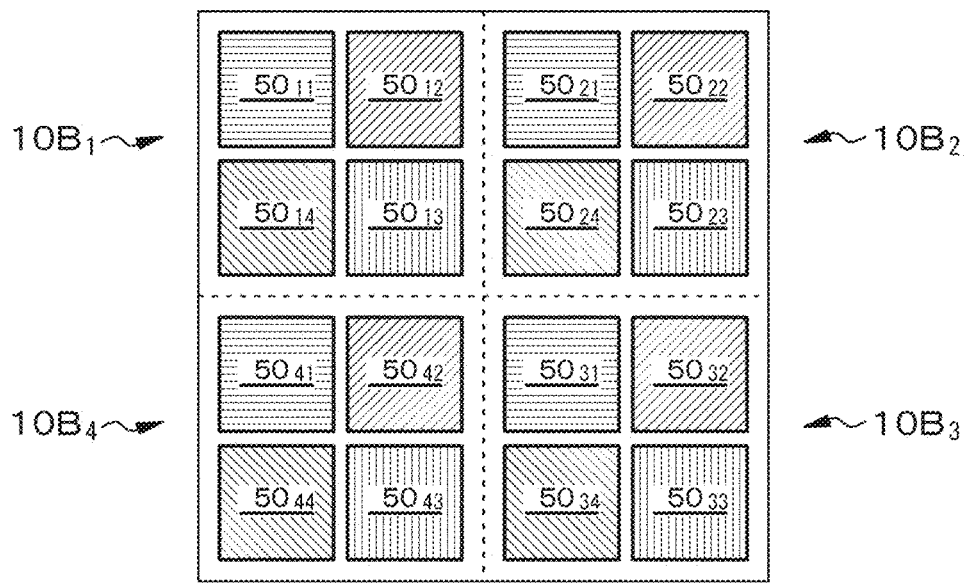
FIGS. 20A and 20B are conceptual plan diagrams of the wire grid polarizers and the photoelectric conversion sections constituting the photoelectric conversion elements of the light receiving device of Embodiment 2, respectively.
Figure 20B:
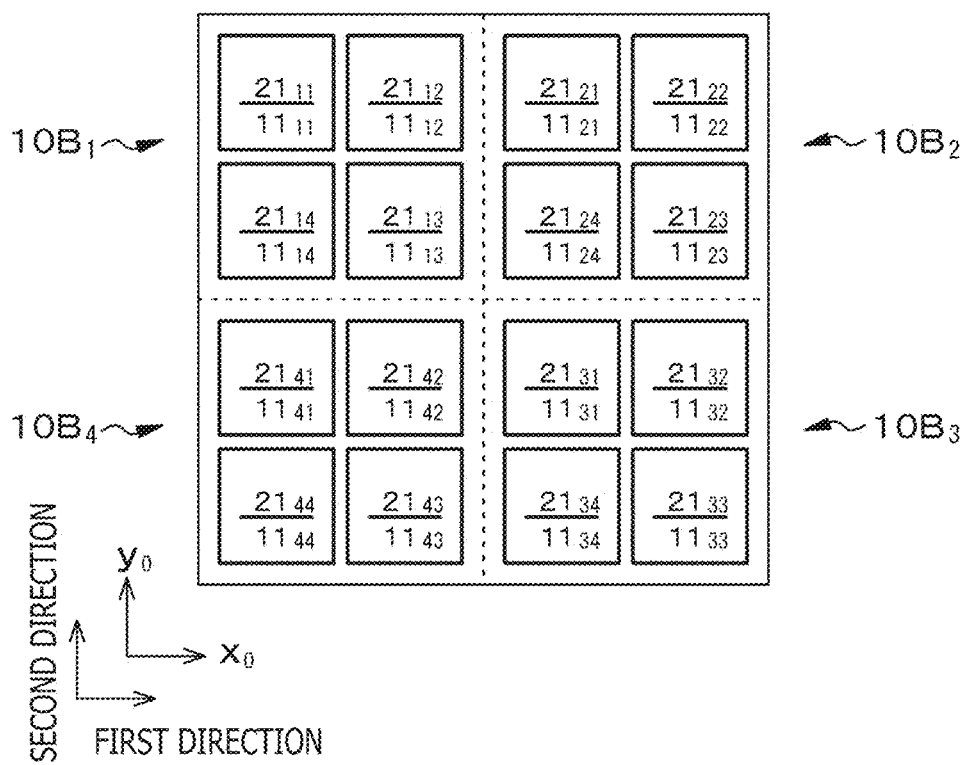
Figure 21:
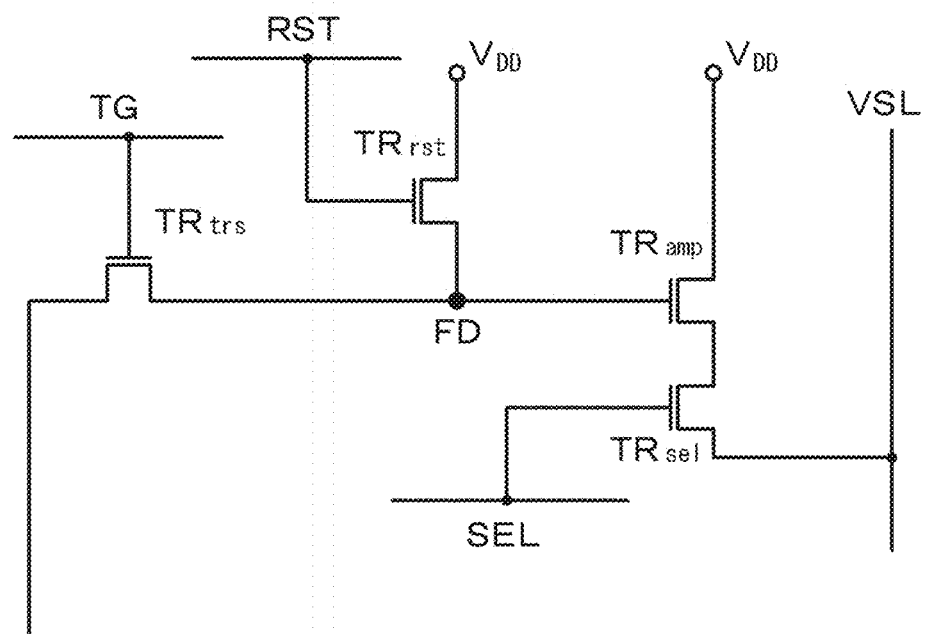
FIG. 21 is an equivalent circuit diagram of the photoelectric conversion section of the light receiving device (solid-state imaging device) of Embodiment 2.
Figure 21:
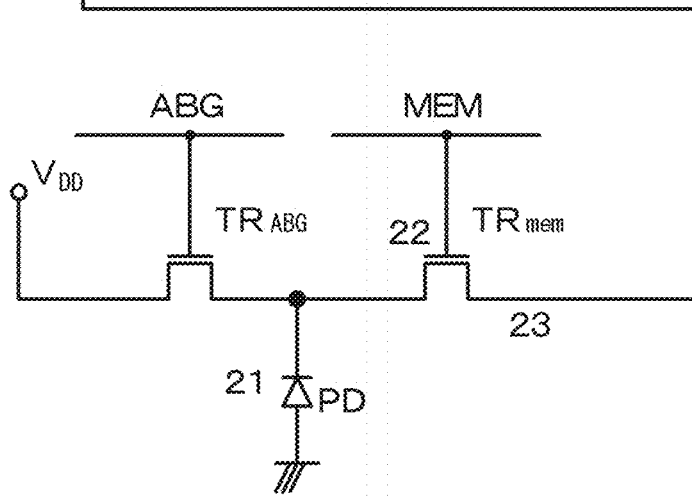

Embodiment 2 is a modification of Embodiment 1 and is related to a light receiving device having Configuration 2 of the present disclosure. In addition, Embodiment 2 is related to a light receiving device having Configuration 2-A of the present disclosure and a light receiving device having Configuration 2-A-2 of the present disclosure and is an example of a light receiving device of the present disclosure applied to a solid-state imaging device. FIG. 16 is a schematic partial cross-sectional diagram of the light receiving device of Embodiment 2 taken along arrows A-A of FIG. 18A. Moreover, FIG. 17 is a schematic plan diagram of quarter wavelength layers of photoelectric conversion elements constituting a photoelectric conversion element unit of the light receiving device of Embodiment 2, FIG. 18 is a schematic plan diagram of wire grid polarizers, FIG. 19A is a conceptual plan diagram of filter layers, FIG. 19B is a conceptual plan diagram of the quarter wavelength layers, FIG. 20A is a conceptual plan diagram of the wire grid polarizers, and FIG. 20B is a conceptual plan diagram of photoelectric conversion sections and the photoelectric conversion elements. Furthermore, FIG. 21 is an equivalent circuit diagram of the photoelectric conversion section of the light receiving device (solid-state imaging device) of Embodiment 2. Note that each of FIGS. 19A, 19B, 20A, and 20B depicts 2×2=4 photoelectric conversion element units.

According to the light receiving device of Embodiment 2, a photoelectric conversion element unit 10B includes four photoelectric conversion elements that has a 2×2 arrangement.

A polarization direction designated for transmission by a wire grid polarizer $50_1$ constituting a first photoelectric conversion element is α degrees.

A polarization direction designated for transmission by a wire grid polarizer $50_2$ constituting a second photoelectric conversion element is (α+45) degrees.

A polarization direction designated for transmission by a wire grid polarizer 503 constituting a third photoelectric conversion element is (α+90) degrees.

A polarization direction designated for transmission by a wire grid polarizer $50_4$ constituting a fourth photoelectric conversion element is (α+135) degrees.

Moreover, the light receiving device of Embodiment 2 includes plural photoelectric conversion element groups arranged two-dimensionally.

One of the photoelectric conversion element groups includes 2×2 arranged four photoelectric conversion element units $10B_1$, $10B_2$, $10B_3$, and $10B_4$.

The first photoelectric conversion element unit $10B_1$ includes a first filter layer $71_1$ that transmits light in a first wavelength range.

The second photoelectric conversion element unit $10B_2$ includes a second filter layer $71_2$ that transmits light in a second wavelength range.

The third photoelectric conversion element unit $10B_3$ includes a third filter layer $71_3$ that transmits light in a third wavelength range.

The fourth photoelectric conversion element unit $10B_4$ includes a fourth filter layer $71_4$ that transmits light in a fourth wavelength range.

Specifically, for example, the one photoelectric conversion element group includes the four photoelectric conversion element units $10B_1$, $10B_2$, $10B_3$, and $10B_4$ arranged in Bayer arrangement. For example, the light in the first wavelength range is red light, the light in each of the second wavelength range and the third wavelength range is green light, and the light in the fourth wavelength range is blue light.

Furthermore, the following configuration is adoptable.

A first quarter wavelength layer $60_1$ constituting the first photoelectric conversion element unit $10B_1$ gives a phase difference to the light in the first wavelength range.

A second quarter wavelength layer $60_2$ constituting the second photoelectric conversion element unit $10B_2$ gives a phase difference to the light in the second wavelength range.

A third quarter wavelength layer $60_3$ constituting the third photoelectric conversion element unit $10B_3$ gives a phase difference to the light in the third wavelength range.

A fourth quarter wavelength layer $60_4$ constituting the fourth photoelectric conversion element unit $10B_4$ gives a phase difference to the light in the fourth wavelength range.

In addition, according to the light receiving device of Embodiment 2, the first quarter wavelength layer $60_1$, the second quarter wavelength layer $60_2$, the third quarter wavelength layer $60_3$, and the fourth quarter wavelength layer $60_4$ are disposed in an identical layer.

Further, the quarter wavelength layer 60 includes first dielectric layers 61 made of a material having a refractive index $n_1$ and second dielectric layers 62 made of a material having a refractive index $n_2$ (provided that $n_1 > n_2$). The first and second dielectric layers 61 and 62 are alternately disposed side by side.

Thicknesses ($t_{11}$, $t_{12}$) of the first dielectric layer 61 and the second dielectric layer 62 constituting the first quarter wavelength layer $60_1$, thicknesses ($t_{21}$, $t_{22}$) of the first dielectric layer 61 and the second dielectric layer 62 constituting the second quarter wavelength layer $60_2$, thicknesses ($t_{31}$, $t_{32}$) of the first dielectric layer 61 and the second dielectric layer 62 constituting the third quarter wavelength layer $60_3$, and thicknesses ($t_{41}$, $t_{42}$) of the first dielectric layer 61 and the second dielectric layer 62 constituting the fourth quarter wavelength layer $60_4$ are set such that the thicknesses of the respective first dielectric layers are different and that the thicknesses of the respective second dielectric layers are different. In other words, values of $t_{11}$, $t_{21}$, $t_{31}$, and $t_{41}$ are not equalized nor are values of $t_{12}$, $t_{22}$, $t_{32}$, and $t_{42}$ equalized.

The first quarter wavelength layer $60_1$, the second quarter wavelength layer $60_2$, the third quarter wavelength layer $60_3$, and the fourth quarter wavelength layer $60_4$ have the same layer thickness ($H_1=H_2=H_3=H_4$).

However, as described above, the one photoelectric conversion element group according to Embodiment 2 includes the four photoelectric conversion element units $10B_1$, $10B_2$, $10B_3$, and $10B_4$ disposed in Bayer arrangement, for example. Accordingly, $t_{21}=t_{31}$ and $t_{22}=t_{32}$ are set.

According to Embodiment 2, $H_1=H_2=H_3=H_4=115$ nm is set.

Concerning the first quarter wavelength layer $60_1$, $t_{11}=210$ nm, $t_{12}=90$ nm, $f=210/(210+90)=0.7$, $n_{TE}=1.86$, and $n_{TM}=0.56$ are set.

Concerning a wavelength $\lambda_1$ of light which passes through the first quarter wavelength layer $60_1$ and obtains a phase difference, $\lambda_1=600$ nm is set.

Moreover, concerning the second quarter wavelength layer $60_2$ and the third quarter wavelength layer $60_3$, $t_{21}=t_{31}=150$ nm, $t_{22}=t_{32}=150$ nm, $f=150/(150+150)=0.5$, $n_{TE}=1.77$, and $n_{TM}=0.59$ are set.

Concerning a wavelength $\lambda_{2-3}$ of light which passes through the second quarter wavelength layer $60_2$ and the third quarter wavelength layer $60_3$ and obtains a phase difference, $\lambda_{2-3}=550$ nm is set.

Further, concerning the fourth quarter wavelength layer $60_4$, $t_{41}=60$ nm, $t_{42}=240$ nm, $f=60/(60+240)=0.2$, $n_{TE}=1.61$, and $n_{TM}=0.64$ are set.

Concerning a wavelength $\lambda_4$ of light which passes through the fourth quarter wavelength layer $60_4$ and obtains a phase difference, $\lambda_4=450$ nm.

is set.

The first photoelectric conversion element unit $10B_1$ includes four first photoelectric conversion elements $11_{11}$, $11_{12}$, $11_{13}$, and $11_{14}$.

In addition, the first photoelectric conversion element $11_{11}$ includes the on-chip microlens 81, the first filter layer $71_1$, the first quarter wavelength layer $60_1$, a wire grid polarizer $50_{11}$, and a photoelectric conversion section $21_{11}$ disposed in this order from the light entrance side. Moreover, the second photoelectric conversion element $11_{12}$ includes the on-chip microlens 81, the first filter layer $71_1$, the first quarter wavelength layer $60_1$, a wire grid polarizer $50_{12}$, and a photoelectric conversion section $21_{12}$ disposed in this order from the light entrance side. Further, the third photoelectric conversion element $11_{13}$ includes the on-chip microlens 81, the first filter layer $71_1$, the first quarter wavelength layer $60_1$, a wire grid polarizer $50_{13}$, and a photoelectric conversion section $21_{13}$ disposed in this order from the light entrance side. Besides, the fourth photoelectric conversion element $11_{14}$ includes the on-chip microlens 81, the first filter layer $71_1$, the first quarter wavelength layer $60_1$, a wire grid polarizer $50_{14}$, and a photoelectric conversion section $21_{14}$ disposed in this order from the light entrance side.

The second photoelectric conversion element unit $10B_2$ includes four first photoelectric conversion elements $11_{21}$, $11_{22}$, $11_{23}$, and $11_{24}$.

The second photoelectric conversion element $11_{21}$ includes the on-chip microlens 81, the second filter layer $71_2$, the second quarter wavelength layer $60_2$, a wire grid polarizer $50_{21}$, and a photoelectric conversion section $21_{21}$ disposed in this order from the light entrance side. Moreover, the second photoelectric conversion element $11_{22}$ includes the on-chip microlens 81, the second filter layer $71_2$, the second quarter wavelength layer $60_2$, a wire grid polarizer $50_{22}$, and a photoelectric conversion section $21_{22}$ disposed in this order from the light entrance side. Further, the third photoelectric conversion element $11_{23}$ includes the on-chip microlens 81, the second filter layer $71_2$, the second quarter wavelength layer $60_2$, a wire grid polarizer $50_{23}$, and a photoelectric conversion section $21_{23}$ disposed in this order from the light entrance side. Besides, the fourth photoelectric conversion element $11_{24}$ includes the on-chip microlens 81, the second filter layer $71_2$, the second quarter wavelength layer $60_2$, a wire grid polarizer $50_{24}$, and a photoelectric conversion section $21_{24}$ disposed in this order from the light entrance side.

The third photoelectric conversion element unit $10B_3$ includes four first photoelectric conversion elements $11_{31}$, $11_{32}$, $11_{33}$, and $113_4$.

The third photoelectric conversion element $11_{31}$ includes the on-chip microlens 81, the third filter layer $71_3$, the third quarter wavelength layer $60_3$, a wire grid polarizer $50_{31}$, and a photoelectric conversion section $21_{31}$ disposed in this order from the light entrance side. Moreover, the third photoelectric conversion element $11_{32}$ includes the on-chip microlens 81, the third filter layer $71_3$, the third quarter wavelength layer $60_3$, a wire grid polarizer $50_{32}$, and a photoelectric conversion section $21_{32}$ disposed in this order from the light entrance side. Further, the third photoelectric conversion element $11_{33}$ includes the on-chip microlens 81, the third filter layer $71_3$, the third quarter wavelength layer $60_3$, a wire grid polarizer $50_{33}$, and a photoelectric conversion section $21_{33}$ disposed in this order from the light entrance side. Besides, the fourth photoelectric conversion element $11_{34}$ includes the on-chip microlens 81, the third filter layer $71_3$, the third quarter wavelength layer $60_3$, a wire grid polarizer $50_{34}$, and a photoelectric conversion section $21_{34}$ disposed in this order from the light entrance side.

The fourth photoelectric conversion element unit $10B_4$ includes four first photoelectric conversion elements $11_{41}$, $11_{42}$, $11_{43}$, and $11_{44}$.

The fourth photoelectric conversion element $11_{41}$ includes the on-chip microlens 81, the fourth filter layer $71_4$, the fourth quarter wavelength layer $60_4$, a wire grid polarizer $50_{41}$, and a photoelectric conversion section $21_{41}$ disposed in this order from the light entrance side. Moreover, the fourth photoelectric conversion element $11_{42}$ includes the on-chip microlens 81, the fourth filter layer $71_4$, the fourth quarter wavelength layer $60_4$, a wire grid polarizer $50_{42}$, and a photoelectric conversion section $21_{42}$ disposed in this order from the light entrance side. Further, the fourth photoelectric conversion element $11_{43}$ includes the on-chip microlens 81, the fourth filter layer $71_4$, the fourth quarter wavelength layer $60_4$, a wire grid polarizer $50_{43}$, and a photoelectric conversion section $21_{43}$ disposed in this order from the light entrance side. Besides, the fourth photoelectric conversion element $11_{44}$ includes the on-chip microlens 81, the fourth filter layer $71_4$, the fourth quarter wavelength layer $60_4$, a wire grid polarizer $50_{44}$, and a photoelectric conversion section $21_{44}$ disposed in this order from the light entrance side.

Table 2 presented below represents an intensity relation between signals obtained by the first photoelectric conversion element $11_1$ ($\alpha$=0 degrees), the second photoelectric conversion element $11_2$ ($\alpha$=45 degrees), the third photoelectric conversion element $11_3$ ($\alpha$=90 degrees), and the fourth photoelectric conversion element $11_4$ ($\alpha$=135 degrees) in cases where a polarized state of incident light entering the photoelectric conversion element is a left-handed circularly polarized state, a left-handed elliptically polarized state, a linearly polarized state, a right-handed elliptically polarized state, and a right-handed circularly polarized state.

As presented in Table 2, for example, the left-handed circularly polarized state, the left-handed elliptically polarized state, the right-handed elliptically polarized state, the right-handed circularly polarized state, or any linearly polarized state as the polarized state of the incident light entering the photoelectric conversion element can be determined by examining outputs from the first photoelectric conversion element, the second photoelectric conversion element, the third photoelectric conversion element, and the fourth photoelectric conversion element.

TABLE 2

| | PHOTOELECTRIC CONVERSION ELEMENT UNIT | | | |
|---|---|---|---|---|
| | FIRST PHOTOELECTRIC CONVERSION ELEMENT | SECOND PHOTOELECTRIC CONVERSION ELEMENT | THIRD PHOTOELECTRIC CONVERSION ELEMENT | FOURTH PHOTOELECTRIC CONVERSION ELEMENT |
| | POLARIZATION DIRECTION ($\alpha°$) | | | |
| | 0° | 45° | 90° | 135° |
| POLARIZED STATE OF INCIDENT LIGHT | | | | |
| LEFT-HANDED CIRCULARLY POLARIZED LIGHT | 3 | 1 | 3 | 5 |
| LEFT-HANDED ELLIPTICALLY POLARIZED LIGHT | 3 | 2 | 3 | 4 |
| LINEARLY POLARIZED LIGHT | | | | |
| 0° | 1 | 5 | 5 | 5 |
| 90° | 5 | 5 | 1 | 5 |
| RIGHT-HANDED ELLIPTICALLY POLARIZED LIGHT | 3 | 4 | 3 | 2 |
| RIGHT-HANDED CIRCULARLY POLARIZED LIGHT | 3 | 5 | 3 | 1 |

The photoelectric conversion section 21 having a known configuration and a known structure is formed by a known method within a silicon semiconductor substrate 31. In addition, the semiconductor substrate 31 includes a memory section $TR_{mem}$ that is connected to the photoelectric conversion section 21 and is configured to temporarily store a charge generated by the photoelectric conversion section 21.

The memory section $TR_{mem}$ includes the photoelectric conversion section 21, a gate portion 22, a channel forming region, and a high-concentration impurity region 23. The gate portion 22 is connected to a memory selection line MEM. In addition, the high-concentration impurity region 23 formed by a known method is disposed within the silicon semiconductor substrate 31 at a position away from the photoelectric conversion section 21. A light shielding film 24 is formed above the high-concentration impurity region 23. Accordingly, the high-concentration impurity region 23 is covered with the light shielding film 24. In this manner, entrance of light into the high-concentration impurity region 23 is prevented. What is generally called a global shutter function is easily achievable by providing the memory section $TR_{mem}$ which temporarily stores a charge. Examples of the material forming the light shielding film 24 include chromium (Cr), copper (Cu), aluminum (Al), tungsten (W), and resin not transmitting light (e.g., polyimide resin).

A transfer transistor $TR_{trs}$ depicted only in FIG. 21 includes a gate portion connected to a transfer gate line TG, a channel forming region, one source/drain region connected to the high-concentration impurity region 23 (or having a region shared with the high-concentration impurity region 23), and the other source/drain region constituting a floating diffusion layer FD.

A reset transistor $TR_{rst}$ depicted only in FIG. 21 includes a gate portion, a channel forming region, and source/drain regions. The gate portion of the reset transistor $TR_{rst}$ is connected to a reset line RST. The one source/drain region of the reset transistor $TR_{rst}$ is connected to a power source VDD, while the other source/drain region also functions as the floating diffusion layer FD.

An amplification transistor $TR_{amp}$ depicted only in FIG. 21 includes a gate portion, a channel forming region, and source/drain regions. The gate portion is connected to the other source/drain region (floating diffusion layer FD) of the reset transistor $TR_{rst}$ via a wiring layer. In addition, the one source/drain region is connected to the power source $V_{DD}$.

A selection transistor $TR_{sel}$ depicted only in FIG. 21 includes a gate portion, a channel forming region, and source/drain regions. The gate portion is connected to a selection line SEL. In addition, the one source/drain region has a region shared with the other source/drain constituting the amplification transistor $TR_{amp}$, while the other source/drain region is connected to a signal line (data output line) VSL (117).

Moreover, the photoelectric conversion section 21 is connected to one source/drain region of a charge discharge control transistor $TR_{ABG}$. A gate portion of the charge discharge control transistor $TR_{ABG}$ is connected to a charge discharge control transistor control line ABG, while the other source/drain region is connected to the power source $V_{DD}$.

A series of operation such as charge accumulation, reset operation, and charge transfer performed by the photoelectric conversion section 21 is similar to a series of operation such as charge accumulation, reset operation, and charge transfer performed by a conventional photoelectric conversion section. Accordingly, detailed description of the operation is omitted.

The photoelectric conversion section 21, the memory section $TR_{mem}$, the transfer transistor $TR_{trs}$, the reset transistor $TR_{rst}$, the amplification transistor $TR_{amp}$, the selection transistor $TR_{sel}$, and the charge discharge control transistor $TR_{ABG}$ are covered with the lower layer and interlayer insulation layers 33.

Figure 41:
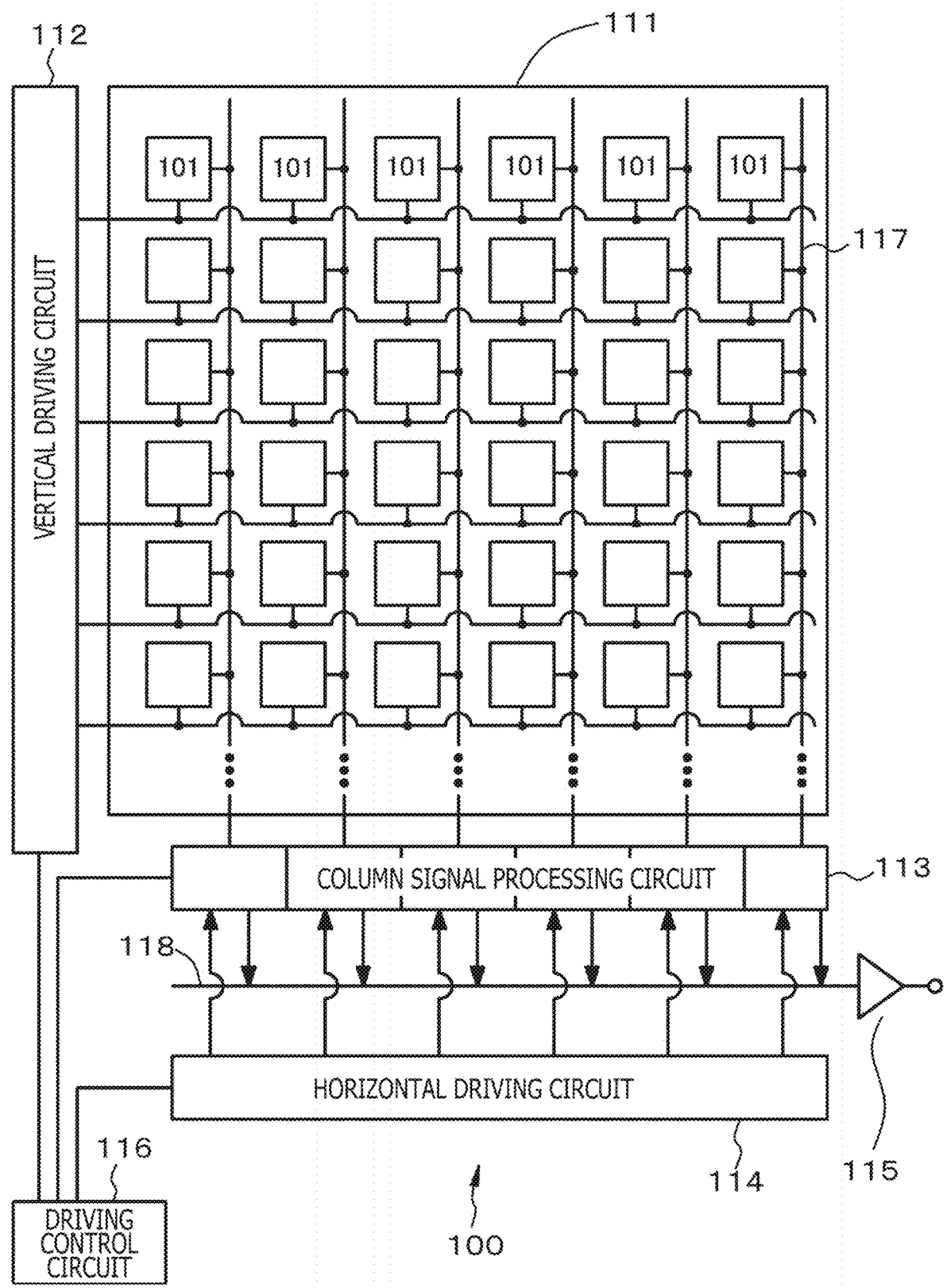
FIG. 41 is a conceptual diagram of a solid-state imaging device in a case where the light receiving device of the present disclosure is applied to the solid-state imaging device.

FIG. 41 is a conceptual diagram of a solid-state imaging device to which the light receiving device of Embodiment 2 is applied. A solid-state imaging device 100 of Embodiment 1 includes an imaging region (effective pixel region) 111 where photoelectric conversion sections 101 are arranged in a two-dimensional array and also includes a vertical driving circuit 112, column signal processing circuits 113, a horizontal driving circuit 114, an output circuit 115, and a driving control circuit 116 arranged in a peripheral region and configured to function as driving circuits (peripheral circuits) of the solid-state imaging device 100, and others. Needless to say, each of these circuits may be constituted by a known circuit, or by other circuit configurations (e.g., various circuits included in a conventional CCD imaging device or a conventional CMOS imaging device). In FIG. 41, a reference number "101" indicating the photoelectric conversion section 101 is given in only one row.

The driving control circuit 116 generates a clock signal and a control signal as a reference of operation of the vertical driving circuit 112, the column signal processing circuits 113, and the horizontal driving circuit 114 on the basis of a vertical synchronized signal, a horizontal synchronized signal, and a master clock. Subsequently, the clock signal and the control signal thus generated are input to the vertical driving circuit 112, the column signal processing circuits 113, and the horizontal driving circuit 114.

The vertical driving circuit 112 includes a shift register, for example, and selectively scans the respective photoelectric conversion sections 101 in the imaging region 111 in units of row sequentially in the vertical direction. Thereafter, a pixel signal (image signal) corresponding to a current (signal) generated according to a light amount received by each of the photoelectric conversion sections 101 is transmitted to the column signal processing circuit 113 via the signal line (data output line) 117 and VSL.

The column signal processing circuits 113 are provided for the photoelectric conversion sections 101 one for each column, for example, and are configured to perform signal processing for achieving noise removal and signal amplification for image signals output from one row of the photoelectric conversion sections 101 according to a signal received from a black reference pixel (not depicted but formed in a periphery of an effective pixel region) for each of the photoelectric conversion sections. A horizontal selection switch (not depicted) is provided in an output stage of each of the column signal processing circuits 133 and connected between the column signal processing circuit 113 and a horizontal signal line 118.

The horizontal driving circuit 114 includes a shift register, for example, and sequentially selects the respective column signal processing circuits 113 by sequentially outputting a horizontal scanning pulse, to output signals received from the respective column signal processing circuits 113 to the horizontal signal lines 118.

The output circuit 115 performs signal processing for signals sequentially supplied from the respective column signal processing circuits 113 via the horizontal signal lines 118, and outputs the processed signals.

The light receiving device of Embodiment 2 includes the quarter wavelength layer and the wire grid polarizer. Accordingly, the light receiving device (solid-state imaging device) is capable of acquiring polarized light information. In other words, the light receiving device (solid-state imaging device) is allowed to have a polarized light separation function for spatially separating polarized light information associated with incident light. Specifically, each of the photoelectric conversion elements (imaging elements) is capable of obtaining light intensity, polarized light component intensity, and a polarization direction. For example, a polarized light component can be emphasized or reduced, or respective polarized light components can be separated, by performing desired processing for a part of a captured image of the sky or window glass, a part of a captured image of a water surface, or the like. In this manner, improvement of image contrast and deletion of unnecessary information are achievable.

Figure 24:
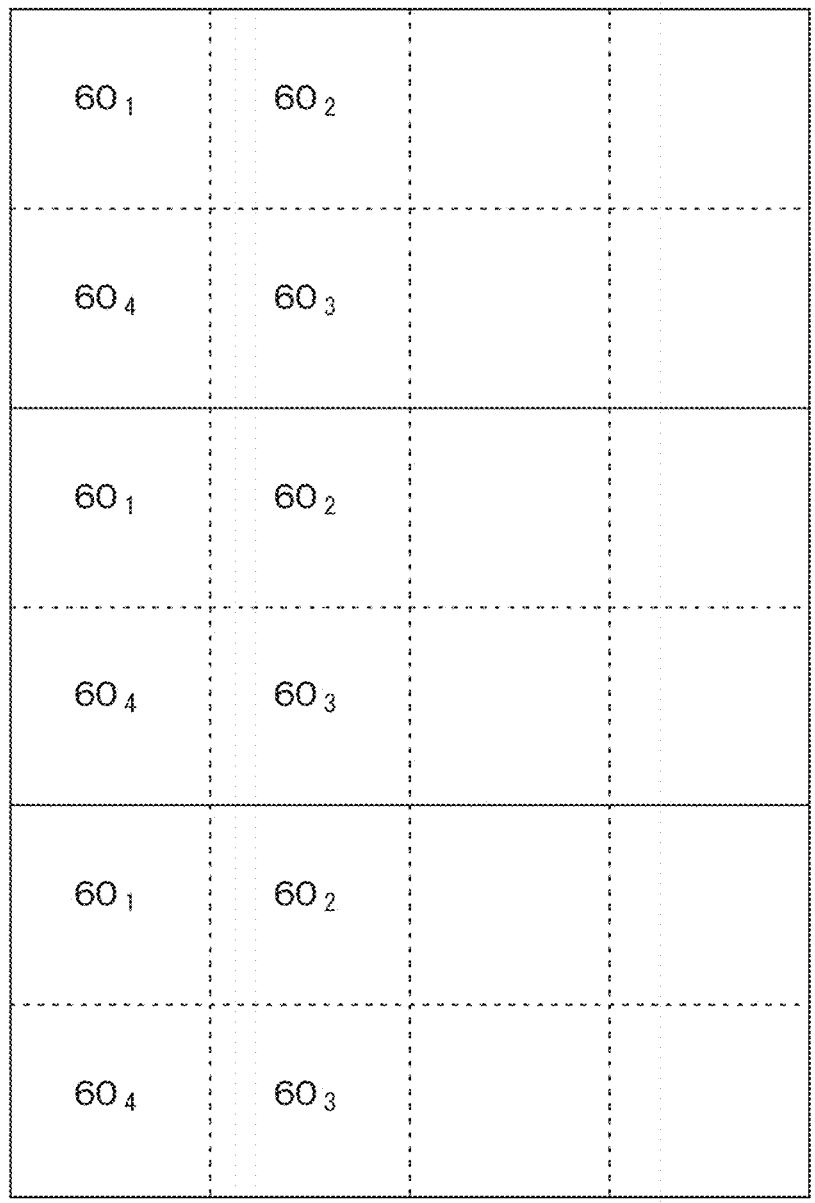
FIG. 24 is a conceptual plan diagram of fourth quarter wavelength layers constituting the photoelectric conversion elements of the modification of the light receiving device of Embodiment 2.
Figure 25:
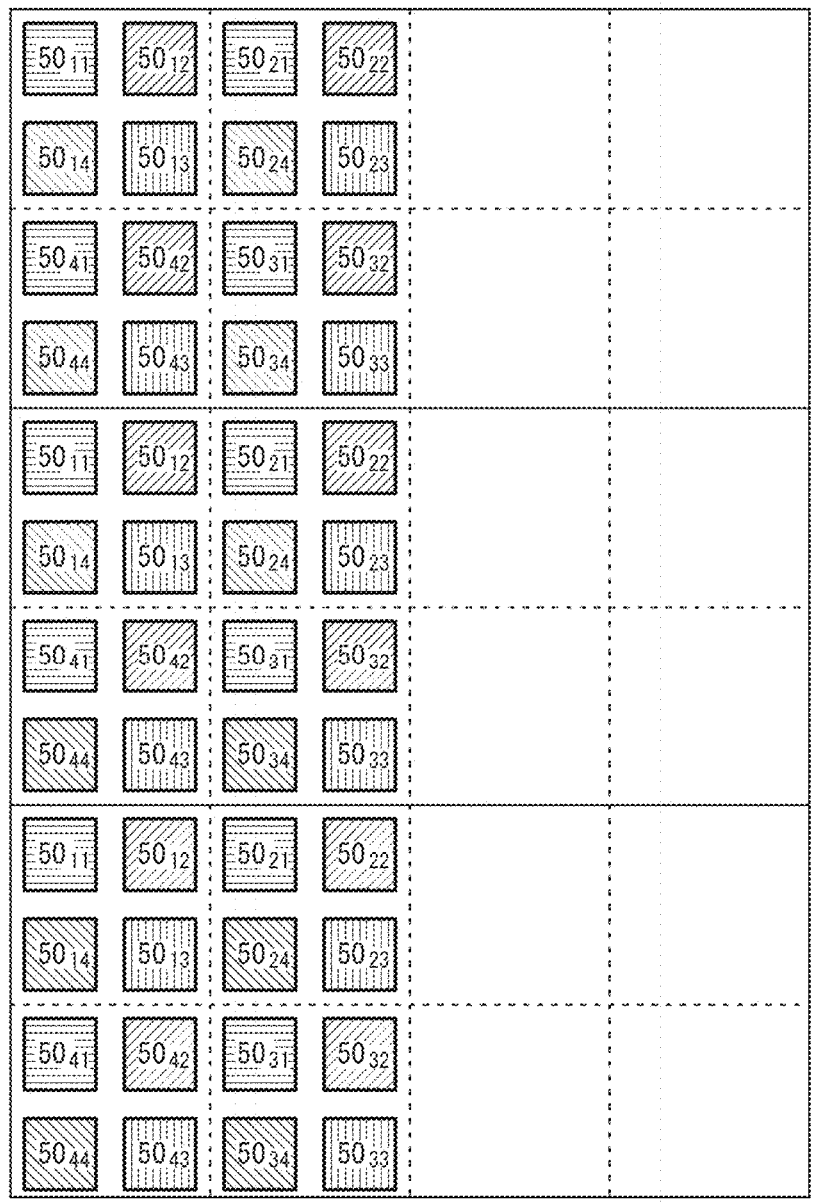
FIG. 25 is a conceptual plan diagram of wire grid polarizers constituting the photoelectric conversion elements of the modification of the light receiving device of Embodiment 2.
Figure 26:
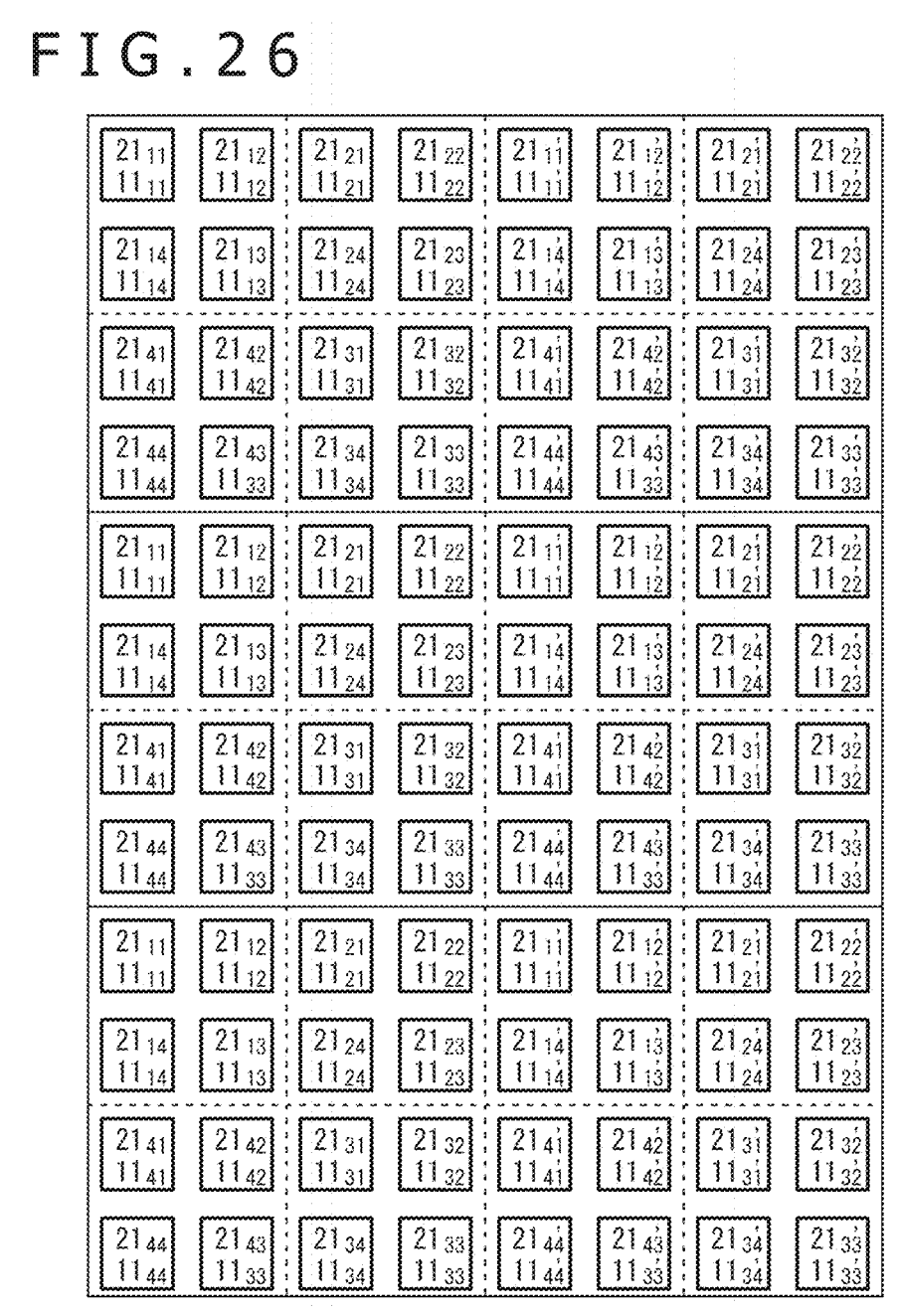

FIG. 22 is a conceptual plan diagram of photoelectric conversion element units of a modification of the light receiving device of Embodiment 2, FIG. 23 is a conceptual plan diagram of filter layers, FIG. 24 is a conceptual plan diagram of fourth quarter wavelength layers, FIG. 25 is a conceptual plan diagram of wire grid polarizers, and FIG. 26 is a conceptual plan diagram of photoelectric conversion sections and photoelectric conversion elements. Note that each of FIGS. 22, 23, 24, 25, and 26 depicts 1×3 photoelectric conversion element units. According to the modification of the light receiving device of Embodiment 2, photoelectric conversion element units $10B_1'$, $10B_2'$, $10B_3'$, and $10B_4'$ are provided adjacent to photoelectric conversion element units $10B_1$, $10B_2$, $10B_3$, and $10B_4$. In addition, a photoelectric conversion element $11_{p,q}'$ constituting each of the photoelectric conversion element units $10B_1'$, $10B_2'$, $10B_3'$, and $10B_4'$ (provided that $1 \leq p \leq 4$ and $1 \leq q \leq 4$ hold; see FIG. 26) includes the on-chip microlens 81, the filter layer $71_1$, $71_2$, $71_3$, or $71_4$, and a photoelectric conversion section $21_{p,q}'$ from the light entrance side. According to the modification of the light receiving device of Embodiment 2 described above, the conventional photoelectric conversion element $11_{p,q}'$ is further provided. Accordingly, the light receiving device is capable of simultaneously acquiring polarized light information in addition to performing ordinary sensing.

Embodiment 3

Figure 27:
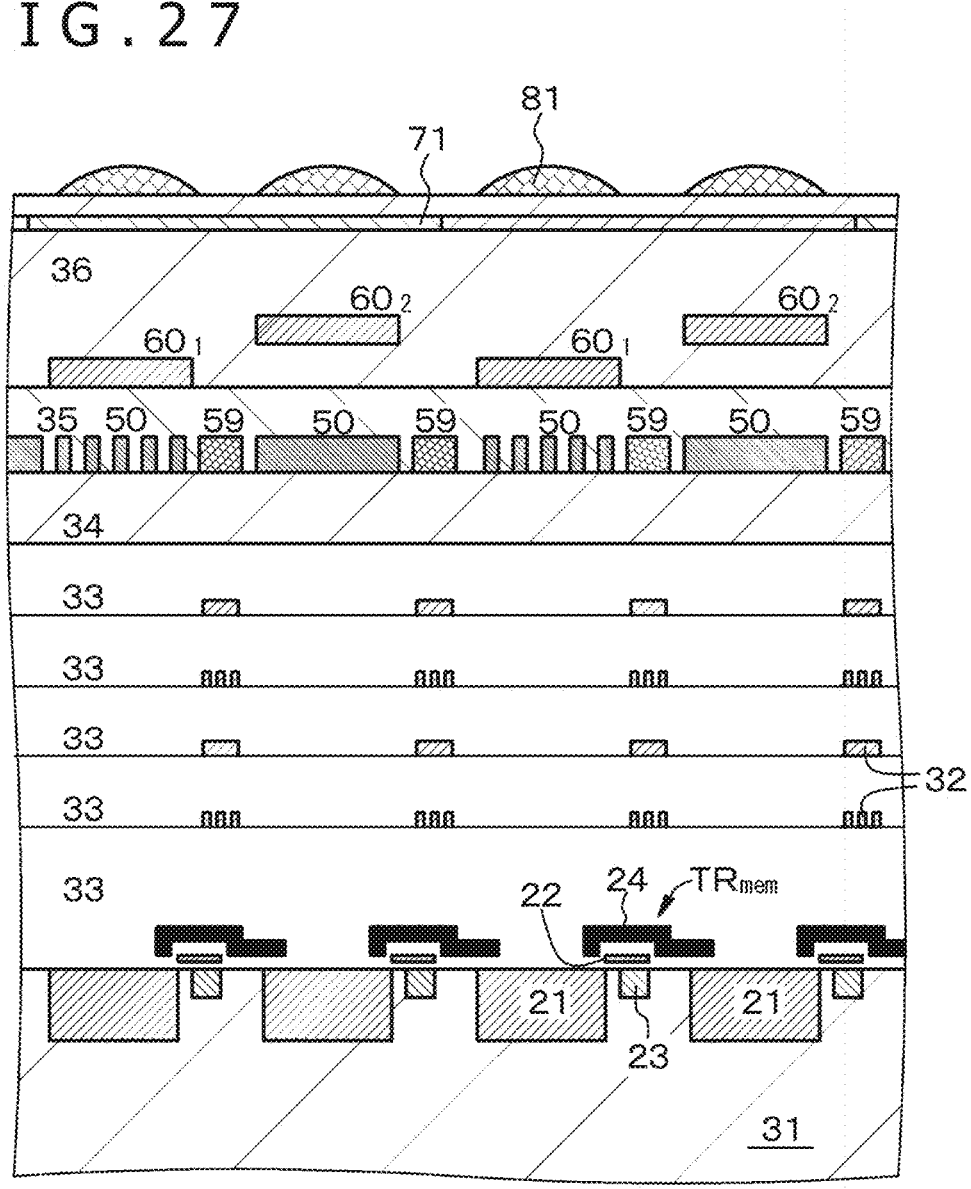
FIG. 27 is a schematic partial cross-sectional diagram of a light receiving device of Embodiment 3 similar to the diagram taken along arrows A-A of FIG. 18A.
Figure 28:
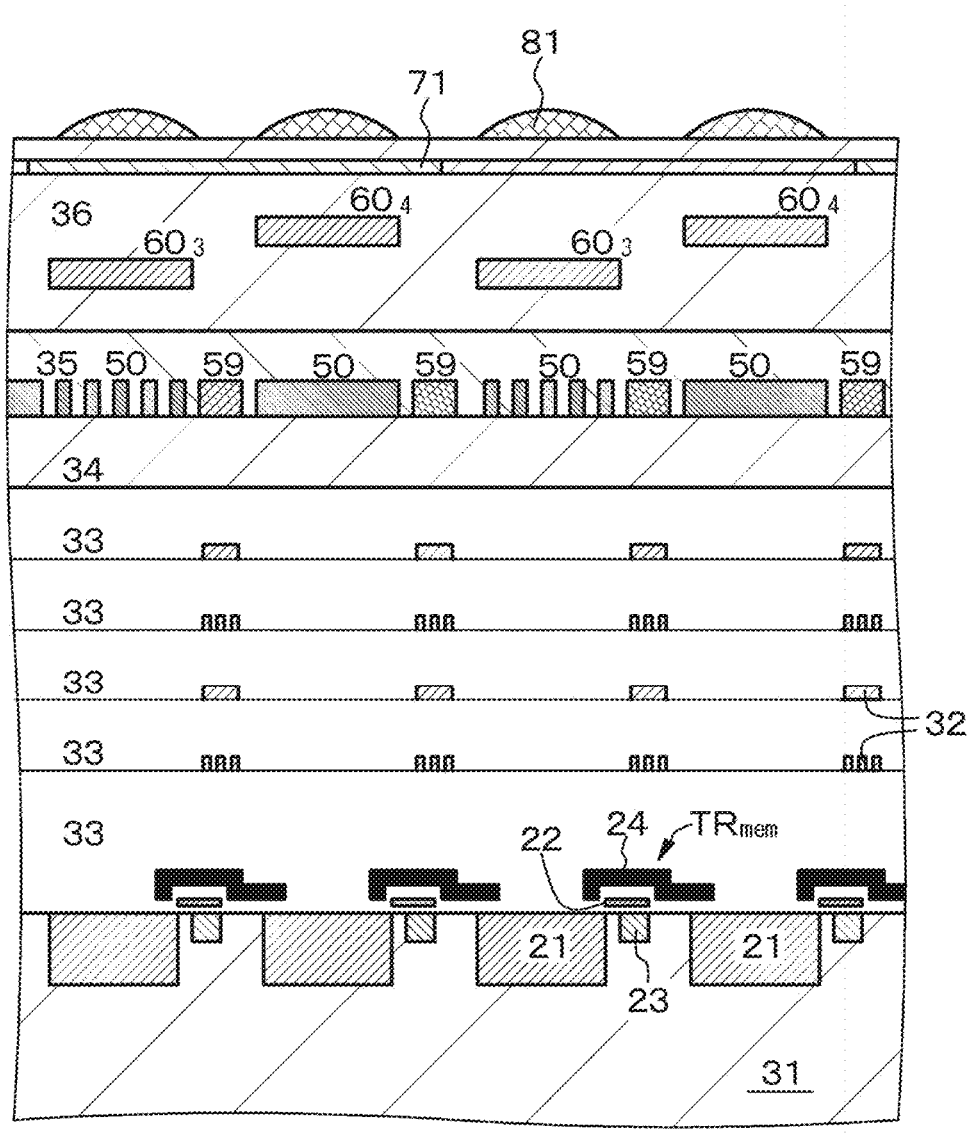
FIG. 28 is a schematic partial cross-sectional diagram of the light receiving device of Embodiment 3 similar to a diagram taken along arrows B-B of FIG. 18A.

Embodiment 3 is a modification of Embodiment 2 and is related to a light receiving device having Configuration 2-A-1 of the present disclosure. FIG. 27 is a schematic partial cross-sectional diagram of a light receiving device of Embodiment 3 similar to the configuration taken along the arrows A-A of FIG. 18A, while FIG. 28 is a schematic partial cross-sectional diagram of the light receiving device of Embodiment 3 similar to the configuration taken along the arrows B-B of FIG. 18A.

According to the light receiving device of Embodiment 3, the first quarter wavelength layer $60_1$, the second quarter wavelength layer $60_2$, the third quarter wavelength layer $60_3$, and the fourth quarter wavelength layer $60_4$ are disposed in different layers. Moreover, according to the light receiving device of Embodiment 3, the quarter wavelength layer 60 includes first dielectric layers 61 made of a material having a refractive index $n_1$ and second dielectric layers 62 made of a material having a refractive index $n_2$ (provided that $n_1 > n_2$). The first and second dielectric layers 61 and 62 are alternately disposed side by side.

Thicknesses ($t_{11}$, $t_{12}$) of the first dielectric layer 61 and the second dielectric layer 62 constituting the first quarter wavelength layer $60_1$, thicknesses ($t_{21}$, $t_{22}$) of the first dielectric layer 61 and the second dielectric layer 62 constituting the second quarter wavelength layer $60_2$, thicknesses ($t_{31}$, $t_{32}$) of the first dielectric layer 61 and the second dielectric layer 62 constituting the third quarter wavelength layer $60_3$, and thicknesses ($t_{41}$, $t_{42}$) of the first dielectric layer 61 and the second dielectric layer 62 constituting the fourth quarter wavelength layer $60_4$ are set such that the thicknesses of the respective first dielectric layers are equalized and that the thicknesses of the respective second dielectric layers are equalized. In other words, $t_{11} = t_{21} = t_{31} = t_{41}$ and $t_{12} = t_{22} = t_{32} = t_{42}$ are set.

The first quarter wavelength layer $60_1$, the second quarter wavelength layer $60_2$, the third quarter wavelength layer $60_3$, and the fourth quarter wavelength layer $60_4$ may have different layer thicknesses.

However, similarly to Embodiment 2, the one photoelectric conversion element group according to Embodiment 3 includes the four photoelectric conversion element units $10B_1$, $10B_2$, $10B_3$, and $10B_4$ disposed in Bayer arrangement. Accordingly, $H_2 = H_3$ is set. The figure depicts the first quarter wavelength layer $60_1$ occupying a first layer, for example, the second quarter wavelength layer $60_2$ and the third quarter wavelength layer $60_3$ each occupying a second layer, for example, and the fourth quarter wavelength layer $60_4$ occupying a third layer, for example. However, the states of the respective quarter wavelength layers are not limited to these examples. The order of the layer occupied by the first quarter wavelength layer $60_1$, the layer occupied by the second quarter wavelength layer $60_2$ and the third quarter wavelength layer $60_3$, and the layer occupied by the fourth quarter wavelength layer $60_4$ is essentially any order.

According to Embodiment 3, $t_{11} = t_{21} = t_{31} = t_{41} = 150$ nm, and $t_{12} = t_{22} = t_{32} = t_{42} = 150$ nm are set.

In addition, concerning the first quarter wavelength layer $60_1$, $f = 150/(150+150) = 0.5$, $n_{TE} = 1.77$, and $n_{TM} = 0.59$ are set.

When H=125 nm is set, a wavelength $\lambda_1$ of light passing through the first quarter wavelength layer $60_1$ and being given a phase difference becomes $\lambda_1 = 600$ nm.

Moreover, concerning the second quarter wavelength layer $60_2$ and the third quarter wavelength layer $60_3$, $f = 150/(150+150) = 0.5$, $n_{TE} = 1.77$, and $n_{TM} = 0.59$ are set.

When H=115 nm is set, a wavelength $\lambda_{2\text{-}3}$ of light which passes through the second quarter wavelength layer $60_2$ and the third quarter wavelength layer $60_3$ and being given a phase difference becomes $\lambda_{2\text{-}3} = 550$ nm.

Furthermore, concerning the fourth quarter wavelength layer $60_4$, $f = 150/(150+150) = 0.5$, $n_{TE} = 1.77$, and $n_{TM} = 0.59$ are set.

When H=95 nm is set, a wavelength $\lambda_4$ of light passing through the fourth quarter wavelength layer $60_4$ and being given a phase difference becomes $\lambda_4 = 450$ nm.

The light receiving device of Embodiment 3 is allowed to have a configuration and a structure similar to the configuration and the structure of the light receiving device of each of Embodiment 1 and Embodiment 2 except for the points described above. Accordingly, detailed description of the similar configuration and structure is omitted.

Embodiment 4

Figure 30:
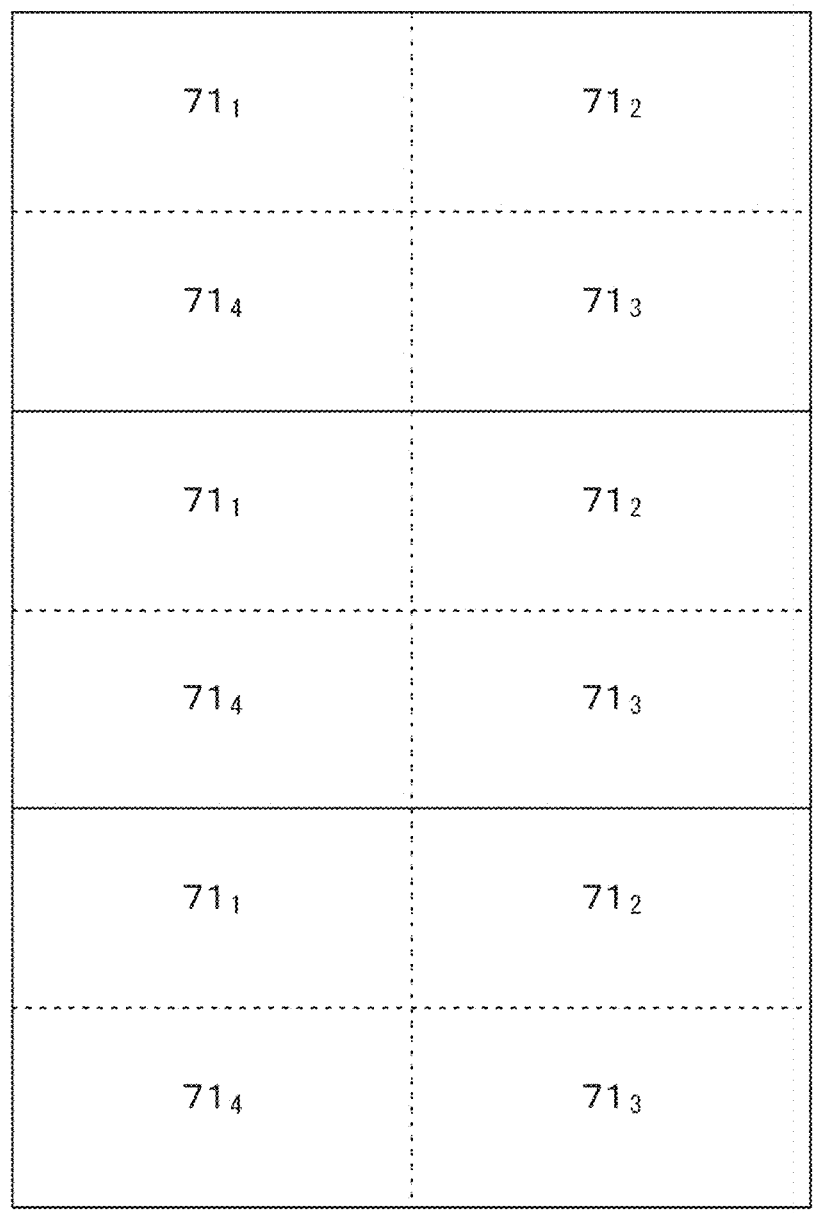
FIG. 30 is a conceptual plan diagram of filter layers constituting photoelectric conversion elements of the light receiving device of Embodiment 4.
Figure 31:
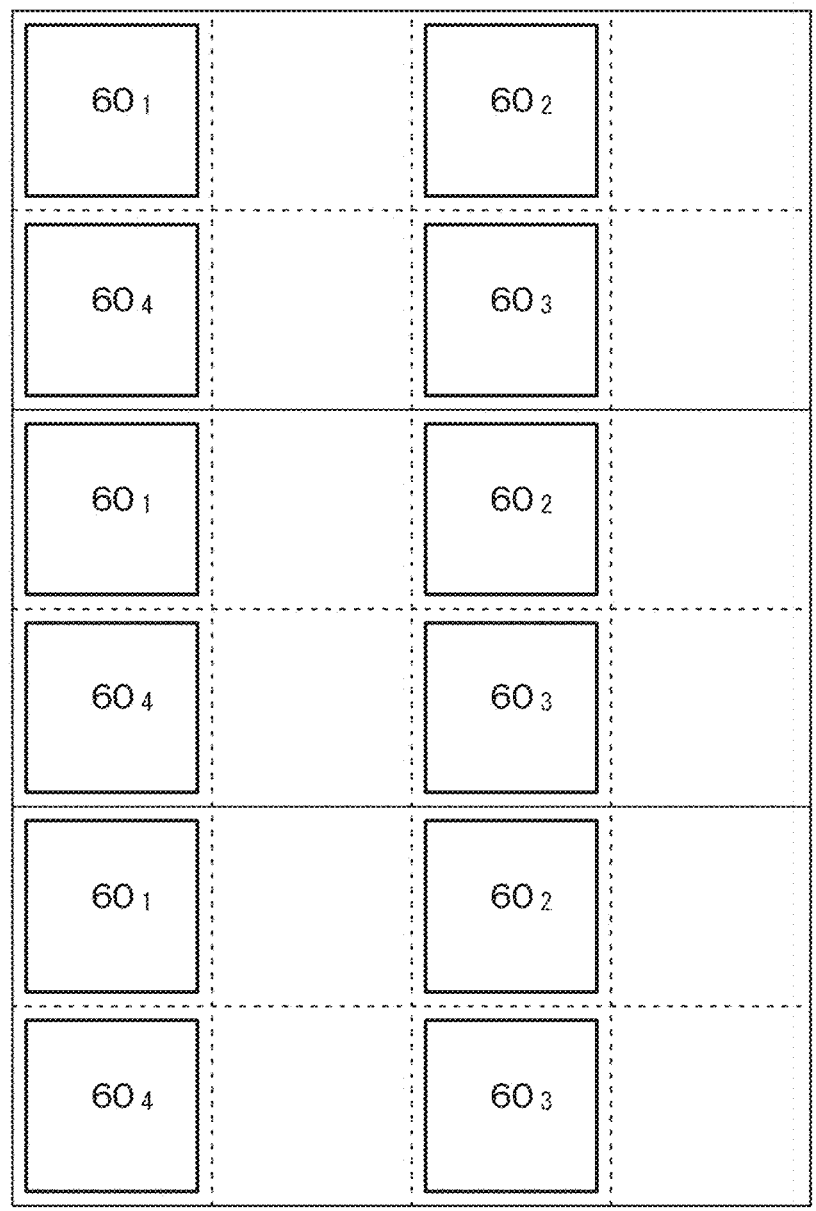
FIG. 31 is a conceptual plan diagram of fourth quarter wavelength layers constituting the photoelectric conversion elements of the light receiving device of Embodiment 4.
Figure 32:
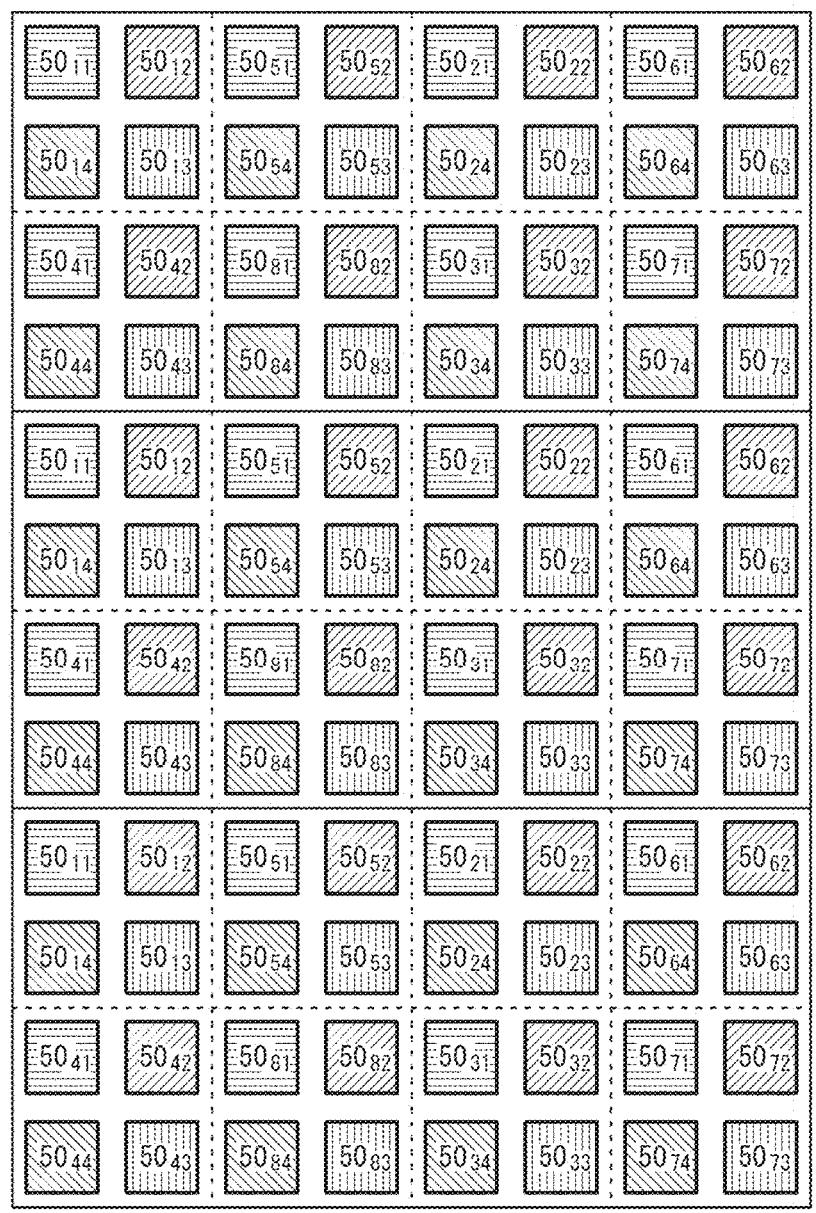
FIG. 32 is a conceptual plan diagram of wire grid polarizers constituting the photoelectric conversion elements of the light receiving device of Embodiment 4.
Figure 33:
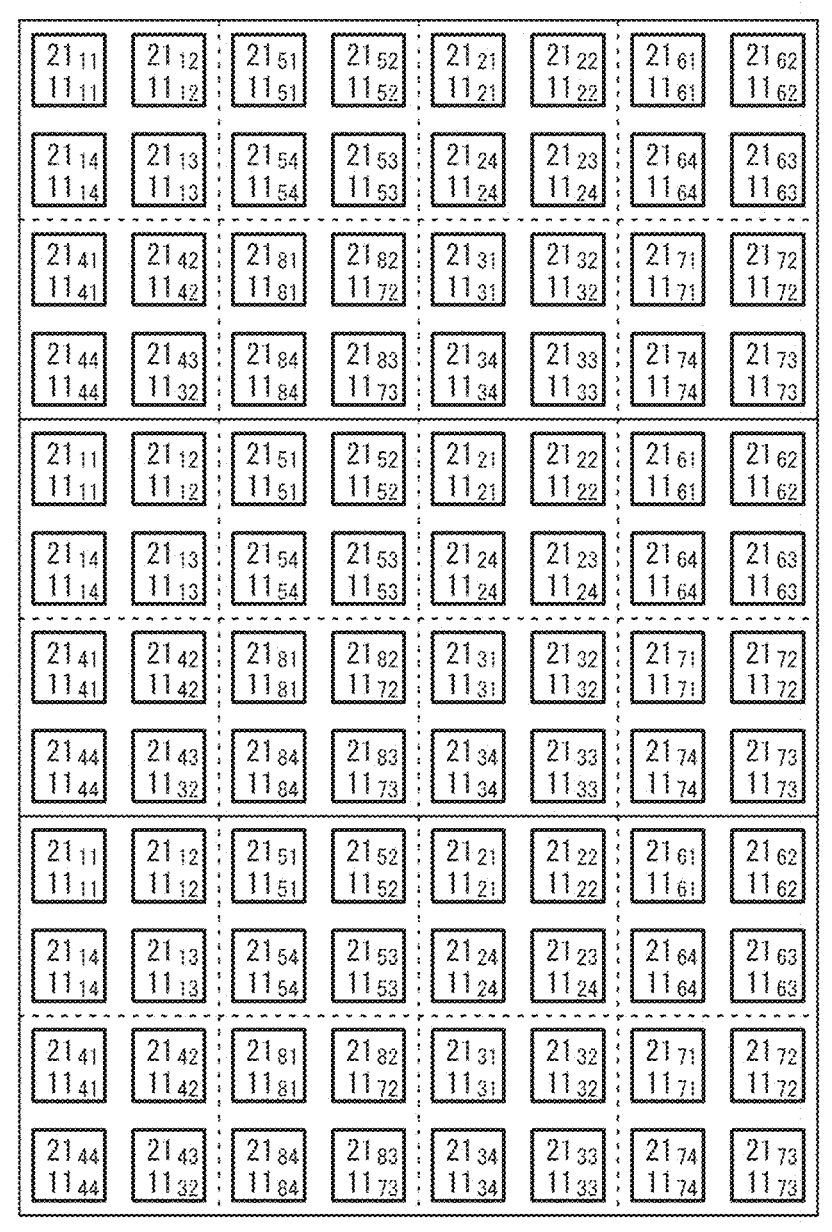

Embodiment 4 is a modification of Embodiment 2 and Embodiment 3 and is related to a light receiving device having Configuration 3 of the present disclosure. FIG. 29 is a conceptual plan diagram of photoelectric conversion element units of the light receiving device according to Embodiment 4, FIG. 30 is a conceptual plan diagram of filter layers of photoelectric conversion elements, FIG. 31 is a conceptual plan diagram of fourth quarter wavelength layers, FIG. 32 is a conceptual plan diagram of wire grid polarizers, and FIG. 33 is a conceptual plan diagram of photoelectric conversion sections and the photoelectric conversion elements. Note that each of these figures depicts 1×3 photoelectric conversion element units.

According to the light receiving device of Embodiment 4, the photoelectric conversion element units include a photoelectric conversion element unit A and a photoelectric conversion element unit B.

Each of the photoelectric conversion elements constituting the photoelectric conversion element unit A includes the quarter wavelength layer 60 and the wire grid polarizer 50 disposed in this order on the light entrance side.

Each of the photoelectric conversion elements constituting the photoelectric conversion element unit B includes the wire grid polarizer 50 disposed on the light entrance side. However, the quarter wavelength layer 60 is not disposed.

In addition, according to the light receiving device of Embodiment 4, the photoelectric conversion element unit A includes 2×2 arranged four photoelectric conversion elements.

The photoelectric conversion element unit B includes 2×2 arranged four photoelectric conversion elements.

A polarization direction designated for transmission by each of wire grid polarizers constituting a first photoelectric conversion element included in each of the photoelectric conversion element unit A and the photoelectric conversion element unit B is $\alpha$ degrees.

A polarization direction designated for transmission by each of wire grid polarizers constituting a second photoelectric conversion element included in each of the photoelectric conversion element unit A and the photoelectric conversion element unit B is $(\alpha+45)$ degrees.

A polarization direction designated for transmission by each of wire grid polarizers constituting a third photoelectric conversion element included in each of the photoelectric conversion element unit A and the photoelectric conversion element unit B is $(\alpha+90)$ degrees.

A polarization direction designated for transmission by a wire grid polarizer constituting a fourth photoelectric conversion element of each of the photoelectric conversion element unit A and the photoelectric conversion element unit B is $(\alpha+135)$ degrees.

Furthermore, the light receiving device of Embodiment 4 includes plural photoelectric conversion element groups arranged two-dimensionally.

Each of the photoelectric conversion element groups includes the 2×2 arranged four photoelectric conversion element units A and the 2×2 arranged four photoelectric conversion element units B.

Each of first photoelectric conversion element units $10C_{A-1}$ and $10C_{B-1}$ included in each of the photoelectric conversion element unit A and the photoelectric conversion element unit B includes the first filter layer $71_1$ that transmits light in the first wavelength range.

Each of second photoelectric conversion element units $10C_{A-2}$ and $10C_{B-2}$ included in each of the photoelectric conversion element unit A and the photoelectric conversion element unit B includes the second filter layer $71_2$ that transmits light in the second wavelength range.

Each of third photoelectric conversion element units $10C_{A-3}$ and $10C_{B-3}$ included in each of the photoelectric conversion element unit A and the photoelectric conversion element unit B includes the third filter layer $71_3$ that transmits light in the third wavelength range.

Each of fourth photoelectric conversion element units $10C_{A-4}$ and $10C_{B-4}$ included in each of the photoelectric conversion element unit A and the photoelectric conversion element unit B includes the fourth filter layer $71_4$ that transmits light in the fourth wavelength range.

In addition, the quarter wavelength layer $60_1$ in the first photoelectric conversion element unit $10C_{A-1}$ constituting the photoelectric conversion element unit A gives a phase difference to light in the first wavelength range.

The quarter wavelength layer $60_2$ in the second photoelectric conversion element unit $10C_{A-2}$ constituting the photoelectric conversion element unit A gives a phase difference to light in the second wavelength range.

The quarter wavelength layer $60_3$ in the third photoelectric conversion element unit $10C_{A-3}$ constituting the photoelectric conversion element unit A gives a phase difference to light in the third wavelength range.

The quarter wavelength layer $60_4$ in the fourth photoelectric conversion element unit $10C_{A-4}$ constituting the photoelectric conversion element unit A gives a phase difference to light in the fourth wavelength range.

The first photoelectric conversion element unit $10C_{A-1}$ constituting the first photoelectric conversion element unit A includes four first photoelectric conversion elements $11_{11}$, $11_{12}$, $11_{13}$, and $11_{14}$.

In addition, the first photoelectric conversion element $11_{11}$ includes the on-chip microlens 81, the first filter layer $71_1$, the first quarter wavelength layer $60_1$, a wire grid polarizer $50_{11}$, and a photoelectric conversion section $21_{11}$ disposed in this order from the light entrance side. Moreover, the second photoelectric conversion element $11_{12}$ includes the on-chip microlens 81, the first filter layer $71_1$, the first quarter wavelength layer $60_1$, a wire grid polarizer $50_{12}$, and a photoelectric conversion section $21_{12}$ disposed in this order from the light entrance side. Furthermore, the third photoelectric conversion element $11_{13}$ includes the on-chip microlens 81, the first filter layer $71_1$, the first quarter wavelength layer $60_1$, a wire grid polarizer $50_{13}$, and a photoelectric conversion section $21_{13}$ disposed in this order from the light entrance side. Besides, the fourth photoelectric conversion element $11_{14}$ includes the on-chip microlens 81, the first filter layer $71_1$, the first quarter wavelength layer $60_1$, a wire grid polarizer $50_{14}$, and a photoelectric conversion section $21_{14}$ disposed in this order from the light entrance side.

The second photoelectric conversion element unit $10C_{A-2}$ constituting the second photoelectric conversion element unit A includes four first photoelectric conversion elements $11_{21}$, $11_{22}$, $11_{23}$, and $11_{24}$.

The second photoelectric conversion element $11_{21}$ includes the on-chip microlens 81, the second filter layer $71_2$, the second quarter wavelength layer $60_2$, a wire grid polarizer $50_{21}$, and a photoelectric conversion section $21_{21}$ disposed in this order from the light entrance side. Moreover, the second photoelectric conversion element $11_{22}$ includes the on-chip microlens 81, the second filter layer $71_2$, the second quarter wavelength layer $60_2$, a wire grid polarizer $50_{22}$, and a photoelectric conversion section $21_{22}$ disposed in this order from the light entrance side. Further, the third photoelectric conversion element $11_{23}$ includes the on-chip microlens 81, the second filter layer $71_2$, the second quarter wavelength layer $60_2$, a wire grid polarizer $50_{23}$, and a photoelectric conversion section $21_{23}$ disposed in this order from the light entrance side. Besides, the fourth photoelectric conversion element $11_{24}$ includes the on-chip microlens 81, the second filter layer $71_2$, the second quarter wavelength layer $60_2$, a wire grid polarizer $50_{24}$, and a photoelectric conversion section $21_{24}$ disposed in this order from the light entrance side.

The third photoelectric conversion element unit $10C_{A-3}$ constituting the third photoelectric conversion element unit A includes four first photoelectric conversion elements $11_{31}$, $11_{32}$, $11_{33}$, and $11_{34}$.

The third photoelectric conversion element $11_{31}$ includes the on-chip microlens 81, the third filter layer $71_3$, the third quarter wavelength layer $60_3$, a wire grid polarizer $50_{31}$, and a photoelectric conversion section $21_{31}$ disposed in this order from the light entrance side. Moreover, the third photoelectric conversion element $11_{32}$ includes the on-chip microlens 81, the third filter layer $71_3$, the third quarter wavelength layer $60_3$, a wire grid polarizer $50_{32}$, and a photoelectric conversion section $21_{32}$ disposed in this order from the light entrance side. Further, the third photoelectric conversion element $11_{33}$ includes the on-chip microlens 81, the third filter layer $71_3$, the third quarter wavelength layer $60_3$, a wire grid polarizer $50_{33}$, and a photoelectric conversion section $21_{33}$ disposed in this order from the light entrance side. Besides, the fourth photoelectric conversion element $11_{34}$ includes the on-chip microlens 81, the third filter layer $71_3$, the third quarter wavelength layer $60_3$, a wire grid polarizer $50_{34}$, and a photoelectric conversion section $21_{34}$ disposed in this order from the light entrance side.

The fourth photoelectric conversion element unit $10C_{A-4}$ constituting the fourth photoelectric conversion element unit A includes four first photoelectric conversion elements $11_{41}$, $11_{42}$, $11_{43}$, and $11_{44}$.

The fourth photoelectric conversion element $11_{41}$ includes the on-chip microlens 81, the fourth filter layer $71_4$, the fourth quarter wavelength layer $60_4$, a wire grid polarizer $50_{41}$, and a photoelectric conversion section $21_{41}$ disposed in this order from the light entrance side. Moreover, the fourth photoelectric conversion element $11_{42}$ includes the on-chip microlens 81, the fourth filter layer $71_4$, the fourth quarter wavelength layer $60_4$, a wire grid polarizer $50_{42}$, and a photoelectric conversion section $21_{42}$ disposed in this order from the light entrance side. Further, the fourth photoelectric conversion element $11_{43}$ includes the on-chip microlens 81, the fourth filter layer $71_4$, the fourth quarter wavelength layer $60_4$, a wire grid polarizer $50_{43}$, and a photoelectric conversion section $21_{43}$ disposed in this order from the light entrance side. Besides, the fourth photoelectric conversion element $11_{44}$ includes the on-chip microlens 81, the fourth filter layer $71_4$, the fourth quarter wavelength layer $60_4$, a wire grid polarizer $50_{44}$, and a photoelectric conversion section $21_{44}$ disposed in this order from the light entrance side.

The photoelectric conversion elements constituting the photoelectric conversion element unit B have a configuration and a structure similar to those of the photoelectric conversion elements constituting the photoelectric conversion element unit A except that the quarter wavelength layers are not provided.

Specifically, the first photoelectric conversion element unit $10C_{B-1}$ constituting the first photoelectric conversion element unit B includes four first photoelectric conversion elements $11_{51}$, $11_{52}$, $11_{53}$, and $11_{54}$.

In addition, the first photoelectric conversion element $11_{51}$ includes the on-chip microlens 81, the first filter layer $71_1$, a wire grid polarizer $50_{51}$, and a photoelectric conversion section $21_{51}$ disposed in this order from the light entrance side. Moreover, the second photoelectric conversion element $11_{52}$ includes the on-chip microlens 81, the first filter layer $71_1$, a wire grid polarizer $50_{52}$, and a photoelectric conversion section $21_{52}$ disposed in this order from the light entrance side. Further, the third photoelectric conversion element $11_{53}$ includes the on-chip microlens 81, the first filter layer $71_1$, a wire grid polarizer $50_{53}$, and a photoelectric conversion section $21_{53}$ disposed in this order from the light entrance side. Besides, the fourth photoelectric conversion element $11_{54}$ includes the on-chip microlens 81, the first filter layer $71_1$, a wire grid polarizer $50_{54}$, and a photoelectric conversion section $21_{54}$ disposed in this order from the light entrance side.

The second photoelectric conversion element unit $10C_{B-2}$ constituting the second photoelectric conversion element unit B includes four first photoelectric conversion elements $11_{61}$, $11_{62}$, $11_{63}$, and $11_{64}$.

The second photoelectric conversion element $11_{61}$ includes the on-chip microlens 81, the second filter layer $71_2$, a wire grid polarizer $50_{61}$, and a photoelectric conversion section $21_{61}$ disposed in this order from the light entrance side. Moreover, the second photoelectric conversion element $11_{62}$ includes the on-chip microlens 81, the second filter layer $71_2$, a wire grid polarizer $50_{62}$, and a photoelectric conversion section $21_{62}$ disposed in this order from the light entrance side. Further, the third photoelectric conversion element $11_{63}$ includes the on-chip microlens 81, the second filter layer $71_2$, a wire grid polarizer $50_{63}$, and a photoelectric conversion section $21_{63}$ disposed in this order from the light entrance side. Besides, the fourth photoelectric conversion element $11_{64}$ includes the on-chip microlens 81, the second filter layer $71_2$, a wire grid polarizer $50_{64}$, and a photoelectric conversion section $21_{64}$ disposed in this order from the light entrance side.

The third photoelectric conversion element unit $10C_{B-3}$ constituting the third photoelectric conversion element unit B includes four first photoelectric conversion elements $11_{71}$, $11_{72}$, $11_{73}$, and $11_{74}$.

The third photoelectric conversion element $11_{71}$ includes the on-chip microlens 81, the third filter layer $71_3$, a wire grid polarizer $50_{71}$, and a photoelectric conversion section $21_{71}$ disposed in this order from the light entrance side. Moreover, the third photoelectric conversion element $11_{72}$ includes the on-chip microlens 81, the third filter layer $71_3$, a wire grid polarizer $50_{72}$, and a photoelectric conversion section $21_{72}$ disposed in this order from the light entrance side. Further, the third photoelectric conversion element $11_{73}$ includes the on-chip microlens 81, the third filter layer $71_3$, a wire grid polarizer $50_{73}$, and a photoelectric conversion section $21_{73}$ disposed in this order from the light entrance side. Besides, the fourth photoelectric conversion element $11_{74}$ includes the on-chip microlens 81, the third filter layer $71_3$, a wire grid polarizer $50_{74}$, and a photoelectric conversion section $21_{74}$ disposed in this order from the light entrance side.

The fourth photoelectric conversion element unit $10C_{B-4}$ constituting the fourth photoelectric conversion element unit B includes four first photoelectric conversion elements $11_{81}$, $11_{82}$, $11_{83}$, and $11_{84}$.

The fourth photoelectric conversion element $11_{81}$ includes the on-chip microlens 81, the fourth filter layer $71_4$, a wire grid polarizer $50_{81}$, and a photoelectric conversion section $21_{81}$ disposed in this order from the light entrance side. Moreover, the fourth photoelectric conversion element $11_{82}$ includes the on-chip microlens 81, the fourth filter layer $71_4$, a wire grid polarizer $50_{82}$, and a photoelectric conversion section $21_{82}$ disposed in this order from the light entrance side. Further, the fourth photoelectric conversion element $11_{83}$ includes the on-chip microlens 81, the fourth filter layer $71_4$, a wire grid polarizer $50_{83}$, and a photoelectric conversion section $21_{83}$ disposed in this order from the light entrance side. Besides, the fourth photoelectric conversion element $11_{84}$ includes the on-chip microlens 81, the fourth filter layer 71₄, a wire grid polarizer 50₈₄, and a photoelectric conversion section 21₈₄ disposed in this order from the light entrance side.

Table 3 presented below represents an intensity relation between signals obtained by the first photoelectric conversion element (α=0 degrees), the second photoelectric conversion element (α=45 degrees), the third photoelectric conversion element (α=90 degrees), and the fourth photoelectric conversion element (α=135 degrees) in cases where a polarized state of incident light having entered the photoelectric conversion element is a left-handed circularly polarized state, a left-handed elliptically polarized state, a linearly polarized state, a right-handed elliptically polarized state, a right-handed circularly polarized state, and unpolarized state.

As presented in Table 3, for example, the left-handed circularly polarized state, the left-handed elliptically polarized state, the right-handed elliptically polarized state, the right-handed circularly polarized state, any linearly polarized state as the polarized state, or the unpolarized state of the incident light entering the photoelectric conversion element can be determined by examining outputs from the first photoelectric conversion element, the second photoelectric conversion element, the third photoelectric conversion element, and the fourth photoelectric conversion element constituting the photoelectric conversion element unit A and the photoelectric conversion element unit B. In such a manner, according to Embodiment 4, a larger volume of information indicating the polarized states than that volume of Embodiment 2 and Embodiment 3 is acquirable.

TABLE 3

| | PHOTOELECTRIC CONVERSION ELEMENT UNIT A | | | |
| --- | --- | --- | --- | --- |
| | FIRST PHOTOELECTRIC CONVERSION ELEMENT | SECOND PHOTOELECTRIC CONVERSION ELEMENT | THIRD PHOTOELECTRIC CONVERSION ELEMENT | FOURTH PHOTOELECTRIC CONVERSION ELEMENT |
| | POLARIZATION DIRECTION (α°) | | | |
| | 0° | 45° | 90° | 135° |
| POLARIZED STATE OF INCIDENT LIGHT | | | | |
| LEFT-HANDED CIRCULARLY POLARIZED LIGHT | 3 | 1 | 3 | 5 |
| LEFT-HANDED ELLIPTICALLY POLARIZED LIGHT | 3 | 2 | 3 | 4 |
| LINEARLY POLARIZED LIGHT | | | | |
| 0° | 1 | 5 | 5 | 5 |
| 45° | 3 | 3 | 3 | 3 |
| 90° | 5 | 5 | 1 | 5 |
| 135° | 3 | 3 | 3 | 3 |
| RIGHT-HANDED ELLIPTICALLY POLARIZED LIGHT | 3 | 4 | 3 | 2 |
| RIGHT-HANDED CIRCULARLY POLARIZED LIGHT | 3 | 5 | 3 | 1 |
| UNPOLARIZED LIGHT | 3 | 3 | 3 | 3 |
| | PHOTOELECTRIC CONVERSION ELEMENT UNIT B | | | |
| | FIRST PHOTOELECTRIC CONVERSION ELEMENT | SECOND PHOTOELECTRIC CONVERSION ELEMENT | THIRD PHOTOELECTRIC CONVERSION ELEMENT | FOURTH PHOTOELECTRIC CONVERSION ELEMENT |
| | POLARIZATION DIRECTION (α°) | | | |
| | 0° | 45° | 90° | 135° |
| POLARIZED STATE OF INCIDENT LIGHT | | | | |
| LEFT-HANDED CIRCULARLY POLARIZED LIGHT | 3 | 3 | 3 | 3 |
| LEFT-HANDED ELLIPTICALLY POLARIZED LIGHT | 3 | 4 | 3 | 2 |
| LINEARLY POLARIZED LIGHT | | | | |
| 0° | 1 | 5 | 5 | 5 |
| 45° | 3 | 1 | 3 | 5 |
| 90° | 5 | 5 | 1 | 5 |
| 135° | 3 | 5 | 3 | 1 |

TABLE 3-continued

| | | | | |
|---|---|---|---|---|
| RIGHT-HANDED ELLIPTICALLY POLARIZED LIGHT | 3 | 2 | 3 | 4 |
| RIGHT-HANDED CIRCULARLY POLARIZED LIGHT | 3 | 3 | 3 | 3 |
| UNPOLARIZED LIGHT | 3 | 3 | 3 | 3 |

Embodiment 5

Figure 35:
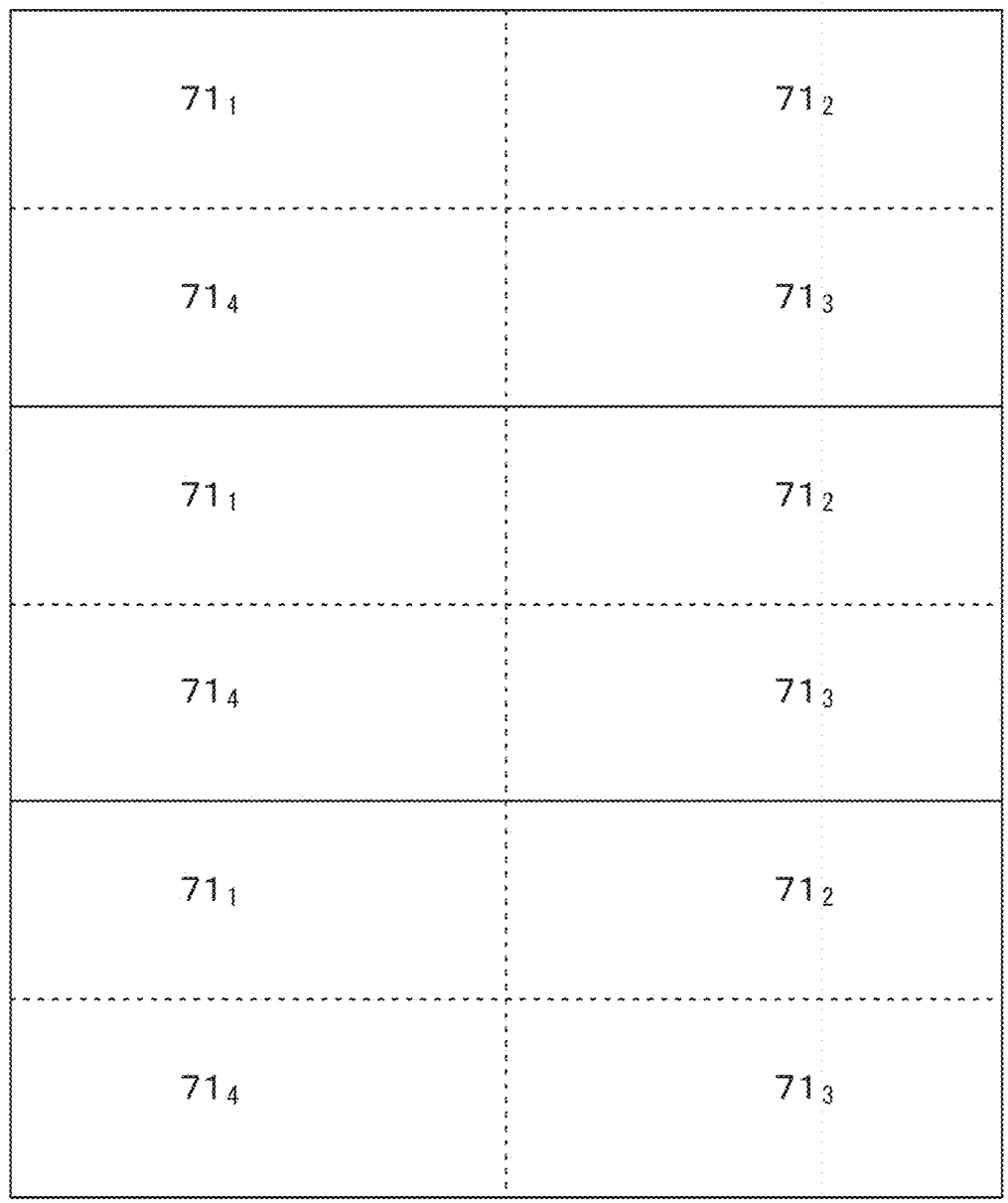
FIG. 35 is a conceptual plan diagram of filter layers constituting photoelectric conversion elements of the light receiving device of Embodiment 5.
Figure 36:
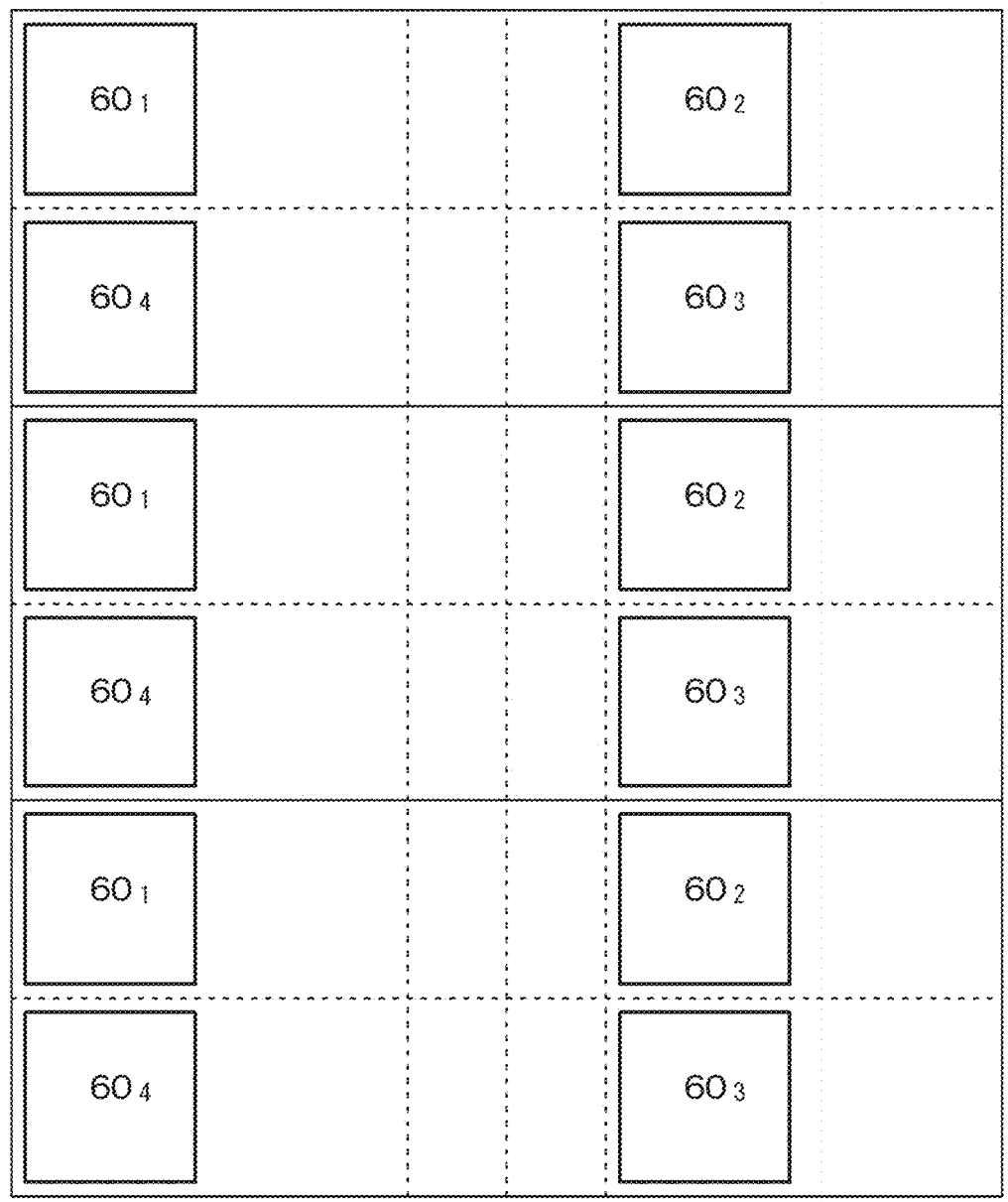
FIG. 36 is a conceptual plan diagram of fourth quarter wavelength layers constituting the photoelectric conversion elements of the light receiving device of Embodiment 5.
Figure 37:
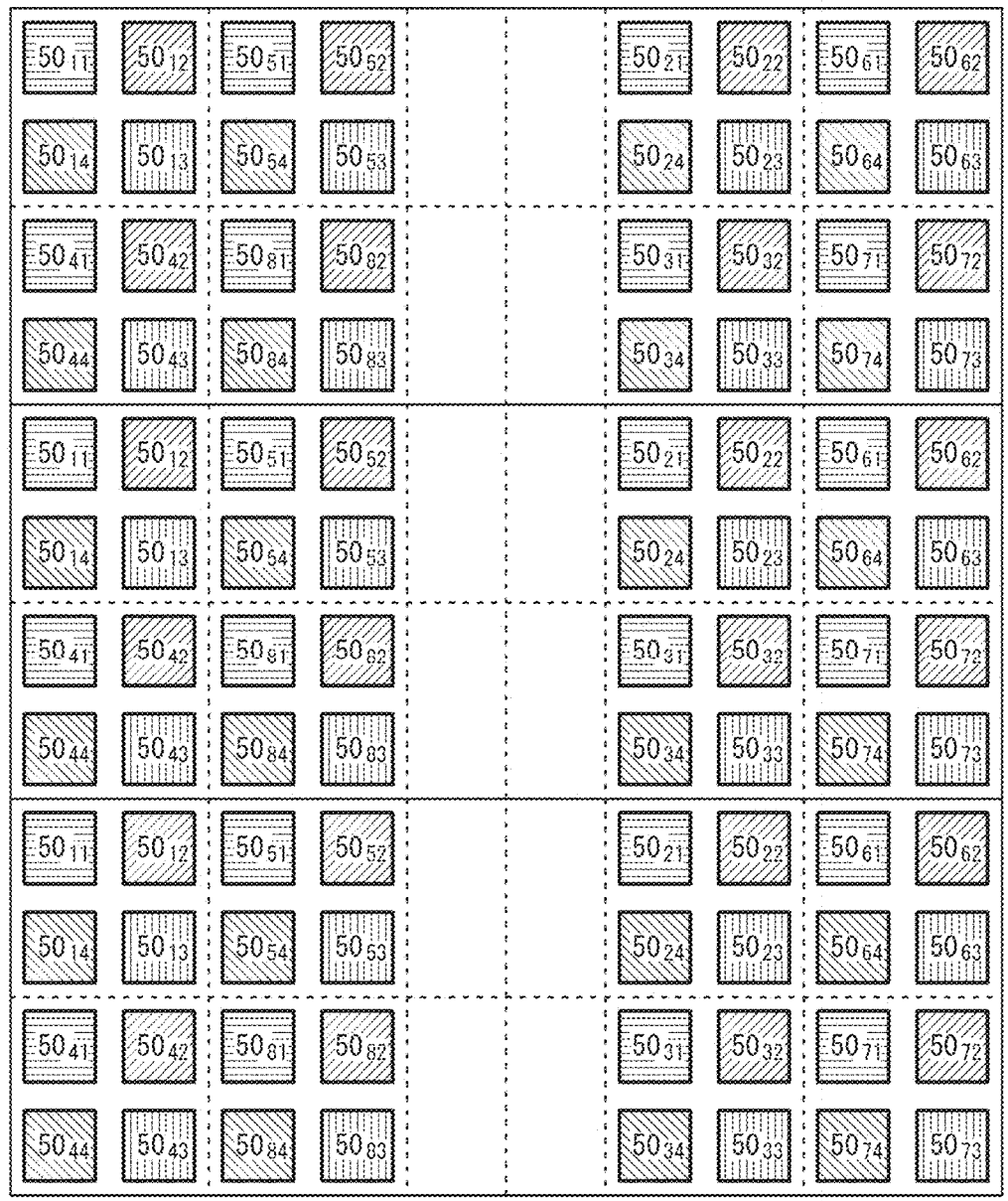
FIG. 37 is a conceptual plan diagram of wire grid polarizers constituting the photoelectric conversion elements of the light receiving device of Embodiment 5.
Figure 38:
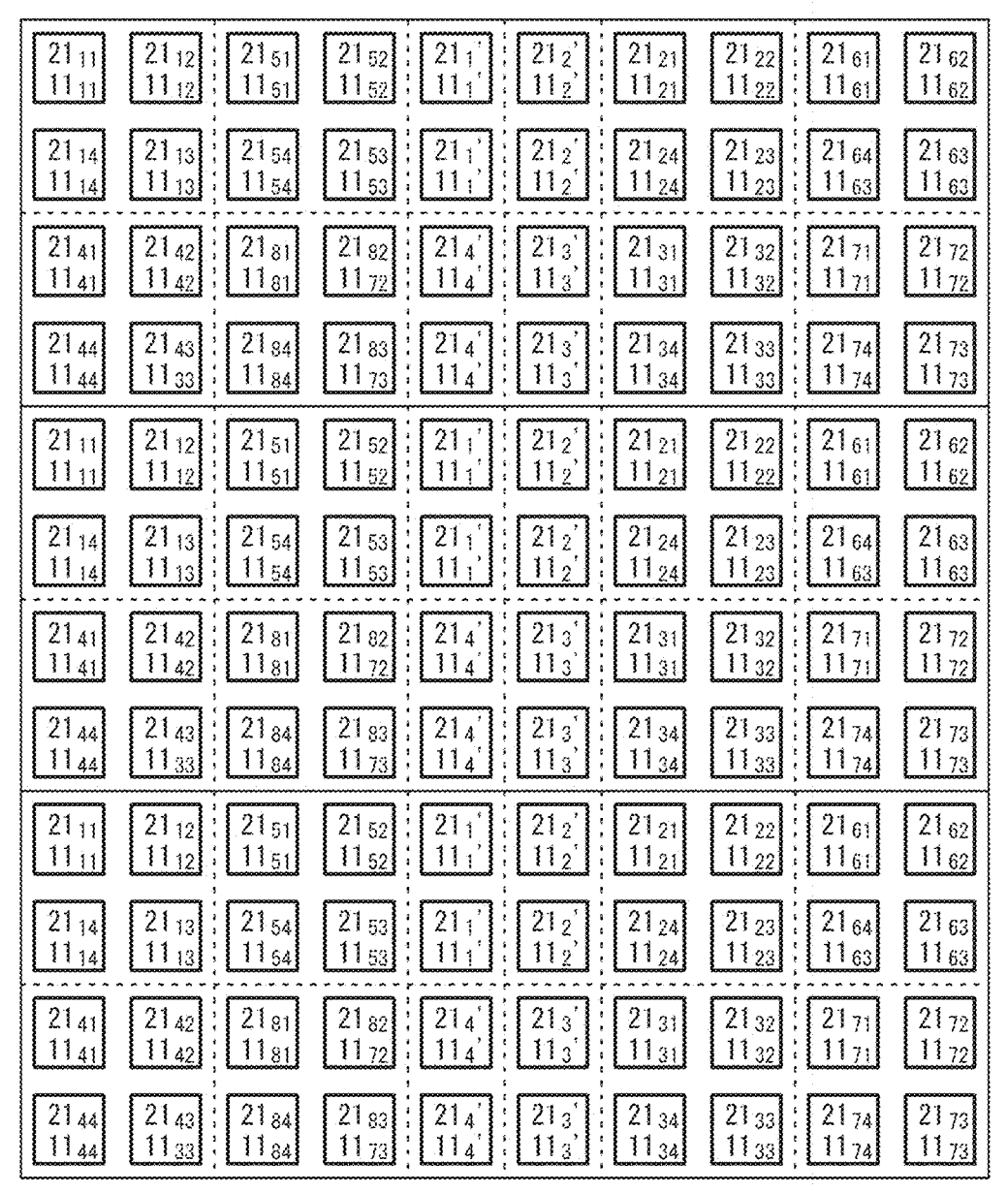

Embodiment 5 is a modification of Embodiment 4. FIG. 34 is a conceptual plan diagram of photoelectric conversion element units of the light receiving device according to Embodiment 5, FIG. 35 is a conceptual plan diagram of filter layers of photoelectric conversion elements, FIG. 36 is a conceptual plan diagram of fourth quarter wavelength layers, FIG. 37 is a conceptual plan diagram of a wire grid polarizer, and FIG. 38 is a conceptual plan diagram of photoelectric conversion sections and the photoelectric conversion elements. Note that each of these figures depicts 1×3 photoelectric conversion element units.

According to the light receiving device of Embodiment 5, each of the photoelectric conversion element groups includes one photoelectric conversion element unit C in addition to 2×2, i.e., four, photoelectric conversion element units A, and 2×2, i.e., four, photoelectric conversion element units B. According to the example depicted in the figure, the one photoelectric conversion element unit C includes two photoelectric conversion elements. However, the number of the photoelectric conversion elements constituting the one photoelectric conversion element unit C is not limited to this number.

A photoelectric conversion element $11_1'$ constituting the photoelectric conversion element unit C ($10D_1$) includes the on-chip microlens 81, the first filter layer $71_1$, and a photoelectric conversion section $21_1'$ disposed in this order from the light entrance side. The photoelectric conversion element $11_1'$ has a configuration and a structure similar to those of the first photoelectric conversion element $11_1$ except that the first quarter wavelength layer and the wire grid polarizer are not provided. A photoelectric conversion element $11_2'$ constituting the photoelectric conversion element unit C ($10D_2$) includes the on-chip microlens 81, the first filter layer $71_2$, and a photoelectric conversion section $21_2'$ disposed in this order from the light entrance side. The photoelectric conversion element $11_2'$ has a configuration and a structure similar to those of the second photoelectric conversion element $11_2$ except that the first quarter wavelength layer and the wire grid polarizer are not provided. A photoelectric conversion element $11_3'$ constituting the photoelectric conversion element unit C ($10D_3$) includes the on-chip microlens 81, the first filter layer $71_3$, and a photoelectric conversion section $21_3'$ disposed in this order from the light entrance side. The photoelectric conversion element $11_3'$ has a configuration and a structure similar to those of the third photoelectric conversion element $11_3$ except that the first quarter wavelength layer and the wire grid polarizer are not provided. A photoelectric conversion element $11_4'$ constituting the photoelectric conversion element unit C ($10D_4$) includes the on-chip microlens 81, the first filter layer $71_4$, and a photoelectric conversion section $21_4'$ disposed in this order from the light entrance side. The photoelectric conversion element $11_4'$ has a configuration and a structure similar to those of the fourth photoelectric conversion element $11_4$ except that the first quarter wavelength layer and the wire grid polarizer are not provided.

The light receiving device of Embodiment 5 is allowed to have a configuration and a structure similar to the configuration and the structure of the light receiving device of Embodiment 4 except for the points described above. Accordingly, detailed description of the similar configuration and structure is omitted.

For example, the light receiving device (solid-state imaging device) of Embodiment 5 can constitute a digital still camera, a video camera, a camcorder, a monitoring camera, a camera mounted on a vehicle (in-vehicle camera), a smartphone camera, a game user interface camera, a biometric authentication camera, and the like.

In addition, the light receiving device of Embodiment 5 further includes conventional photoelectric conversion elements. Accordingly, the light receiving device (solid-state imaging device) is capable of simultaneously acquiring polarized light information in addition to performing ordinary imaging. In other words, the light receiving device (solid-state imaging device) is allowed to have a polarized light separation function for spatially separating polarized light information associated with incident light. Specifically, each of the photoelectric conversion elements (imaging elements) is capable of obtaining light intensity, polarized light component intensity, and a polarization direction. Accordingly, for example, image data is allowed to be processed on the basis of polarized light information, after imaging. For example, a polarized light component can be emphasized or reduced, or respective polarized light components can be separated, by performing desired processing for a part of a captured image of the sky or window glass, a part of a captured image of a water surface, or the like. In this manner, improvement of image contrast and deletion of unnecessary information are achievable. Note that, specifically, these processes can be achieved by designating an imaging mode during imaging using the solid-state imaging device, for example. In addition, removal of a ghost image on window glass, and clarification of boundaries (contours) of multiple objects based on polarized light information added to image information are achievable by use of the solid-state imaging device. Moreover, a state of a road surface and an obstacle on a road surface are detectable. Further allowed is application to or practical use for imaging of patterns reflecting birefringence of an object, measurement of retardation distribution, acquisition of a polarizing microscope image, acquisition of a surface shape of an object and measurement of surface quality of an object, detection of a moving body (e.g., a vehicle), meteorology observation such as measurement of cloud distribution, or other various fields. Also allowed is application to a solid-state imaging device imaging a three-dimensional image.

While the present disclosure has been described on the basis of the preferred embodiments, the present disclosure is not limited to these embodiments. The structures, the configurations, the manufacturing methods, and the used materials of the photoelectric conversion element (light receiving element, imaging element), the light receiving device, and the solid-state imaging device are presented only by way of example, and may be modified in appropriate manners. The light receiving devices of the respective embodiments are allowed to be combined in appropriate manners. A moving image can be captured and sensed using a solid-state imaging device including the light receiving device of the present disclosure.

The combination of the photoelectric conversion section, the wavelength selection means, and the wire grid polarizer that are explained in the embodiments is allowed to be modified in appropriate manners. A near infrared photoelectric conversion section (or infrared photoelectric conversion section) may be provided. Depending on cases, the photoelectric conversion element may have an arrangement of the quarter wavelength layer, the on-chip microlens, the wire grid polarizer, and the photoelectric conversion section disposed in this order from the light entrance side. In short, it is sufficient if the quarter wavelength layer is disposed on the light entrance side of the wire grid polarizer.

For example, as a technology associated with circularly polarized light, there has been known research achievement of Laboratory for Future Interdisciplinary Research of Science and Technology, Institute of Innovative Research, Tokyo Institute of Technology (see https://www.titech.ac.jp/news/2017/037434.html). Main points of this research are world-first success in trial production of a spin light emitting diode which emits pure circularly polarized light at room temperature and discovery of a phenomenon that circularly polarized light is amplified by light emission under a large current. The technology is expected to be utilized in many fields such as life science and cryptographic communication. According to this spin light emitting diode, polarized light is not generated when an amount of a flowing current is small. However, light emission intensity and purity of circularly polarized light increase in association with an increase in the amount of the flowing current. It is assumed that the spin light emitting diode is achieved by reducing forming reaction of a non-magnetic material caused in a junction plane between a semiconductor and magnetic metal. This forming reaction has been a barrier to emission of circularly polarized light at room temperature. In addition, for example, the technology is expected to be incorporated in an endoscope for detection of a cancer cell, and the technology is expected to be utilized for light transfer for special cryptographic communication, and others.

Desired polarized light is conventionally obtained by using light emitted from a light source such as a lamp and laser beams and transmitted through a spectroscope and various filters. However, such a method requires precise alignment between the light source and the filters and causes problems such as a size increase of the entire device and a low switching speed in a rotation direction of circularly polarized light. It has been considered that the greatest problems needed to be solved for achieving circularly polarized light at room temperature are principle development for equalizing all directions of rotation axes of electrons determining a rotation direction of a spiral of circularly polarized light and development of a manufacturing method which eliminates generation of a non-magnetic material generated in a junction interface between a semiconductor and magnetic metal in an element. According to the spin light emitting diode, an intermediate layer is made of crystalline alumina. In this case, "unpolarized light" close to natural light is emitted during a small amount of a flowing current. On the other hand, purity of circularly polarized light increases and reaches α degree for generating pure circularly polarized light when the amount of the flowing current is increased to raise light emission intensity. As estimated from the foregoing characteristics, intensive emission of light generated in the diode has an effect of amplifying circularly polarized light. Moreover, dramatic progress is expected in measurement, analysis, and analytics fields of biological, cellular, and chemical worlds by application and amplification of circularly polarized light thus achieved. Furthermore, measurement, evaluation, and analysis of light containing the above circularly polarized light can be implemented by the light receiving device of the present disclosure.

Meanwhile, Dr. Asami's laboratory of Faculty of Engineering, Yokohama National University has developed circularly polarized light emission (CPL) coloring which has a "switching" function for simultaneously switching a rotation direction and a color (wavelength) of "circularly polarized light" used when three-dimensional images are projected in a theater or the like (see https://www.chem-station.com/blog/2017/07/photoluminescence.html). According to this three-dimensional image technology, an image is presented three-dimensionally by simultaneously projecting images of two types having different rotation directions of light for counterclockwise and clockwise rotations. In this technology, rotation direction control is an important factor. In addition, CPL is expected to be applied to a next-generation light information technology in a security field and the like. Conventional CPL coloring has such a characteristic that color and intensity of light are variable in appearance during switching. In a case of new coloring developed this time, however, a rotation direction and a color (wavelength) of CPL can be switched simultaneously without any change to the light (PL) in appearance (substantially no change in wavelength and intensity). Specifically, a change in a fluorescent coloring concentration provides a switching function to change a wavelength band of CPL. It is expected in future optical fiber communication to apply CPL to a next-generation security technology which protects communication contents by encryption, with use of switching of two types of light not identifiable in appearance. Furthermore, measurement, evaluation, and analysis of light containing the above two types of light can be implemented by the light receiving device of the present disclosure.

According to the embodiments described above, the wire grid polarizer is provided only for acquisition of polarized light information by the photoelectric conversion section which has sensitivity in a visible light wavelength band. However, in a case where the photoelectric conversion un section it has sensitivity to infrared light or ultraviolet light, the wire grid polarizer is allowed to be mounted as a wire grid polarizer functioning in any wavelength band by increasing or decreasing a formation pitch $P_0$ of the line portion.

Depending on cases, adoptable is such a mode which includes a groove portion (a kind of element separation region) disposed at an edge of the photoelectric conversion section, filled with an insulation material or a light shielding material, and extending from the substrate to a position below the wire grid polarizer. Examples of the insulation material include a material constituting an insulation film (insulation film forming layer) or an interlayer insulation layer, while examples of the light shielding material include the material constituting the light shielding film 24 described above. A drop of sensitivity, generation of polarized light crosstalk, and a drop of an extinction ratio are preventable by forming such a groove portion.

A waveguide structure may be provided between the photoelectric conversion sections 21. The waveguide structure includes a thin film which has a refractive index larger than a refractive index of a material constituting the lower layer and interlayer insulation layer 33 and is formed in a region (e.g., columnar region) included in the lower layer and interlayer insulation layer 33 covering the photoelectric conversion sections 21 (specifically, a part of the lower layer and interlayer insulation layer 33) and located between the photoelectric conversion sections 21. In this case, light entering from above each of the photoelectric conversion sections 21 is reflected on this thin film by total reflection and reaches the photoelectric conversion section 21. An orthogonal projection image of the photoelectric conversion section 21 with respect to the semiconductor substrate 31 is located inside an orthogonal projection image of the thin film constituting the waveguide structure with respect to the semiconductor substrate 31. In addition, the orthogonal projection image of the photoelectric conversion section 21 with respect to the semiconductor substrate 31 is surrounded by the orthogonal projection image of the thin film constituting the waveguide structure with respect to the semiconductor substrate 31.

Alternatively, a light condensing tube structure may be provided between the photoelectric conversion sections 21. The light condensing tube structure includes a light-shielding thin film made of a metal material or an alloy material and formed in a region (e.g., columnar region) included in the lower layer and interlayer insulation layer 33 covering the photoelectric conversion sections 21 and located between the photoelectric conversion sections 21. Light entering from above each of the photoelectric conversion sections 21 is reflected on this thin film and reaches the photoelectric conversion section 21. Specifically, an orthogonal projection image of the photoelectric conversion section 21 with respect to the semiconductor substrate 31 is located inside an orthogonal projection image of the thin film constituting the light condensing tube structure with respect to the semiconductor substrate 31. In addition, the orthogonal projection image of the photoelectric conversion section 21 with respect to the semiconductor substrate 31 is surrounded by the orthogonal projection image of the thin film constituting the light condensing tube structure with respect to the semiconductor substrate 31. For example, the thin film is obtained by forming the whole of the lower layer and interlayer insulation layer 33, then forming an annular groove portion in the lower layer and interlayer insulation layer 33, and filling the groove portion with a metal material or an alloy material.

A 2×2 pixel sharing method is adoptable as a method for sharing a selection transistor, a reset transistor, and an amplification transistor by each of 2×2 photoelectric conversion sections. Imaging including polarized light information may be performed in an imaging mode not containing pixel addition, while provision of an ordinary captured image integrating all polarized components may be performed in a mode conducting FD addition of accumulated charges in a 2×2 sub pixel region.

In addition, described above in the embodiments is the example applied to a CMOS type solid-state imaging device which includes unit pixels arranged in a matrix and detects a signal charge corresponding to an incident light amount as a physical quantity. However, application is not limited to the CMOS type solid-state imaging device and may include a CCD type solid-state imaging device. In the latter case, a signal charge is transferred in a vertical direction by a vertical transfer register having a CCD type structure and is transferred in a horizontal direction by a horizontal transfer register. The transferred signal charge is amplified and output as a pixel signal (image signal). Moreover, application is not limited to a column type solid-state imaging device on the whole which includes pixels arranged in a two-dimensional matrix and column signal processing circuits provided one for each pixel column. Further, depending on cases, a selection transistor may be omitted.

In addition, the photoelectric conversion element (imaging element) of the present disclosure is not limited to application to a solid-state imaging device which detects a distribution of an incident light amount of visible light and captures the distribution as an image, but may be applied to a solid-state imaging device which captures a distribution of an incident amount of infrared light, X-rays, particles, or the like as an image. Moreover, in a broad sense, the present disclosure can also be applied to a solid-state imaging device (physical quantity distribution detection device) on the whole such as a fingerprint detection sensor which detects a distribution of other physical quantities such as pressure and electrostatic capacitance and captures the distribution as an image.

Further, application is not limited to a solid-state imaging device which sequentially scans respective unit pixels in an imaging region in units of row and reads pixel signals from the respective unit pixels. Application may include an X-Y address type solid-state imaging device which selects any pixel in units of pixel and reads a pixel signal from the selected pixel in units of pixel. The solid-state imaging device may be either a type provided as one chip, or a module type which has a packaged imaging function collectively including an imaging region and a driving circuit or an optical system.

Furthermore, application is not limited to the solid-state imaging device, and may include an imaging device. The imaging device here refers to a camera system such as a digital still camera and a video camera and an electronic apparatus which has an imaging function such as a cellular phone. The imaging device is a module type mounted on an electronic apparatus, i.e., a camera module, in some cases.

Figure 42:
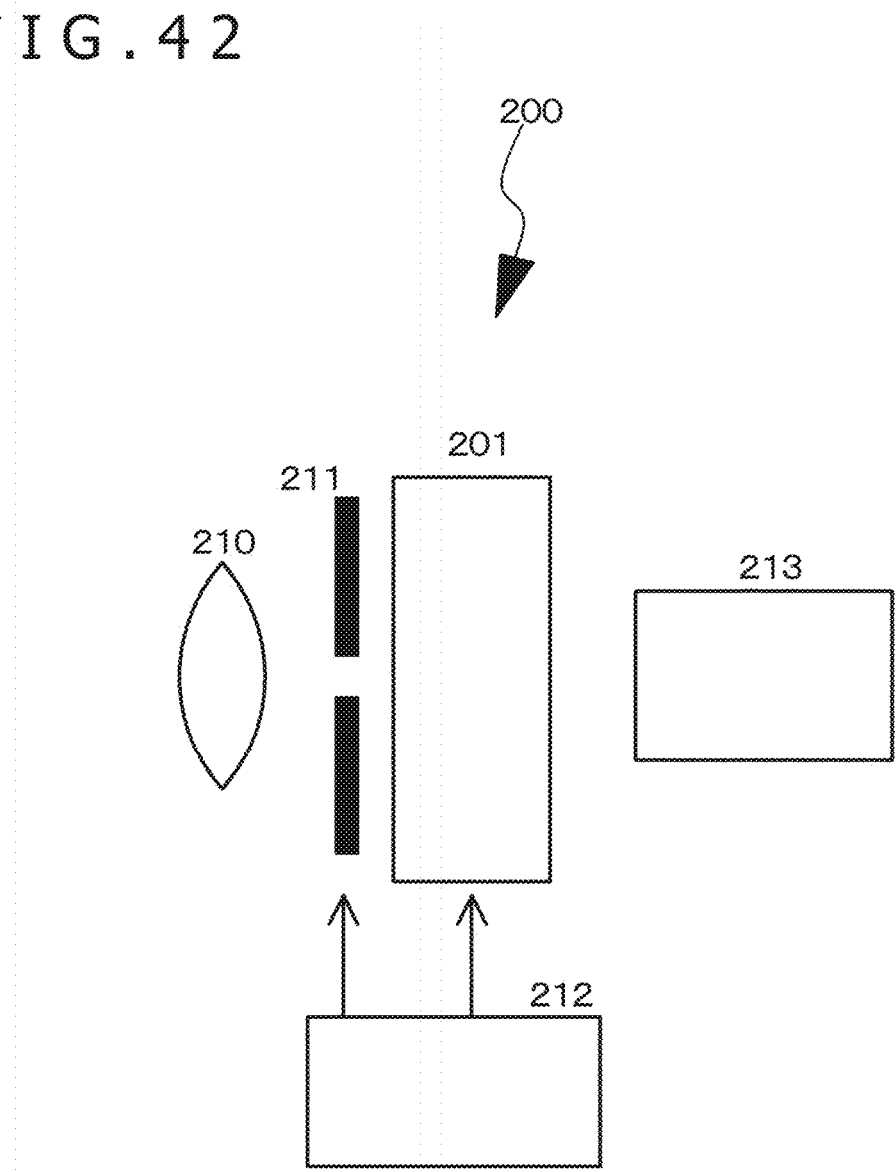
FIG. 42 is a conceptual diagram of an electronic apparatus (camera) which is a solid-state imaging device incorporating the light receiving device of the present disclosure.

FIG. 42 is a conceptual diagram depicting an example where a solid-state imaging device 201 of the present disclosure is incorporated in an electronic apparatus (camera 200). The electronic apparatus 200 includes the solid-state imaging device 201, an optical lens 210, a shutter device 211, a driving circuit 212, and a signal processing circuit 213. The optical lens 210 form image light received from an object (incident light) on an imaging surface of the solid-state imaging device 201. As a result, signal charges are accumulated within the solid-state imaging device 201 for a fixed period of time. The shutter device 211 controls a light application period and a light shielding period for the solid-state imaging device 201. The driving circuit 212 supplies a driving signal for controlling a transfer operation of the solid-state imaging device 201 and a shutter operation of the shutter device 211. Signal transfer of the solid-state imaging device 201 is performed according to the driving signal (timing signal) supplied from the driving circuit 212. The signal processing circuit 213 performs various kinds of signal processing. An image signal subjected to signal processing is stored in a storage medium such as a memory, or output to a monitor. The electronic apparatus 200 configured as above is capable of achieving size reduction of pixels of the solid-state imaging device 201 and improvement of transfer efficiency. Accordingly, the electronic apparatus 200 having improved pixel characteristics is providable. The electronic apparatus 200 to which the solid-state imaging device 201 is applicable is not limited to a camera, and may be an imaging device such as a digital still camera and a camera module for a mobile device like a cellular phone.

Note that the present disclosure may also have the following configurations.

[A01]

<<Light Receiving Device>>

A light receiving device including:

plural photoelectric conversion element units each including plural photoelectric conversion elements, in which each of the photoelectric conversion elements constituting the respective photoelectric conversion element units includes a quarter wavelength layer, a wire grid polarizer, and a photoelectric conversion section disposed in this order from a light entrance side.

[A02]

The light receiving device according to [A01], in which each of the photoelectric conversion elements includes an on-chip microlens disposed on the light entrance side of the quarter wavelength layer.

[A03]

The light receiving device according to [A01] or [A02], in which
each of the photoelectric conversion element units includes two photoelectric conversion elements,
a polarization direction designated for transmission by a wire grid polarizer constituting a first photoelectric conversion element is α degrees, and
a polarization direction designated for transmission by a wire grid polarizer constituting a second photoelectric conversion element is (α+45) degrees.

[A04]

The light receiving device according to [A01] or [A02], in which
each of the photoelectric conversion element unit includes 2×2 arranged four photoelectric conversion elements,
a polarization direction designated for transmission by a wire grid polarizer constituting a first photoelectric conversion element is α degrees,
a polarization direction designated for transmission by a wire grid polarizer constituting a second photoelectric conversion element is (α+45) degrees,
a polarization direction designated for transmission by a wire grid polarizer constituting a third photoelectric conversion element is (α+90) degrees, and
a polarization direction designated for transmission by a wire grid polarizer constituting a fourth photoelectric conversion element is (α+135) degrees.

[A05]

The light receiving device according to [A04], including:
plural photoelectric conversion element groups arranged two-dimensionally, in which
one of the photoelectric conversion element groups includes 2×2 arranged four photoelectric conversion element units,
a first photoelectric conversion element unit includes a first filter layer that transmits light in a first wavelength range,
a second photoelectric conversion element unit includes a second filter layer that transmits light in a second wavelength range,
a third photoelectric conversion element unit includes a third filter layer that transmits light in a third wavelength range, and
a fourth photoelectric conversion element unit includes a fourth filter layer that transmits light in a fourth wavelength range.

[A06]

The light receiving device according to [A05], in which
a first quarter wavelength layer constituting the first photoelectric conversion element unit gives a phase difference to the light in the first wavelength range,
a second quarter wavelength layer constituting the second photoelectric conversion element unit gives a phase difference to the light in the second wavelength range,
a third quarter wavelength layer constituting the third photoelectric conversion element unit gives a phase difference to the light in the third wavelength range, and
a fourth quarter wavelength layer constituting the fourth photoelectric conversion element unit gives a phase difference to the light in the fourth wavelength range.

[A07]

The light receiving device according to [A06], in which the first quarter wavelength layer, the second quarter wavelength layer, the third quarter wavelength layer, and the fourth quarter wavelength layer are disposed in different layers.

[A08]

The light receiving device according to [A07], in which
each of the quarter wavelength layer includes a first dielectric layer made of a material having a refractive index $n_1$ and a second dielectric layer made of a material having a refractive index $n_2$ (provided that $n_1 > n_2$), the first and second dielectric layers being alternately disposed side by side,
thicknesses of the first dielectric layer and the second dielectric layer constituting the first quarter wavelength layer, thicknesses of the first dielectric layer and the second dielectric layer constituting the second quarter wavelength layer, thicknesses of the first dielectric layer and the second dielectric layer constituting the third quarter wavelength layer, and thicknesses of the first dielectric layer and the second dielectric layer constituting the fourth quarter wavelength layer are set such that the thicknesses of the respective first dielectric layers are equalized and that the thicknesses of the respective second dielectric layers are equalized, and
the first quarter wavelength layer, the second quarter wavelength layer, the third quarter wavelength layer, and the fourth quarter wavelength layer have different layer thicknesses.

[A09]

The light receiving device according to [A06], in which the first quarter wavelength layer, the second quarter wavelength layer, the third quarter wavelength layer, and the fourth quarter wavelength layer are disposed in an identical layer.

[A10]

The light receiving device according to [A09], in which
each of the quarter wavelength layer includes a first dielectric layer made of a material having a refractive index $n_1$ and a second dielectric layer made of a material having a refractive index $n_2$ (provided that $n_1 > n_2$), the first and second dielectric layers being alternately disposed side by side,
thicknesses of the first dielectric layer and the second dielectric layer constituting the first quarter wavelength layer, thicknesses of the first dielectric layer and the second dielectric layer constituting the second quarter wavelength layer, thicknesses of the first dielectric layer and the second dielectric layer constituting the third quarter wavelength layer, and thicknesses of the first dielectric layer and the second dielectric layer constituting the fourth quarter wavelength layer are set such that the thicknesses of the respective first dielectric layers are different and that the thicknesses of the respective second dielectric layers are different, and the first quarter wavelength layer, the second quarter wavelength layer, the third quarter wavelength layer, and the fourth quarter wavelength layer have an identical layer thickness.

[A11]

The light receiving device according to [A01] or [A02], in which the photoelectric conversion element units include a photoelectric conversion element unit A and a photoelectric conversion element unit B, each of photoelectric conversion elements constituting the photoelectric conversion element unit A includes the quarter wavelength layer and the wire grid polarizer disposed in this order from the light entrance side, and each of photoelectric conversion elements constituting the photoelectric conversion element unit B includes the wire grid polarizer but does not include the quarter wavelength layer on the light entrance side.

[A12]

The light receiving device according to [A11], in which the photoelectric conversion element unit A and the photoelectric conversion element unit B are disposed adjacent to each other.

[A13]

The light receiving device according to [A11] or [A12], in which the photoelectric conversion element unit A includes 2×2 arranged four photoelectric conversion elements, the photoelectric conversion element unit B includes 2×2 arranged four photoelectric conversion elements, a polarization direction designated for transmission by each of wire grid polarizers constituting first photoelectric conversion elements included in the photoelectric conversion element unit A and the photoelectric conversion element unit B is $\alpha$ degrees, a polarization direction designated for transmission by each of wire grid polarizers constituting second photoelectric conversion elements included in the photoelectric conversion element unit A and the photoelectric conversion element unit B is $(\alpha+45)$ degrees, a polarization direction designated for transmission by each of wire grid polarizers constituting third photoelectric conversion elements included in the photoelectric conversion element unit A and the photoelectric conversion element unit B is $(\alpha+90)$ degrees, and a polarization direction designated for transmission by each of wire grid polarizers constituting fourth photoelectric conversion elements included in the photoelectric conversion element unit A and the photoelectric conversion element unit B is $(\alpha+135)$ degrees.

[A14]

The light receiving device according to any one of [A11] to [A13], including:

plural photoelectric conversion element groups arranged two-dimensionally, in which each of the photoelectric conversion element groups includes the 2×2 arranged four photoelectric conversion element units A and the 2×2 arranged four photoelectric conversion element units B, each of first photoelectric conversion element units constituting the photoelectric conversion element units A and the photoelectric conversion element units B includes a first filter layer that transmits light in a first wavelength range, each of second photoelectric conversion element units constituting the photoelectric conversion element units A and the photoelectric conversion element units B includes a second filter layer that transmits light in a second wavelength range, each of third photoelectric conversion element units constituting the photoelectric conversion element units A and the photoelectric conversion element units B includes a third filter layer that transmits light in a third wavelength range, and each of fourth photoelectric conversion element units constituting the photoelectric conversion element units A and the photoelectric conversion element units B includes a fourth filter layer that transmits light in a fourth wavelength range.

[A15]

The light receiving device according to [A14], in which each of the quarter wavelength layers included in the first photoelectric conversion element units constituting the photoelectric conversion element units A gives a phase difference to the light in the first wavelength range, each of the quarter wavelength layers included in the second photoelectric conversion element units constituting the photoelectric conversion element units A gives a phase difference to the light in the second wavelength range, each of the quarter wavelength layers included in the third photoelectric conversion element units constituting the photoelectric conversion element units A gives a phase difference to the light in the third wavelength range, and each of the quarter wavelength layers included in the fourth photoelectric conversion element units constituting the photoelectric conversion element units A gives a phase difference to the light in the fourth wavelength range.

[A16]

The light receiving device according to any one of [A01] to [A15], in which each of the quarter wavelength layers includes a first dielectric layer made of a material having a refractive index $n_1$ and a second dielectric layer made of a material having a refractive index $n_2$, the first and second dielectric layers being alternately disposed side by side.

[A17]

The light receiving device according to any one of [A01] to [A16], in which each of the photoelectric conversion element units detects a circularly polarized state of incident light.

[A18]

The light receiving device according to [A17], in which each of the photoelectric conversion element units detects a right-handed circularly polarized state or a left-handed circularly polarized state as a polarized state of incident light.

[A19]

The light receiving device according to any one of [A01] to [A18], in which a memory section that is connected to the photoelectric conversion section and is configured to temporarily store a charge generated by the photoelectric conversion section is provided on a semiconductor substrate.

[A20]

The light receiving device according to any one of [A01] to [A19], in which
a protection film is formed on the wire grid polarizer,
the wire grid polarizer has a line and space structure, and
a space portion of the wire grid polarizer includes a void.

[A21]

The light receiving device according to [A20], in which
a second protection film is formed between the wire grid polarizer and the protection film, and
assuming that a refractive index of a material constituting the protection film is $n_1'$, and that a refractive index of a material constituting the second protection film is $n_2'$, $n_1' > n_2'$ holds.

[A22]

The light receiving device according to [A21], in which
the protection film includes SiN, and
the second protection film includes $SiO_2$ or SiON.

[A23]

The light receiving device according to any one of [A20] to [A22], in which a third protection film is formed on at least a side surface of a line portion of the wire grid polarizer facing the space portion.

[A24]

The light receiving device according to any one of [A20] to [A23], further including:
a frame portion surrounding the wire grid polarizer, in which
the frame portion and the line portion of the wire grid polarizer are connected to each other, and
the frame portion has a structure identical to a structure of the line portion of the wire grid polarizer.

[A25]

The light receiving device according to any one of [A20] to [A24], in which the line portion of the wire grid polarizer includes a laminated structure body where a light reflection layer made of a first conductive material, an insulation layer, and a light absorption layer made of a second conductive material are laminated in this order from the photoelectric conversion section side.

[A26]

The light receiving device according to [A25], in which the light reflection layer and the light absorption layer are common components for each of the photoelectric conversion elements.

[A27]

The light receiving device according to [A25] or [A26], in which
the insulation film is formed on an entire top surface of the light reflection layer, and
the light absorption layer is formed on an entire top surface of the insulation film.

[A28]

The light receiving device according to any one of [A25] to [A27], in which a base insulation layer is formed below the light reflection layer.

[A29]

The light receiving device according to any one of [A25] to [A28], in which
the insulation film is formed on the entire top surface of the light reflection layer, and
the light absorption layer is formed on the entire top surface of the insulation film.

[B01]

<<Photoelectric Conversion Element>>
A photoelectric conversion element including:
from a light entrance side, in this order,
a quarter wavelength layer;
a wire grid polarizer; and
a photoelectric conversion section.

REFERENCE SIGNS LIST 10A, 10B, 10C, 10B', 10D . . . Photoelectric conversion element unit, 11, $11_1$, $11_2$, 11' . . . Photoelectric conversion element, 21, 21' . . . Photoelectric conversion section, 22 . . . Gate portion constituting memory section, 23 . . . High-concentration impurity region constituting memory section, 24 . . . Light shielding film, 31 . . . Silicon semiconductor substrate, 32 . . . Wiring layer, 33 . . . Lower layer and interlayer insulation layer, 34 . . . Base insulation film, 35 . . . flattening film, 36 . . . Upper layer and interlayer insulation layer, 50, $50_1$, $50_2$, 503, 504 . . . Wire grid polarizer, 51A . . . Light reflection layer forming layer, 52 . . . Insulation film, 52A . . . Insulation film forming layer, 52a . . . Notch of insulation film, 53 . . . Light absorption layer, 53A . . . Light absorption layer forming layer, 54 . . . Line portion (laminated structure body), 55 . . . Space portion (clearance between laminated structure bodies), 56 . . . Protection film, 57 . . . Second protection film, 58 . . . Third protection film, 59 . . . Frame portion, 60, $60_1$, $60_2$, $60_3$, $60_4$ . . . Quarter wavelength layer, 61 . . . First dielectric layer, 62 . . . Second dielectric layer, 71, $71_1$, $71_2$, $71_3$, $71_4$ . . . Filter layer, 81 . . . On-chip microlens, 100 . . . Solid-state imaging device, 101 . . . Photoelectric conversion section (imaging element), 111 . . . Imaging region (effective pixel region), 112 . . . Vertical driving circuit, 113 . . . Column signal processing circuit, 114 . . . Horizontal driving circuit, 115 . . . Output circuit, 116 . . . Driving control circuit, 117 . . . Signal line (data output line), 118 . . . Horizontal signal line, 200 . . . Electronic device (camera), 201 . . . Solid-state imaging device, 210 . . . Optical lens, 211 . . . Shutter device, 212 . . . Driving circuit, 213 . . . Signal processing circuit, FD . . . Floating diffusion layer, $TR_{mem}$ . . . Memory section, $TR_{trs}$ . . . Transfer transistor, $TR_{rst}$ . . . Reset transistor, $TR_{amp}$ . . . Amplification transistor, $TR_{sel}$ . . . Selection transistor, $V_{DD}$ . . . Power source, MEM . . . Memory selection line, TG . . . Transfer gate line, RST . . . Reset line, SEL . . . Selection line, VSL . . . Signal line (data output line)

The invention claimed is:

1. A light receiving device, comprising:
a plurality of photoelectric conversion element units, wherein
each photoelectric conversion element unit of the plurality of photoelectric conversion element units includes a plurality of photoelectric conversion elements,
the plurality of photoelectric conversion element units includes a first photoelectric conversion element unit,
each photoelectric conversion element of the plurality of photoelectric conversion elements of the first photoelectric conversion element unit includes a quarter wavelength layer, a wire grid polarizer, and a photoelectric conversion section in this order from a light entrance side of the quarter wavelength layer, and
the wire grid polarizer includes a light absorption layer, an insulation film, and a light reflection layer.

2. The light receiving device according to claim 1, wherein each photoelectric conversion element of the plurality of photoelectric conversion elements of the first photoelectric conversion element unit further includes an on-chip microlens on the light entrance side.

3. The light receiving device according to claim 1, wherein
the plurality of photoelectric conversion elements of the first photoelectric conversion element unit includes a first photoelectric conversion element and a second photoelectric conversion element,
a polarization direction of the wire grid polarizer of the first photoelectric conversion element is α degrees, and
a polarization direction of the wire grid polarizer of the second photoelectric conversion element is (α+45) degrees.

4. The light receiving device according to claim 1, wherein
the plurality of photoelectric conversion elements of the first photoelectric conversion element unit includes a first photoelectric conversion element, a second photoelectric conversion element, a third photoelectric conversion element, and a fourth photoelectric conversion element in a 2×2 arrangement,
a polarization direction of the wire grid polarizer of the first photoelectric conversion element is α degrees,
a polarization direction of the wire grid polarizer of the second photoelectric conversion element is (α+45) degrees,
a polarization direction of the wire grid polarizer of the third photoelectric conversion element is (α+90) degrees, and
a polarization direction of the wire grid polarizer of the fourth photoelectric conversion element is (α+135) degrees.

5. The light receiving device according to claim 4, further comprising a plurality of photoelectric conversion element groups in a two dimensional arrangement, wherein
a photoelectric conversion element group of the plurality of photoelectric conversion element groups includes the first photoelectric conversion element unit, a second photoelectric conversion element unit of the plurality of photoelectric conversion element units, a third photoelectric conversion element unit of the plurality of photoelectric conversion element units, and a fourth photoelectric conversion element unit of the plurality of photoelectric conversion element units in the 2×2 arrangement,
the first photoelectric conversion element unit includes a first filter layer configured to transmit light in a first wavelength range,
the second photoelectric conversion element unit includes a second filter layer configured to transmit light in a second wavelength range,
the third photoelectric conversion element unit includes a third filter layer configured to transmit light in a third wavelength range, and
the fourth photoelectric conversion element unit includes a fourth filter layer configured to transmit light in a fourth wavelength range.

6. The light receiving device according to claim 1, wherein
the plurality of photoelectric conversion element units further includes a second photoelectric conversion element unit, and
each photoelectric conversion element of the plurality of photoelectric conversion elements of the second photoelectric conversion element unit includes the wire grid polarizer and does not include the quarter wavelength layer.

7. The light receiving device according to claim 6, wherein the first photoelectric conversion element unit is adjacent to the second photoelectric conversion element unit.

8. The light receiving device according to claim 6, wherein
the first photoelectric conversion element unit includes a first photoelectric conversion element of the plurality of photoelectric conversion elements, a second photoelectric conversion element of the plurality of photoelectric conversion elements, a third photoelectric conversion element of the plurality of photoelectric conversion elements, and a fourth photoelectric conversion element of the plurality of photoelectric conversion elements in a 2×2 arrangement,
the second photoelectric conversion element unit includes a fifth photoelectric conversion element of the plurality of photoelectric conversion elements, a sixth photoelectric conversion element of the plurality of photoelectric conversion elements, a seventh photoelectric conversion element of the plurality of photoelectric conversion elements, and an eighth photoelectric conversion element of the plurality of photoelectric conversion elements in the 2×2 arrangement,
a polarization direction of the wire grid polarizer of each of the first photoelectric conversion element and the fifth photoelectric conversion element is α degrees,
a polarization direction of the wire grid polarizer of each of the second photoelectric conversion element and the sixth photoelectric conversion element is (α+45) degrees,
a polarization direction of the wire grid polarizer of each of the third photoelectric conversion element and the seventh photoelectric conversion element is (α+90) degrees, and
a polarization direction of the wire grid polarizer of each of the fourth photoelectric conversion element and the eighth photoelectric conversion element is (α+135) degrees.

9. The light receiving device according to claim 6, further comprising a plurality of photoelectric conversion element groups in a two dimensional arrangement, wherein
each photoelectric conversion element group of the plurality of photoelectric conversion element groups includes a first set of photoelectric conversion element units of the plurality of photoelectric conversion element units and a second set of photoelectric conversion element units of the plurality of photoelectric conversion element units,
the first set of photoelectric conversion element units includes the first photoelectric conversion element unit, a third photoelectric conversion element unit, a fourth photoelectric conversion element unit, and a fifth photoelectric conversion element unit in a 2×2 arrangement,
the second set of photoelectric conversion element units includes the second photoelectric conversion element unit, a sixth photoelectric conversion element unit, a seventh photoelectric conversion element unit, and an eighth photoelectric conversion element unit in the 2×2 arrangement,
each of the first photoelectric conversion element unit and the second photoelectric conversion element unit includes a first filter layer configured to transmit light in a first wavelength range, each of the third photoelectric conversion element unit and the sixth photoelectric conversion element unit includes a second filter layer configured to transmit light in a second wavelength range, each of the fourth photoelectric conversion element unit and the seventh photoelectric conversion element unit includes a third filter layer configured to transmit light in a third wavelength range, and each of the fifth photoelectric conversion element unit and the eighth photoelectric conversion element unit includes a fourth filter layer configured to transmit light in a fourth wavelength range.

10. The light receiving device according to claim 9, wherein each of the third photoelectric conversion element unit, the fourth photoelectric conversion element unit, and the fifth photoelectric conversion element unit includes the quarter wavelength layer, the quarter wavelength layer of the first photoelectric conversion element unit is configured to give a first phase difference to the light in the first wavelength range, the quarter wavelength layer of the third photoelectric conversion element unit is configured to give a second phase difference to the light in the second wavelength range, the quarter wavelength layer of the fourth photoelectric conversion element unit is configured to give a third phase difference to the light in the third wavelength range, and the quarter wavelength layer of the fifth photoelectric conversion element unit is configured to give a fourth phase difference to the light in the fourth wavelength range.

11. The light receiving device according to claim 1, wherein the quarter wavelength layer of each photoelectric conversion element of the plurality of photoelectric conversion elements of the first photoelectric conversion element unit includes:

a first dielectric layer that includes a first material having a refractive index $n_1$, and a second dielectric layer that includes a second material having a refractive index $n_2$, and the first dielectric layer is adjacent to the second dielectric layer.

12. The light receiving device according to claim 1, wherein each photoelectric conversion element unit of the plurality of photoelectric conversion element units is configured to detect a circularly polarized state of incident light on the light receiving device.

13. The light receiving device according to claim 12, wherein the circularly polarized state is one of a right-handed circularly polarized state or a left-handed circularly polarized state.

14. A photoelectric conversion element, comprising:
a quarter wavelength layer;
a wire grid polarizer; and
a photoelectric conversion section, wherein
the quarter wavelength layer, the wire grid polarizer, and the photoelectric conversion section are in this order from a light entrance side of the quarter wavelength layer, and
the wire grid polarizer includes a light absorption layer, an insulation film, and a light reflection layer.

15. A light receiving device, comprising:
a plurality of photoelectric conversion element units, wherein
each photoelectric conversion element unit of the plurality of photoelectric conversion element units includes a plurality of photoelectric conversion elements,
the plurality of photoelectric conversion element units includes a first photoelectric conversion element unit and a second photoelectric conversion element unit,
each photoelectric conversion element of the plurality of photoelectric conversion elements of the first photoelectric conversion element unit includes a quarter wavelength layer, a wire grid polarizer, and a photoelectric conversion section in this order from a light entrance side of the quarter wavelength layer, and
each photoelectric conversion element of the plurality of photoelectric conversion elements of the second photoelectric conversion element unit includes the wire grid polarizer and does not include the quarter wavelength layer.

* * * * *